United States Patent
Tajima et al.

(10) Patent No.: US 12,062,764 B2
(45) Date of Patent: Aug. 13, 2024

(54) SEMICONDUCTOR DEVICE

(71) Applicant: SEMICONDUCTOR ENERGY LABORATORY CO., LTD., Atsugi (JP)

(72) Inventors: Ryota Tajima, Kanagawa (JP); Kei Takahashi, Kanagawa (JP); Hiroki Inoue, Kanagawa (JP); Munehiro Kozuma, Kanagawa (JP); Takahiro Fukutome, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 486 days.

(21) Appl. No.: 17/420,536

(22) PCT Filed: Jan. 6, 2020

(86) PCT No.: PCT/IB2020/050043
§ 371 (c)(1),
(2) Date: Jul. 2, 2021

(87) PCT Pub. No.: WO2020/148599
PCT Pub. Date: Jul. 23, 2020

(65) Prior Publication Data
US 2022/0085427 A1  Mar. 17, 2022

(30) Foreign Application Priority Data
Jan. 16, 2019 (JP) .................. 2019-004842

(51) Int. Cl.
*H01M 10/44* (2006.01)
*G01R 31/367* (2019.01)
(Continued)

(52) U.S. Cl.
CPC ........ *H01M 10/443* (2013.01); *G01R 31/367* (2019.01); *H01M 10/486* (2013.01); *H02J 7/007182* (2020.01); *H02J 7/007194* (2020.01)

(58) Field of Classification Search
CPC ............. H01M 10/443; H01M 10/486; G01R 31/367; H02J 7/007194; H02J 7/007182
(Continued)

(56) References Cited

U.S. PATENT DOCUMENTS 6,075,346 A   6/2000  Kikuchi et al.
8,058,846 B2  11/2011 Kim
(Continued)

FOREIGN PATENT DOCUMENTS

CN   101399441 A   4/2009
CN   103367820 A   10/2013
(Continued)

OTHER PUBLICATIONS

International Search Report (Application No. PCT/IB2020/050043) Dated Mar. 17, 2020.
(Continued)

*Primary Examiner* — Suresh Memula
(74) *Attorney, Agent, or Firm* — Fish & Richardson P.C.

(57) ABSTRACT

A semiconductor device that inhibits deterioration of a secondary battery is provided. The semiconductor device includes a secondary battery module and a first circuit. The secondary battery module includes a secondary battery and a sensor. The first circuit includes a variable resistor. The sensor has a function of measuring a temperature of the secondary battery. The first circuit has a function of judging the charge voltage of the secondary battery and outputting a first result; a function of judging the temperature of the secondary battery measured by the sensor and outputting a second result; a function of determining the magnitude of
(Continued)

the variable resistor on the basis of the first result and the second result; a function of discharging the charge voltage through the variable resistor; and a function of stopping discharge when the charge voltage reaches a specified voltage.

7 Claims, 30 Drawing Sheets

(51) Int. Cl.
  *H01M 10/48* (2006.01)
  *H02J 7/00* (2006.01)
(58) Field of Classification Search
  USPC .......................................................... 320/127
  See application file for complete search history.

(56) References Cited

U.S. PATENT DOCUMENTS

| | | | | |
|---|---|---|---|---|
| 2002/0177034 A1* | 11/2002 | Kimura | .................... | H02J 7/007 429/61 |
| 2007/0126400 A1* | 6/2007 | Benckenstein, Jr. | . | H02J 7/0016 320/119 |
| 2008/0116852 A1 | 5/2008 | Kuo | | |
| 2009/0085519 A1 | 4/2009 | Kim | | |
| 2012/0169289 A1* | 7/2012 | Kim | ..................... | H01M 10/443 320/134 |
| 2013/0052498 A1* | 2/2013 | Han | ..................... | H01M 50/209 429/90 |
| 2013/0265010 A1 | 10/2013 | Nomura et al. | | |
| 2015/0023392 A1* | 1/2015 | Noh | .................... | H01M 50/209 374/185 |
| 2015/0144614 A1* | 5/2015 | Kim | .................... | H01M 10/486 219/494 |
| 2015/0180257 A1* | 6/2015 | Snyder | ................. | H01M 10/441 320/137 |
| 2016/0204481 A1* | 7/2016 | Ryu | ................... | H02J 7/007194 429/7 |
| 2019/0372383 A1* | 12/2019 | Onaka | ..................... | H02J 7/007 |

FOREIGN PATENT DOCUMENTS

| | | | | |
|---|---|---|---|---|
| EP | 0909675 A | | 4/1999 | |
| EP | 0913698 A1 * | | 5/1999 | |
| EP | 2043224 A | | 4/2009 | |
| EP | 2908402 A1 * | | 8/2015 | .............. B60L 15/20 |
| EP | 2827161 B1 * | | 10/2019 | .............. G01R 21/06 |
| JP | 11-187577 A | | 7/1999 | |
| JP | 2003-219510 A | | 7/2003 | |
| JP | 3680898 | | 8/2005 | |
| JP | 3929387 | | 6/2007 | |
| JP | 2011-061391 A | | 3/2011 | |
| JP | 5058228 | | 10/2012 | |
| JP | 2013101844 A * | | 5/2013 | .............. B60L 1/003 |
| JP | 2013-233072 A | | 11/2013 | |
| JP | 2017-228532 A | | 12/2017 | |
| JP | 6360602 | | 7/2018 | |
| JP | 2018-161049 A | | 10/2018 | |
| JP | 6538933 | | 7/2019 | |
| KR | 2009-0032273 A | | 4/2009 | |
| KR | 20130090159 A * | | 8/2013 | |
| KR | 2013-0113979 A | | 10/2013 | |
| TW | 200824212 | | 6/2008 | |
| TW | 201351833 | | 12/2013 | |
| WO | WO-2014207994 A1 * | | 12/2014 | .............. H02J 3/381 |

OTHER PUBLICATIONS

Written Opinion (Application No. PCT/IB2020/050043) Dated Mar. 17, 2020.

* cited by examiner

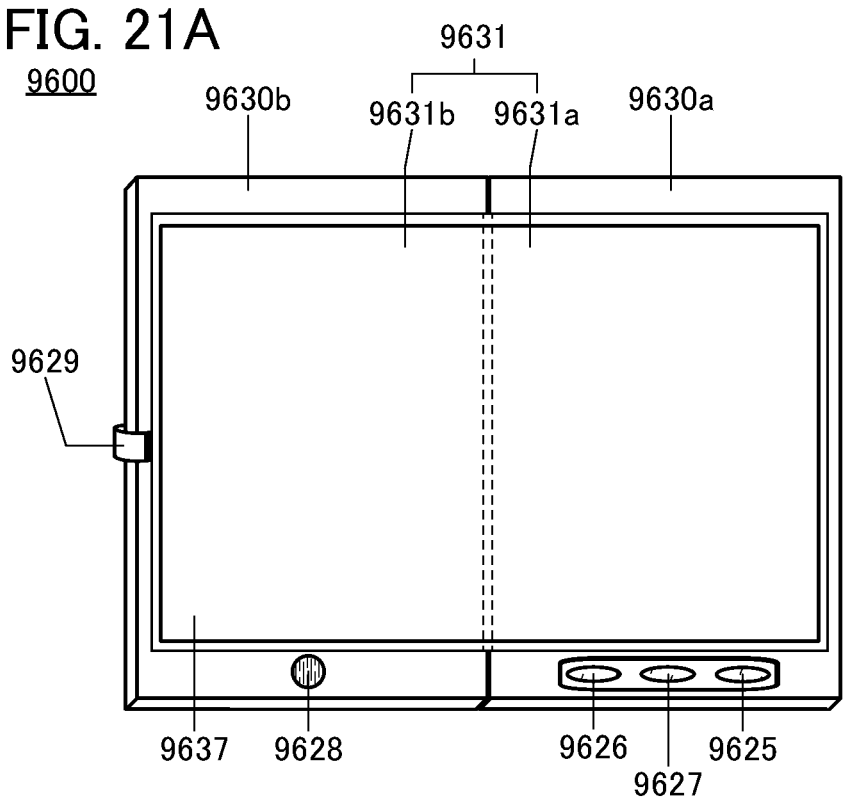
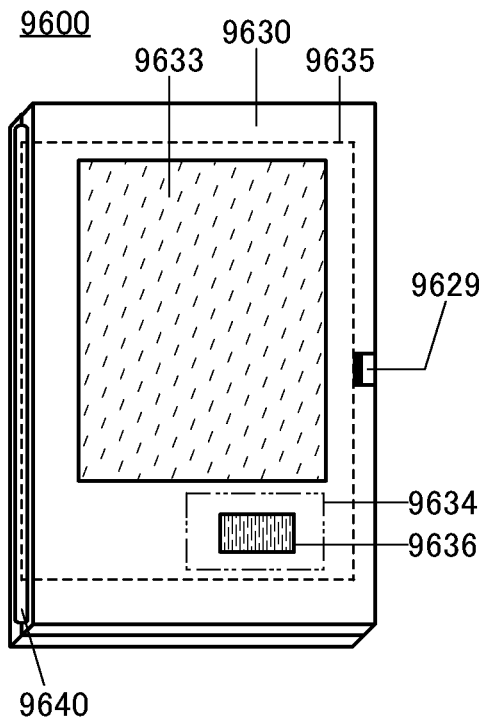
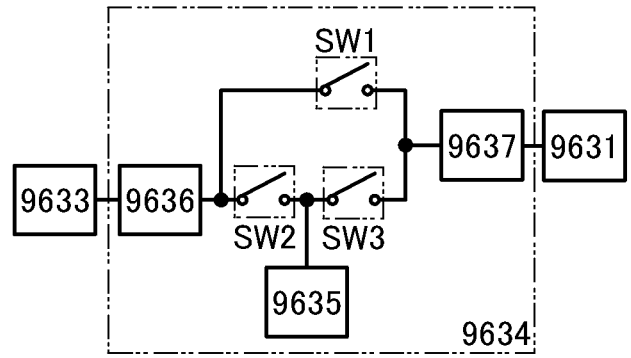

SEMICONDUCTOR DEVICE

CROSS REFERENCE TO RELATED APPLICATIONS

This application is a U.S. National Phase Application under 35 U.S.C. § 371 of International Application PCT/IB2020/050043, filed on Jan. 6, 2020, which is incorporated by reference and claims the benefit of a foreign priority application filed in Japan on Jan. 16, 2019, as Application No. 2019-004842.

TECHNICAL FIELD

One embodiment of the present invention relates to a semiconductor device. In addition, one embodiment of the present invention relates to a method for driving a semiconductor device. One embodiment of the present invention relates to a secondary battery control circuit, a discharge control circuit, an anomaly detection circuit, a cell-balance control circuit, a secondary battery control system, a battery management system, and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a display device, a light-emitting device, a power storage device, an imaging device, a memory device, a driving method thereof, and a manufacturing method thereof.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an imaging device, an electronic device, and the like are referred to as a semiconductor device in some cases.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry for portable information terminals such as mobile phones, smartphones, tablets, or laptop computers; game machines; portable music players; digital cameras; medical equipment; next-generation clean energy vehicles such as hybrid electric vehicles (HEVs), electric vehicles (EVs), and plug-in hybrid electric vehicles (PHEVs); electric bikes; or the like, and lithium-ion secondary batteries have become essential as rechargeable energy supply sources for the modern information society.

Patent Document 1 discloses a structure in which charge and discharge are performed with an appropriate electric power in accordance with the usage environment of a battery and a battery state.

REFERENCE

Patent Document

[Patent Document 1] Japanese Published Patent Application No. H11-187577

SUMMARY OF THE INVENTION

Problems to be Solved by the Invention

A lithium-ion secondary battery has a property in which the degree of deterioration of its battery capacity becomes large when the lithium-ion secondary battery is left in a high-temperature state, and the degree of deterioration tends to be larger with higher charging rate (higher battery voltage). The structure disclosed in Patent Document 1 shows a charge and discharge control device for controlling charge and discharge electric power in accordance with a temperature of a secondary battery measured by a temperature measuring unit such that the charge and discharge electric power does not exceed its upper limit when the temperature is higher than or equal to a predetermined temperature.

Note that a control processor is required to manage a secondary battery left in a high-temperature state. In addition, because the control processor manages the temperature and the charge characteristics of the secondary battery even when an electronic device is in a halt state, it is difficult to reduce power consumption.

An object of one embodiment of the present invention is to provide a semiconductor device or the like capable of inhibiting deterioration of a battery capacity of a secondary battery left in a high-temperature state. Another object of one embodiment of the present invention is to provide a semiconductor device or the like with reduced power consumption. Another object of one embodiment of the present invention is to provide a semiconductor device or the like having favorable reliability. Another object of one embodiment of the present invention is to provide an electronic device or the like including a novel semiconductor device.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention is a semiconductor device including a secondary battery module and a first circuit. The secondary battery module includes a secondary battery and a sensor. The first circuit includes a variable resistor. The sensor has a function of measuring the temperature of the secondary battery. The first circuit can have a function of judging the charge voltage of the secondary battery and outputting a first result, a function of judging the temperature of the secondary battery measured by the sensor and outputting a second result, a function of determining the magnitude of the variable resistor on the basis of the first result and the second result, a function of discharging the charge voltage through the variable resistor, and a function of stopping discharge when the charge voltage reaches a specified voltage.

One embodiment of the present invention is a semiconductor device including a secondary battery module and a first circuit. The secondary battery module includes a secondary battery and a sensor. The sensor has a function of measuring the temperature of the secondary battery. The first circuit includes a second circuit and a third circuit. The second circuit includes a lookup table, a first comparison circuit, and a second comparison circuit. The third circuit includes a discharge control circuit and a variable resistor. The lookup table includes a first classification condition for classifying the charge voltage of the secondary battery into a voltage range, and a second classification condition for classifying the temperature of the secondary battery into a temperature range. The first comparison circuit has a function of classifying the charge voltage of the secondary battery in accordance with the first classification condition and outputting the result as a first result. The second comparison circuit has a function of classifying the temperature of the secondary battery in accordance with the second classification condition and outputting the result as a second result. The discharge control circuit can have a function of judging necessity of discharge from the secondary battery on the basis of the first result and the second result, a function of determining the magnitude of the variable resistor, a function of discharging the charge voltage through the variable resistor, and a function of stopping discharge when the charge voltage reaches a specified voltage.

In the above structure, the temperature range is preferably outside an allowable temperature range in charging the secondary battery.

In the above structure, the temperature range includes a first temperature range and a second temperature range higher than the first temperature range. The first circuit preferably performs control such that the amount of discharge from the secondary battery in the second temperature range is larger than the amount of discharge from the secondary battery in the first temperature range.

In the above structure, the first circuit includes a first memory and a second memory; the first memory can retain a judgment condition of the temperature of the secondary battery, and the second memory can retain a judgment condition of the charge voltage of the secondary battery.

In the above structure, it is preferable that the first memory and the second memory each include a transistor and a capacitor, and the transistor include a metal oxide in its semiconductor layer.

Effect of the Invention

One embodiment of the present invention can provide a semiconductor device or the like capable of inhibiting deterioration of a battery capacity of a secondary battery left in a high-temperature state. Alternatively, one embodiment of the present invention can provide a semiconductor device or the like with reduced power consumption. Alternatively, one embodiment of the present invention can provide a semiconductor device or the like having favorable reliability. Alternatively, one embodiment of the present invention can provide an electronic device or the like including a novel semiconductor device.

Note that the description of the effects does not preclude the existence of other effects. One embodiment of the present invention does not necessarily achieve all the effects. Note that effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIG. 21A to FIG. 21C are diagrams illustrating an example of an electronic device.

MODE FOR CARRYING OUT THE INVENTION

Figure 1:
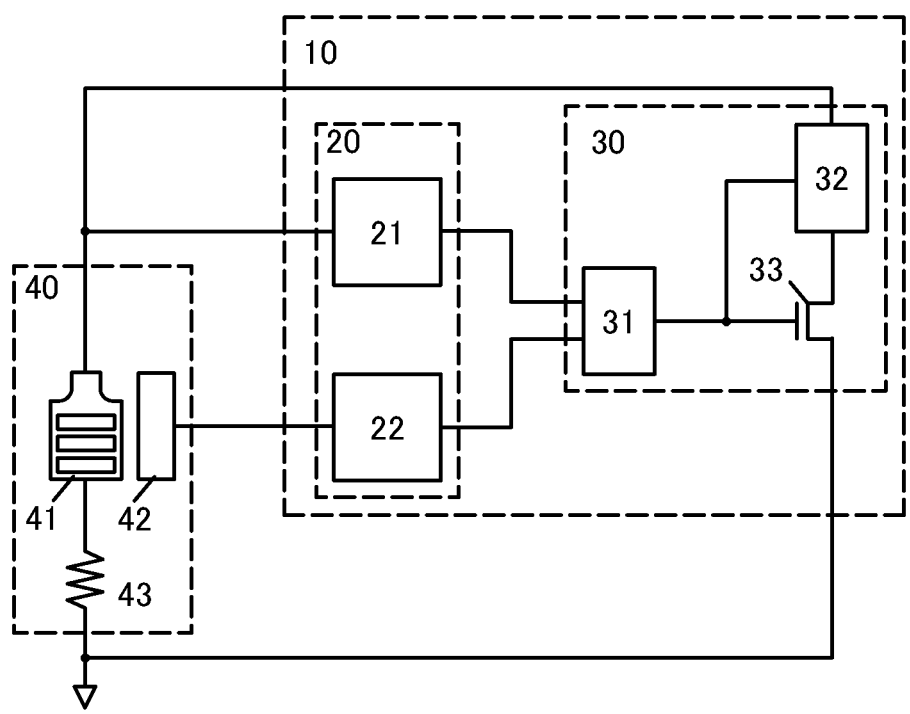
FIG. 1 is a diagram illustrating a secondary battery control circuit.

Embodiments are described in detail with reference to the drawings. Note that the present invention is not limited to the following description, and it will be readily understood by those skilled in the art that modes and details of the present invention can be modified in various ways without departing from the spirit and scope. Therefore, the present invention should not be interpreted as being limited to the descriptions of embodiments below. Note that in the structures of the present invention described below, the same portions or portions having similar functions are denoted by the same reference numerals in different drawings, and description thereof is not repeated.

The position, size, range, and the like of each component illustrated in the drawings and the like are not accurately represented in some cases to facilitate understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example. Moreover, in describing a circuit, a "wiring" includes a resistor in some cases, for example.

In this specification and the like, the resistance value of a "resistor" is sometimes determined depending on the length of a wiring. Alternatively, a resistor is sometimes formed by a connection of a conductive layer used as a wiring and another conductive layer having a resistivity different from that of the conductive layer through a contact. Alternatively, a resistance value is sometimes determined by impurity doping in a semiconductor layer.

In this specification and the like, a "terminal" in an electric circuit refers to a portion where current is input or charge voltage is input or output, and/or a signal is received or transmitted. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit. Furthermore, the expression "directly connected" includes the case where wirings formed of different conductive layers are connected through a contact to function as one wiring.

In this specification and the like, "parallel" indicates a state where two straight lines are placed at an angle of greater than or equal to −10° and less than or equal to 10°, for example. Thus, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Thus, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

Furthermore, in this specification, in the case where etching treatment is performed after a resist mask is formed, the resist mask is removed after the etching treatment, unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of a transistor refers to a state in which a source and a drain of the transistor are electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

A semiconductor device of one embodiment of the present invention is described with reference to FIG. 1 to FIG. 6. In the following description, the semiconductor device is referred to as a secondary battery control circuit. In the case where the term "secondary battery" is used, it includes, in its category, a lead storage battery, a lithium-ion secondary battery, a lithium-ion polymer secondary battery, a nickel-hydrogen storage battery, a nickel-cadmium storage battery, a nickel-iron storage battery, a nickel-zinc storage battery, a silver oxide-zinc storage battery, a cobalt titanium lithium-ion secondary battery, a sodium-ion battery, an all-solid-state battery, and the like.

For example, an inorganic solid electrolyte can be used for a solid electrolyte layer of an all-solid-state battery. As the inorganic solid electrolyte, a sulfide-based solid electrolyte or an oxide-based solid electrolyte can be used.

Examples of the sulfide-based solid electrolyte include lithium composite sulfide materials such as $Li_2S$—$SiS_2$—$Li_3PO_4$, $Li_2S$—$P_2S_5$, $Li_2S$—$SiS_2$—$Ga_2S_3$, $LiI$—$Li_2S$—$P_2S_5$, $LiI$—$Li_2S$—$B_2S_3$, $LiI$—$Li_2S$—$SiS_2$, $Li_3PO_4$—$Li_2S$—$SiS_2$, and $Li_4SiO_4$—$Li_2S$—$SiS_2$.

Examples of the oxide-based solid electrolyte include lithium composite oxides and lithium oxide materials such as LiPON, $Li_2O$, $Li_2CO_3$, $Li_2MoO_4$, $Li_3PO_4$, $Li_3VO_4$, $Li_4SiO_4$, LLT ($La_{2/3-x}Li_{3x}TiO_3$), and LLZ ($Li_7La_3Zr_2O_{12}$).

Alternatively, a polymer-based solid electrolyte such as PEO (polyethylene oxide) formed by a coating method or the like may be used as the solid electrolyte. Still alternatively, a composite solid electrolyte containing any of the above inorganic solid electrolytes and the polymer-based solid electrolyte may be used.

The secondary battery control circuit of one embodiment of the present invention includes a secondary battery module and a first circuit. The first circuit includes a second circuit and a third circuit. The secondary battery module includes a secondary battery and a sensor for measuring the temperature of the secondary battery.

The second circuit includes a first comparison circuit capable of classifying the charge voltage of the secondary battery into a voltage range, a second comparison circuit capable of classifying the temperature of the secondary battery into a temperature range, and a lookup table. The lookup table contains a first classification condition for classifying the charge voltage of the secondary battery into a voltage range and a second classification condition for classifying the temperature of the secondary battery into a temperature range.

The third circuit includes a discharge control circuit. The discharge control circuit controls the magnitude of a resistor used in a discharge period of the secondary battery, in accordance with the first classification condition and the second classification condition.

The second circuit can measure the temperature of the secondary battery with a sensor and classify the measured temperature into a temperature range, and also can measure the charge voltage of the secondary battery and classify the measured charge voltage into a voltage range. The charge voltage of the secondary battery is classified under the first classification condition and can be supplied to the third circuit as a first result. The temperature of the secondary battery is classified under the second classification condition and can be supplied to the third circuit as a second result.

The third circuit has a function of determining, using the first result and the second result, whether discharge from the secondary battery is needed, a function of determining the magnitude of the resistor for discharge from the secondary battery, a function of starting discharge from the secondary battery, and a function of stopping discharge when the charge voltage of the secondary battery reaches a specified voltage.

As for the above temperature range, it is preferable to sense the temperature of the secondary battery outside the allowable temperature range of the secondary battery in charging. First, the allowable temperature range of a secondary battery is briefly described. For example, it is known that a battery reaction is not caused enough in low-temperature charging, and lithium is deposited on an electrode surface, which might be the cause of deterioration, malfunction, an accident, or the like. It is known that in high-temperature charging, Brownian motion of lithium ions is activated as the viscosity of an electrolyte solution is reduced. It is known that as a result, the reaction rate of the lithium ions is increased and a side reaction of the secondary battery is increased. In the case where the secondary battery is in a fully charged state, a large amount of lithium is extracted from a positive electrode active material, and the thermal stability is relatively low as compared to a secondary battery in the allowable temperature range; thus, deterioration of the positive electrode active material due to a side reaction might occur. Furthermore, in a fully charged state, an oxidation reaction of the electrolyte solution is promoted because the positive electrode voltage is high, and a reduction reaction of the electrolyte solution is promoted because the negative electrode voltage is low. Thus, when a secondary battery in a fully charged state is left in an environment where the temperature is higher than secured temperature, the voltage of the secondary battery is increased and the secondary battery is brought into an overcharged state, increasing deterioration. For example, this corresponds to the case where a secondary battery in a fully charged state is left on a dashboard of a car.

In the secondary battery control circuit of one embodiment of the present invention, in the case where the secondary battery in a fully charged state is left in an environment where the temperature is higher than an upper limit temperature secured for the secondary battery, the discharge control circuit can change the magnitude of the resistor for discharge from the secondary battery in accordance with the measured temperature. Thus, discharge can be performed either in the case where the temperature of the secondary battery is gradually increased or in the case where the temperature is rapidly increased. Note that in the case where the temperature of the secondary battery is rapidly increased, the secondary battery is rapidly brought into an overcharged state; thus, the resistance value is preferably small for increasing the amount of discharged current. Note that the above condition also includes the case where the charge voltage of the secondary battery is increased beyond a voltage in a fully charged state when the secondary battery is left in a high-temperature environment, even when the charge voltage of the secondary battery is not in the fully charged state.

Furthermore, when an electronic device including a secondary battery module controlled by a secondary battery control circuit is left on a dashboard of a car, the electronic device is in a resting state in many cases. For example, an electronic device in a resting state rests a control processor in order to reduce power consumption. However, a control processor is required for controlling a secondary battery left in a high-temperature state. The secondary battery control circuit of one embodiment of the present invention can control the temperature of the secondary battery and the charge voltage of the secondary battery without a control processor. Therefore, the secondary battery control circuit can control the temperature and the charge characteristics of the secondary battery even in an electronic device in a resting state. Thus, the secondary battery control circuit can inhibit the deterioration of the secondary battery. Note that the secondary battery control circuit may also be referred to as a secondary battery control system or a battery management system.

Next, the secondary battery control circuit is described with reference to drawings. FIG. 1 illustrates a structure example of the secondary battery control circuit. The secondary battery control circuit includes a secondary battery module 40 and a circuit 10. The circuit 10 includes a circuit 20 and a circuit 30. The circuit 20 includes a circuit 21 and a circuit 22. The circuit 30 includes a circuit 31, a circuit 32, and a switch 33. The secondary battery module 40 includes a secondary battery 41, a sensor 42 for measuring the temperature of the secondary battery 41, and a resistor 43. Note that the resistor 43 functions as a shunt resistor.

The circuit 21 includes a first comparison circuit that classifies the charge voltage of the secondary battery 41 into a voltage range. The circuit 22 includes a second comparison circuit that classifies the temperature of the secondary battery 41 into a temperature range. The circuit 10 includes a lookup table. The lookup table contains a first classification condition for classifying the charge voltage of the secondary battery 41 into a voltage range and a second classification condition for classifying the temperature of the secondary battery 41 into a temperature range. The lookup table is preferably a memory that retains a plurality of classification conditions as data. Alternatively, the lookup table may be separately provided in the circuit 21 and the circuit 22. Note that the lookup table can update the data using a control processor or the like.

Note that the lookup table preferably retains the data using a memory. As a transistor used in the memory, a transistor including an oxide semiconductor, which is a kind of metal oxide, in its semiconductor layer where a channel is formed (also referred to as an "OS transistor") is preferably used. The OS transistor can have extremely low off-state current. Specifically, the off-state current per micrometer of channel width at room temperature can be lower than $1 \times 10^{-20}$ A, preferably lower than $1 \times 10^{-22}$ A, further preferably lower than $1 \times 10^{-24}$ A.

The off-state current of the OS transistor hardly increases even in a high-temperature environment. Specifically, the off-state current hardly increases even at an environment temperature higher than or equal to room temperature and lower than or equal to 200° C. When OS transistors are used as transistors included in a semiconductor device, the semiconductor device achieves stable operation and high reliability even in a high-temperature environment.

An OS memory using an OS transistor as a memory element is described in detail with reference to FIG. 6. Note that the memory is not limited to the OS memory. For example, an SRAM (Static Random Access Memory), a DRAM (Dynamic Random Access Memory), or a non-volatile memory can be used as the memory. Note that as the non-volatile memory, a mask ROM (Read on Memory, a PROM (Programable ROM), an EPROM (Erasable Programmable Read Only Memory), an EEPROM (Electrically Erasable Programmable Read-Only Memory), a flash memory, an MRAM (Magnetoresistive Random Access Memory), an ReRAM (Resistive random access memory), an FeRAM (Ferroelectric Random Access Memory), or the like can be used.

The circuit 21 can measure the charge voltage of the secondary battery 41. The circuit 21 can determine in which set voltage range the measured charge voltage is included. That is, the circuit 21 can classify the charge voltage of the secondary battery 41 in accordance with the first classification condition, and supply the classification result to the circuit 31 as a first result. An electronic device left in a high-temperature environment is influenced by noise due to temperature in some cases. Thus, the circuit 21 preferably has a hysteresis effect.

The circuit 22 can measure the temperature of the secondary battery 41 using information from the sensor 42 included in the secondary battery module 40. In addition, the circuit 22 can determine in which set temperature range the measured temperature is included. That is, the circuit 22 can classify the temperature of the secondary battery 41 in accordance with the second classification condition, and supply the classification result to the circuit 31 as a second result. An electronic device left in a high-temperature environment is influenced by noise due to temperature in some cases. Thus, the circuit 22 preferably has a hysteresis effect.

The circuit 31 can judge necessity of discharge from the secondary battery 41, using the first result and the second result. The circuit 31 can determine the magnitude of a resistor used in a discharge period of the secondary battery 41 in accordance with the first classification condition and the second classification condition. Note that in the case where the temperature of the secondary battery 41 is not classified into any of the set temperature ranges, the circuit 31 supplies setting for stopping discharge from the secondary battery 41 to the circuit 32 and the switch 33. In the case where the charge voltage of the secondary battery 41 is not classified into any of the set charge voltage ranges, the circuit 31 supplies setting for stopping discharge from the secondary battery 41 to the circuit 32 and the switch 33.

The circuit 32 includes a discharge control circuit, and the discharge control circuit includes a variable resistor. The discharge control circuit can control the amount of discharge from the secondary battery by setting the magnitude of the variable resistor to that determined by the circuit 31. That is, the discharge control circuit controls the magnitude of the variable resistor used during a period in which the secondary battery is discharged. The circuit 30 starts discharge from the secondary battery 41 when the magnitude of the variable resistor of the discharge control circuit is determined and the switch 33 is brought into an on state. When the charge voltage of the secondary battery 41 is decreased to a specified voltage due to the discharge from the secondary battery 41, the switch 33 is supplied with setting for stopping discharge from the circuit 31 and brought into an off state. When the switch 33 is brought into an off state, the discharge from the secondary battery 41 is stopped. Note that an OS transistor is preferably used as the switch 33. With the use of an OS transistor as the switch 33, power consumption when the secondary battery control circuit is not operated is reduced.

An example of a structure of the circuit 10 is described in detail with reference to FIG. 2. Points of FIG. 2 different from those of FIG. 1 are described; and in the structure of the invention (or the structure in an example), the same portions or portions having similar functions are denoted by the same reference numerals in different drawings, and a repetitive description of such portions is omitted.

First, the circuit 21 that can measure the charge voltage of the secondary battery 41 is described in detail. The circuit 21 includes a comparison circuit 50a, a memory 50b, a resistor RS1, and a resistor RS2. The comparison circuit 50a includes a first input terminal, a second input terminal, and an output terminal. The memory 50b is preferably part of the lookup table.

The charge voltage of the secondary battery 41 can be measured as a first measured voltage of the secondary battery by dividing the charge voltage between the resistor RS1 and the resistor RS2. The first measured voltage is supplied to the first input terminal of the comparison circuit 50a, and the first classification condition retained in the memory 50b is supplied to the second input terminal of the comparison circuit 50a. The comparison circuit 50a can supply a signal "H" as a judgment result to the circuit 31 from the output terminal of the comparison circuit 50a when the first measured voltage is higher than the first classification condition. The comparison circuit 50a can supply a signal "L" as the judgment result to the circuit 31 from the output terminal of the comparison circuit 50a when the first measured voltage is lower than the first classification condition. Note that the signal supplied to the output terminal of the comparison circuit 50a corresponds to the first result.

Next, the circuit 22 that can measure the temperature of the secondary battery 41 is described in detail. The circuit 22 includes a comparison circuit 60a and a memory 60b. The comparison circuit 60a includes a first input terminal, a second input terminal, and an output terminal. The memory 60b is preferably part of the lookup table.

The sensor 42 included in the secondary battery module 40 can convert the temperature of the secondary battery 41 measured by the sensor 42 into a second measured voltage. The second measured voltage is supplied to the first input terminal of the comparison circuit 60a, and the second classification condition retained in the memory 60b is supplied to the second input terminal of the comparison circuit 60a. The comparison circuit 60a can supply a signal "H" as a judgment result to the circuit 31 from the output terminal of the comparison circuit 60a when the second measured voltage is higher than the second classification condition. The comparison circuit 60a can supply a signal "L" as the judgment result to the circuit 31 from the output terminal of the comparison circuit 60a when the second measured voltage is lower than the first classification condition. Note that the signal supplied to the output terminal of the comparison circuit 60a corresponds to the second result.

Next, the circuit 31 is described in detail. The circuit 31 can judge necessity of discharge from the secondary battery 41, using the first result and the second result. The circuit 31 can supply the judgment result as a judgment signal. For example, the circuit 31 preferably has a function of performing logical product operation. The circuit 31 can supply a signal "H" as the judgment signal to the switch 33 when the first result is the signal "H" and the second result is the signal "H". The judgment signal can bring the switch 33 into an on state. The secondary battery 41 starts to be discharged when the switch 33 is brought into an on state. Furthermore, the circuit 31 can supply the judgment signal to the circuit 32.

The circuit 32 includes the discharge control circuit, and the discharge control circuit functions as a variable resistor VR. A period in which the secondary battery 41 is discharged and the amount of discharge from the secondary battery 41 are controlled by the variable resistor VR. Note that in the case where the temperature of the secondary battery 41 is not classified into any of the set temperature ranges, the circuit 31 supplies a judgment signal for stopping discharge from the secondary battery 41 to the circuit 32 and the switch 33. In the case where the charge voltage of the secondary battery 41 is not classified into any of the set charge voltage ranges, the circuit 31 supplies the judgment signal for stopping discharge from the secondary battery to the circuit 32 and the switch 33.

When the charge voltage of the secondary battery 41 is decreased to a specified voltage due to the discharge from the secondary battery 41, the switch 33 is supplied with the judgment signal for stopping discharge from the circuit 31 and brought into an off state. When the switch 33 is brought into an off state, the discharge from the secondary battery 41 is stopped. Note that an OS transistor is preferably used as the switch 33.

Figure 2:
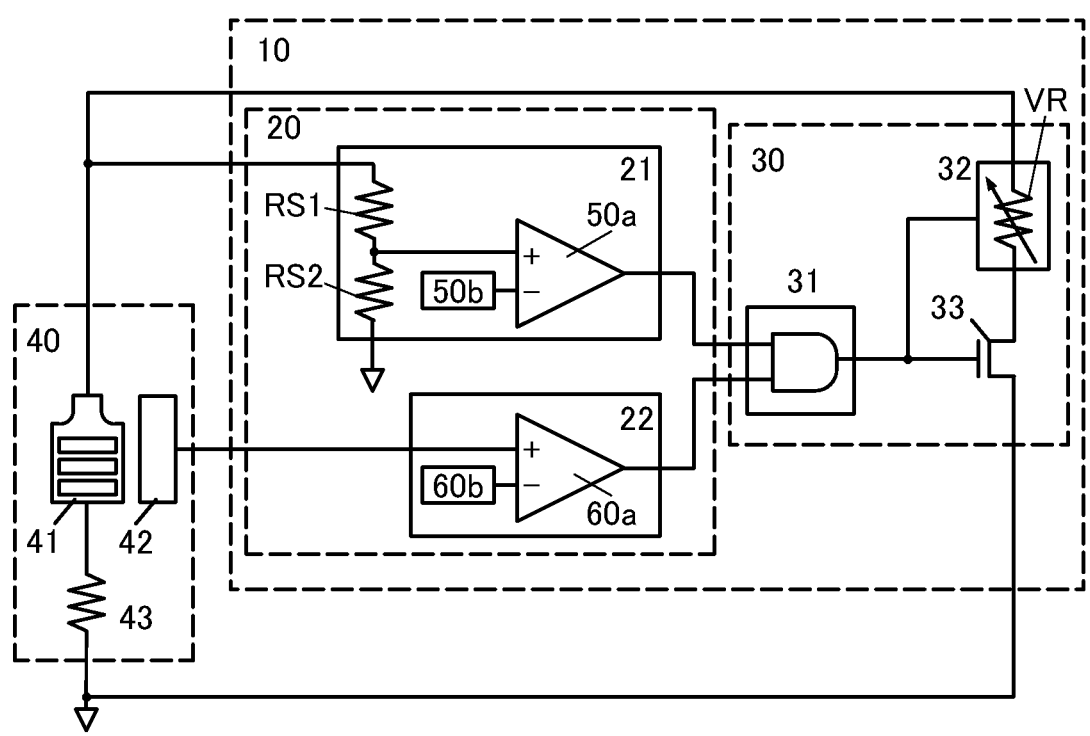
FIG. 2 is a diagram illustrating a secondary battery control circuit.
Figure 3:
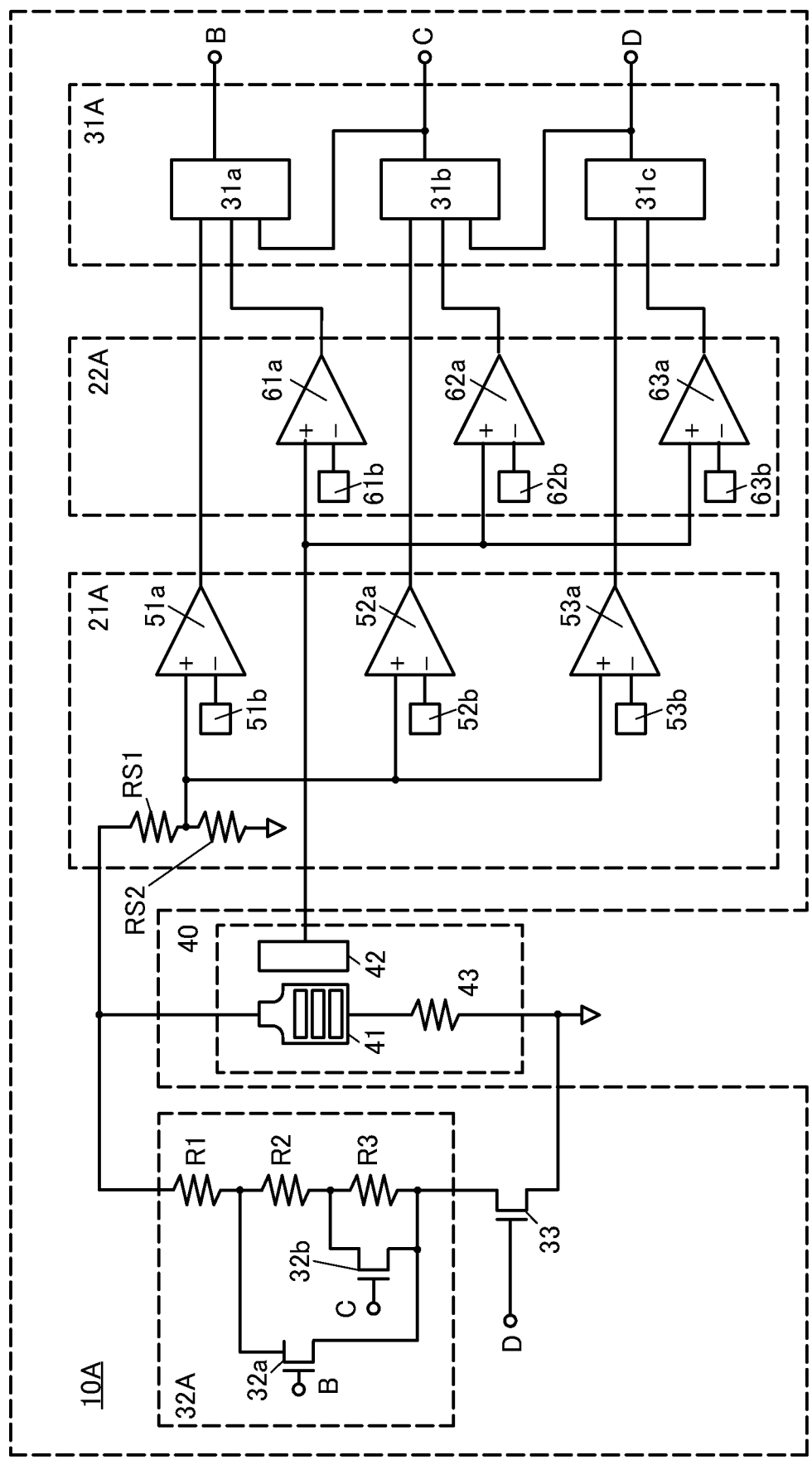
FIG. 3 is a circuit diagram illustrating a secondary battery control circuit.

FIG. 3 is a circuit diagram illustrating a detailed example of FIG. 2. Points of FIG. 3 different from those of FIG. 2 are described; and in the structure of the invention (or the structure in an example), the same portions or portions having similar functions are denoted by the same reference numerals in different drawings, and a repetitive description of such portions is omitted.

In FIG. 3, a circuit 10A includes a circuit 21A, a circuit 22A, a circuit 31A, a circuit 32A, and a switch 33. For example, a lookup table included in the circuit 10A contains three different classification conditions.

First, the circuit 21A that can measure the charge voltage of the secondary battery 41 is described in detail. The circuit 21A includes a comparison circuit 51a, a comparison circuit 52a, a comparison circuit 53a, a memory 51b, a memory 52b, a memory 53b, the resistor RS1, and the resistor RS2. Each of the comparison circuits 51a to 53a includes a first input terminal, a second input terminal, and an output terminal. Each of the memories 51b to 53b is preferably part of the lookup table.

Next, the circuit 22A that can measure the temperature of the secondary battery 41 is described in detail. The circuit 22A includes a comparison circuit 61a, a comparison circuit 62a, a comparison circuit 63a, a memory 61b, a memory 62b, and a memory 63b. Each of the comparison circuits 61a to 63a includes a first input terminal, a second input terminal, and an output terminal. Each of the memories 61b to 63b is preferably part of the lookup table.

Next, the circuit 31A is described in detail. The circuit 31A includes a circuit 31a, a circuit 31b, and a circuit 31c. Each of the circuit 31a and the circuit 31b includes a first input terminal, a second input terminal, a third input terminal, and an output terminal. The circuit 31c includes a first input terminal, a second input terminal, and an output terminal. Note that in the following description, the output terminals of the circuit 31a, the circuit 31b, and the circuit 31c are sometimes referred to as an output terminal B, an output terminal C, and an output terminal D, respectively.

The circuit 32A includes a resistor R1, a resistor R2, a resistor R3, a switch 32a, and a switch 32b. Note that the switch 33, the switch 32a, and the switch 32b are preferably transistors. Further preferably, the switch 33, the switch 32a, and the switch 32b are OS transistors.

One electrode of the secondary battery 41 is electrically connected to one electrode of the resistor RS1 and one electrode of the resistor R1. The other electrode of the resistor RS1 is electrically connected to one electrode of the resistor RS2, the first input terminal of the comparison circuit 51a, the first input terminal of the comparison circuit 52a, and the first input terminal of the comparison circuit 53a. The other electrode of the resistor RS2 is electrically connected to one electrode of the resistor 43. The other electrode of the resistor 43 is preferably electrically connected to the other electrode of the secondary battery 41. Note that the other electrode of the resistor RS2 may be electrically connected to the other electrode of the secondary battery 41. The memory 51b is electrically connected to the second input terminal of the comparison circuit 51a. The memory 52b is electrically connected to the second input terminal of the comparison circuit 52a. The memory 53b is electrically connected to the second input terminal of the comparison circuit 53a.

The sensor 42 is electrically connected to the first input terminal of the comparison circuit 61a, the first input terminal of the comparison circuit 62a, and the first input terminal of the comparison circuit 63a. The memory 61b is electrically connected to the second input terminal of the comparison circuit 61a. The memory 62b is electrically connected to the second input terminal of the comparison circuit 62a. The memory 63b is electrically connected to the second input terminal of the comparison circuit 63a.

The output terminal of the comparison circuit 53a is electrically connected to the first input terminal of the circuit 31c. The output terminal of the comparison circuit 63a is electrically connected to the second input terminal of the circuit 31c. The output terminal of the circuit 31c is electrically connected to the third input terminal of the circuit 31b and a gate of the switch 33.

The output terminal of the comparison circuit 52a is electrically connected to the first input terminal of the circuit 31b. The output terminal of the comparison circuit 62a is electrically connected to the second input terminal of the circuit 31b. The output terminal of the circuit 31b is electrically connected to the third input terminal of the circuit 31a and a gate of the switch 32b.

The output terminal of the comparison circuit 51a is electrically connected to the first input terminal of the circuit 31a. The output terminal of the comparison circuit 61a is electrically connected to the second input terminal of the circuit 31a. The output terminal of the circuit 31a is electrically connected to a gate of the switch 32a.

The other electrode of the resistor R1 is electrically connected to one electrode of the resistor R2 and one of a source and a drain of the switch 32a. The other electrode of the resistor R2 is electrically connected to one electrode of the resistor R3 and one of a source and a drain of the switch 32b. The other of the source and the drain of the switch 32a is electrically connected to the other of the source and the drain of the switch 32a, the other electrode of the resistor R3, and one of a source and a drain of the switch 33. The other of the source and the drain of the switch 33 is electrically connected to one electrode of the resistor 43.

Next, the operation of the circuit 21A is described. In the circuit 21A, the charge voltage of the secondary battery 41 is divided between the resistor RS1 and the resistor RS2, whereby the first measured voltage of the secondary battery 41 can be obtained. The first measured voltage is supplied to the first input terminal of the comparison circuit 51a, the first input terminal of the comparison circuit 52a, and the first input terminal of the comparison circuit 53a. The first classification condition retained in the memory 51b is supplied to the second terminal of the comparison circuit 51a. A third classification condition retained in the memory 52b is supplied to the second terminal of the comparison circuit 52a. A fifth classification condition retained in the memory 53b is supplied to the second terminal of the comparison circuit 53a.

That is, the circuit 21A can classify the measured voltage of the secondary battery 41 into a first classification range, a third classification range, or a fifth classification range in accordance with the first classification condition, the third classification condition, or the fifth classification condition. For example, a voltage higher than a voltage retained in the memory 51b is classified into the first classification range. A voltage that is higher than a voltage retained in the memory 52b and lower than the voltage retained in the memory 51b is classified into the third classification range. A voltage that is higher than a voltage retained in the memory 53b and lower than the voltage retained in the memory 52b is classified into the fifth classification range. Note that a voltage lower than the voltage retained in the memory 53b is not classified into any of the first classification range, the third classification range, and the fifth classification range.

For example, in classification into the first classification range, the signal "H" is supplied to the output terminal of the comparison circuit 51*a* as the judgment result. In the case where classification into the first classification range is not performed, the signal "L" is supplied to the output terminal of the comparison circuit 51*a* as the judgment result. Note that the signal supplied to the output terminal of the comparison circuit 51*a* corresponds to the first result.

For example, in classification into the third classification range, the signal "H" is supplied to the output terminal of the comparison circuit 52*a* as the judgment result. In the case where classification into the third classification range is not performed, the signal "L" is supplied to the output terminal of the comparison circuit 52*a* as the judgment result. Note that the signal supplied to the output terminal of the comparison circuit 52*a* corresponds to a third result.

For example, in classification into the fifth classification range, the signal "H" is supplied to the output terminal of the comparison circuit 53*a* as the judgment result. In the case where classification into the fifth classification range is not performed, the signal "L" is supplied to the output terminal of the comparison circuit 53*a* as the judgment result. Note that the signal supplied to the output terminal of the comparison circuit 53*a* corresponds to a fifth result.

In the case where the voltage is not classified into any of the first classification range, the third classification range, and the fifth classification range, the signal "L" is supplied to the output terminals of the comparison circuit 51*a* to the comparison circuit 53*a* as the judgment result.

Next, the operation of the circuit 22A is described. The sensor 42 included in the secondary battery module 40 can convert the temperature of the secondary battery 41 measured by the sensor 42 into the second measured voltage. The second measured voltage is supplied to the first input terminal of the comparison circuit 61*a*, the first input terminal of the comparison circuit 62*a*, and the first terminal of the comparison circuit 63*a*. The second classification condition retained in the memory 61*b* is supplied to the second terminal of the comparison circuit 61*a*. A fourth classification condition retained in the memory 62*b* is supplied to the second terminal of the comparison circuit 62*a*. A sixth classification condition retained in the memory 63*b* is supplied to the second terminal of the comparison circuit 63*a*.

That is, the circuit 22A can classify the measured voltage of the secondary battery 41 into a second classification range, a fourth classification range, or a sixth classification range in accordance with the second classification condition, the fourth classification condition, or the sixth classification condition. For example, a voltage higher than a voltage retained in the memory 61*b* is classified into the second classification range. A voltage that is higher than a voltage retained in the memory 62*b* and lower than the voltage retained in the memory 61*b* is classified into the fourth classification range. A voltage that is higher than a voltage retained in the memory 63*b* and lower than the voltage retained in the memory 62*b* is classified into the sixth classification range. Note that a voltage lower than the voltage retained in the memory 63*b* is not classified into any of the second classification range, the fourth classification range, and the sixth classification range.

For example, in classification into the second classification range, the signal "H" is supplied to the output terminal of the comparison circuit 61*a* as the judgment result. In the case where classification into the second classification range is not performed, the signal "L" is supplied to the output terminal of the comparison circuit 61*a* as the judgment result. Note that the signal supplied to the output terminal of the comparison circuit 61*a* corresponds to the second result.

For example, in classification into the fourth classification range, the signal "H" is supplied to the output terminal of the comparison circuit 62*a* as the judgment result. In the case where classification into the fourth classification range is not performed, the signal "L" is supplied to the output terminal of the comparison circuit 62*a* as the judgment result. Note that the signal supplied to the output terminal of the comparison circuit 62*a* corresponds to a fourth result.

For example, in classification into the sixth classification range, the signal "H" is supplied to the output terminal of the comparison circuit 63*a* as the judgment result. In the case where classification into the sixth classification range is not performed, the signal "L" is supplied to the output terminal of the comparison circuit 63*a* as the judgment result. Note that the signal supplied to the output terminal of the comparison circuit 63*a* corresponds to a sixth result.

In the case where the voltage is not classified into any of the second classification range, the fourth classification range, and the sixth classification range, the signal "L" is supplied to the output terminals of the comparison circuit 61*a* to the comparison circuit 63*a* as the judgment result.

Next, the circuit 31A is described in detail. The circuit 31A includes the circuit 31*a*, the circuit 31*b*, and the circuit 31*c*. The circuit 31A can judge necessity of discharge from the secondary battery 41, using the first to sixth results. The circuit 31A can supply the judgment result to the circuit 32A as a judgment signal. For example, each of the circuit 31*a*, the circuit 31*b*, and the circuit 31*c* preferably has a function of performing logical product operation.

For example, in the case where the fifth result is the signal "H" and the sixth result is the signal "H", the signal "H" is supplied to the output terminal D from the circuit 31*c* as a first judgment signal. The first judgment signal is supplied to the gate of the switch 33 to bring the switch 33 into an on state. The switch 33 is brought into an on state, whereby the secondary battery 41 starts to be discharged.

Note that when the signal "L" is supplied to the output terminal B and the output terminal C, the signal "L" is supplied to the gate of the switch 32*a* and the gate of the switch 32*b*, which will be described in detail later. Accordingly, the switch 32*a* and the switch 32*b* are brought into an off state, and the variable resistor of the discharge control circuit has a first synthesized resistance value of the resistor R1, the resistor R2, and the resistor R3. Thus, the variable resistor has the maximum value. During a period in which the variable resistor has the first synthesized resistance value, the amount of discharge from the secondary battery 41 is the smallest.

In the case where the third result is the signal "H" and the fourth result is the signal "H", the signal "H" is supplied to the output terminal C from the circuit 31*b* as a second judgment signal. The second judgment signal is supplied to the gate of the switch 32*b* to bring the switch 32*b* into an on state. Since the first judgment signal is kept at "H", the switch 33 is kept in an on state. The switch 33 and the switch 32*b* are brought into an on state, whereby the secondary battery 41 starts to be discharged.

The signal "L" is supplied to the output terminal B, and the signal "L" is supplied to the gate of the switch 32*a* accordingly. Thus, the switch 32*a* is brought into an off state, and the variable resistor of the discharge control circuit has a second synthesized resistance value of the resistor R1 and the resistor R2. Accordingly, the variable resistor has a value smaller than the first synthesized resistance value. During a period in which the variable resistor has the second synthesized resistance value, the amount of discharge from the secondary battery 41 is larger than that during the period in which the variable resistor has the first synthesized resistance value.

In the case where the first result is the signal "H" and the second result is the signal "H", the signal "H" is supplied to the output terminal B from the circuit 31a as a third judgment signal. The third judgment signal is supplied to the gate of the switch 32a to bring the switch 32a into an on state. Since the first judgment signal and the second judgment signal are kept at "H", the switch 33 and the switch 32b are kept in an on state. The switch 33, the switch 32b, and the switch 32a are brought into an on state, whereby the secondary battery 41 starts to be discharged.

The variable resistor of the discharge control circuit has the resistance value of the resistor R1. Accordingly, the variable resistor has a value smaller than the second synthesized resistance value. During a period in which the variable resistor has the resistance value, the amount of discharge from the secondary battery 41 is larger than that during the period in which the variable resistor has the second synthesized resistance value.

Figure 4:
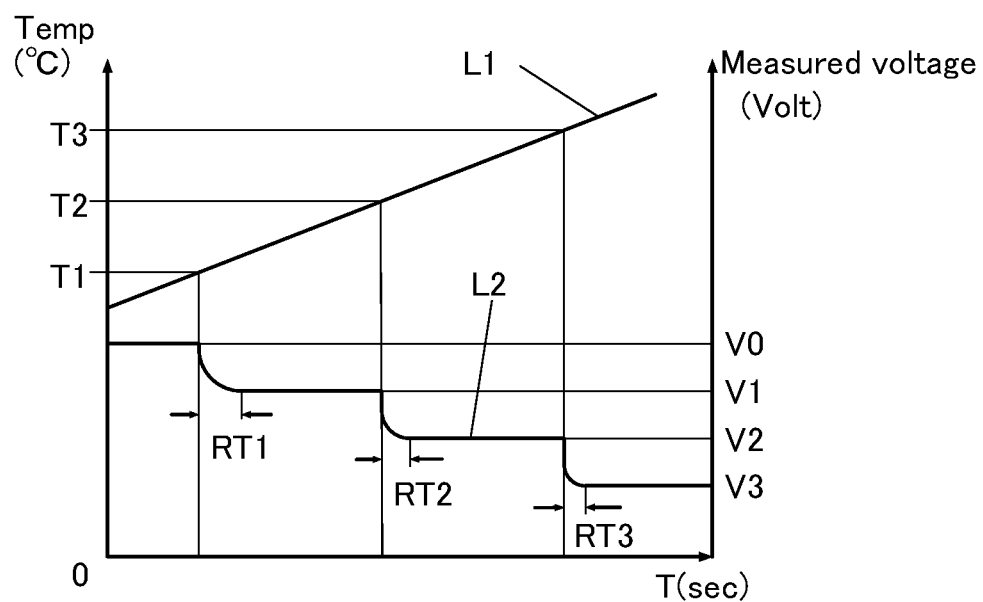
FIG. 4 is a diagram illustrating an example of operation of a secondary battery control circuit.

FIG. 4 illustrates the operation of the secondary battery control circuit described with reference to FIG. 3. In the graph of the characteristic L1, the vertical axis represents temperature (Temp) (° C.) and the horizontal axis represents time (T) (sec). The graph of the characteristic L1 shows the temperature of the environment in which the secondary battery control circuit is left increases over time. In the graph of the characteristic L2, the vertical axis represents the measured voltage (Volt) of the secondary battery 41 and the horizontal axis represents time (sec). The graph of the characteristic L1 shows judgment temperatures T1 to T3 for safe discharge from the secondary battery 41. The graph of the characteristic L2 shows an upper limit voltage V1, an upper limit voltage V2, and an upper limit voltage V3 for controlling the charge voltage of the secondary battery 41 with respect to the judgment temperature T1, the judgment temperature T2, and the judgment temperature T3.

For example, the judgment temperature T1 is 40° C., the judgment temperature T2 is 50° C., and the judgment temperature T3 is 60° C. It is known that the environment temperature suitable for charging the secondary battery 41 is higher than or equal to 0° C. and lower than or equal to 40° C. That is, the set temperatures of the judgment temperature T1 to the judgment temperature T3 are out of the allowable temperature range for charging the secondary battery 41. However, it is also known that the secondary battery 41 has different allowable temperature ranges in charging and in storage. For example, it is known that the temperature suitable for storing the secondary battery 41 is higher than or equal to −20° C. and lower than or equal to 60° C. In one embodiment of the present invention, description is made focusing on the case where the secondary battery 41 is stored at 40° C. or higher. Note that the operation of the secondary battery control circuit of one embodiment of the present invention is not limited to operation at high temperatures; the first classification condition and the second classification condition of the lookup table are updated or the number of judgment conditions is increased, whereby the secondary battery control circuit can operate even in the range from −20° C. to 0° C.

The judgment condition for sensing the judgment temperature T1, the judgment temperature T2, or the judgment temperature T3 is retained in the memory 63b, the memory 62b, or the memory 61b described with reference to FIG. 3.

The upper limit voltage V1, the upper limit voltage V2, or the upper limit voltage V3 is used as the classification condition of the charge voltage of the secondary battery 41 corresponding to the judgment temperature T1, the judgment temperature T2, or the judgment temperature T3. The judgment condition for sensing the upper limit voltage V1, the upper limit voltage V2, or the upper limit voltage V3 is retained in the memory 53b, the memory 52b, or the memory 51b described with reference to FIG. 3.

That is, when the temperature is higher than or equal to the temperature T1, the upper limit of the charge voltage of the secondary battery 41 is changed from the voltage V0 to the voltage V1, and discharge is started so that the charge voltage of the secondary battery 41 becomes the voltage V1. Furthermore, when the temperature is higher than or equal to the temperature T2, the upper limit of the charge voltage of the secondary battery 41 is changed from the voltage V1 to the voltage V2, and discharge is started so that the charge voltage of the secondary battery 41 becomes the voltage V2. Moreover, when the temperature is higher than or equal to the temperature T3, the upper limit of the charge voltage of the secondary battery is changed from the voltage V2 to the voltage V3, and discharge is started so that the charge voltage of the secondary battery 41 becomes the voltage V3. Deterioration of the secondary battery 41 is accelerated at higher temperatures; therefore, it is preferable that the secondary battery 41 is discharged more quickly at higher temperatures.

As described with reference to FIG. 4, the amount of discharge from the charge voltage of the secondary battery 41 needs to be increased as the measured temperature is higher. The discharge control circuit adjusts the discharge amount by changing the resistance value of the variable resistor in accordance with the measured temperature. Note that a period RT1 in FIG. 4 indicates a time required for discharging the secondary battery 41 from the upper limit voltage V0 to the upper limit voltage V1. A period RT2 indicates a time required for discharging the secondary battery 41 from the upper limit voltage V1 to the upper limit voltage V2. A period RT3 indicates a time required for discharging the secondary battery 41 from the upper limit voltage V2 to the upper limit voltage V3. In the period RT2, discharge ends in a time shorter than that in the period RT1. In the period RT3, discharge ends in a time shorter than that in the period RT2. Therefore, in the case where the secondary battery 41 is stored in a high-temperature environment where the secondary battery 41 easily deteriorates, control of discharge from the secondary battery 41 corresponds to feedback control with respect to temperature, and the discharge control circuit can function as a negative feedback amplifier circuit that amplifies the amount of discharge from the secondary battery 41 with respect to temperature. Note that in the control of discharge from the secondary battery, discharge from the secondary battery can be performed without a control processor. Accordingly, power consumption of the control processor can be reduced.

Figure 5:
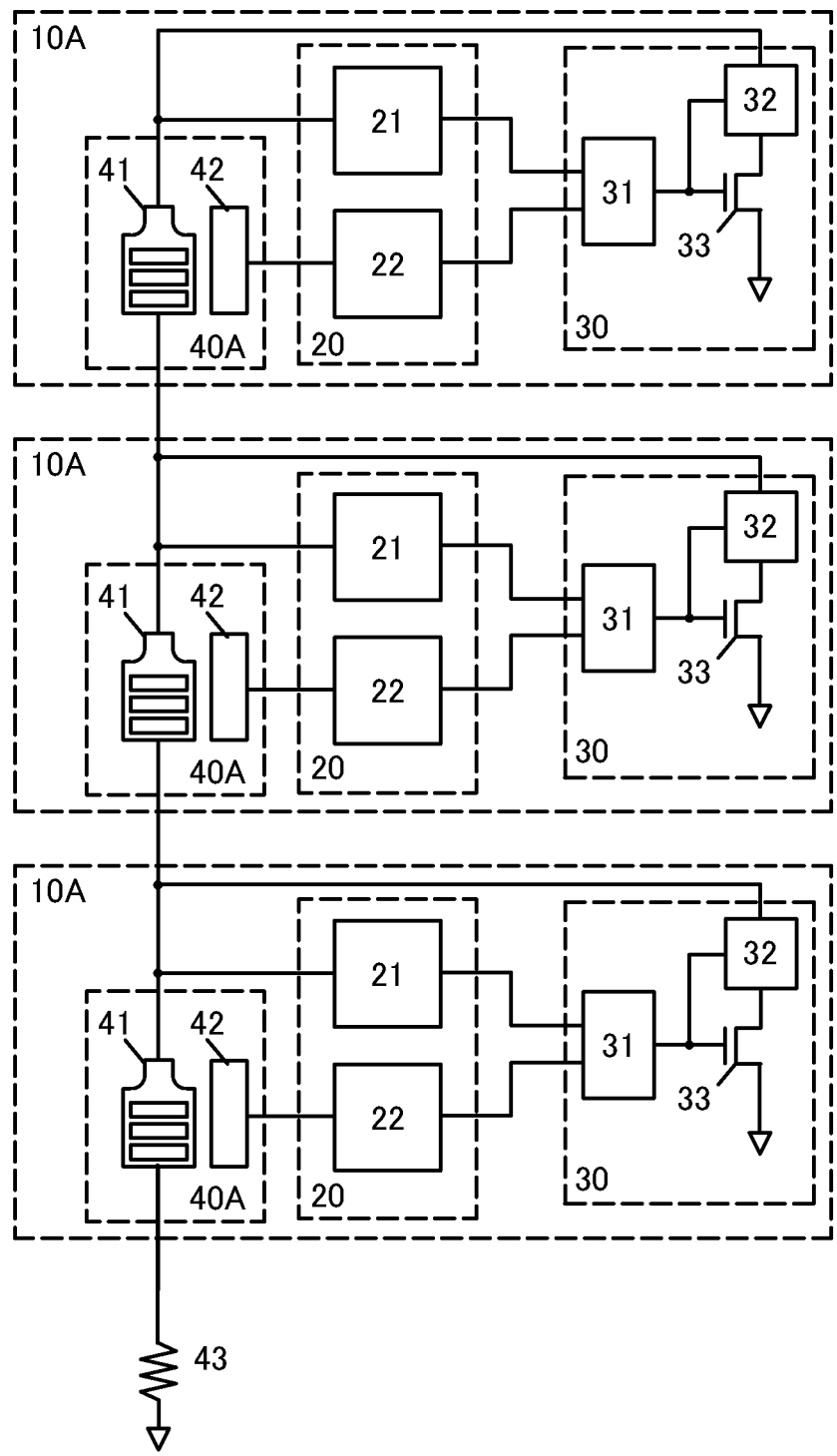
FIG. 5 is a diagram illustrating a secondary battery control circuit.

FIG. 5 illustrates a secondary battery control circuit 10B. In the secondary battery control circuit 10B, a plurality of circuits 10A are connected in series. Points of FIG. 5 different from those of FIG. 2 are described; and in the structure of the invention (or the structure in an example), the same portions or portions having similar functions are denoted by the same reference numerals in different drawings, and a repetitive description of such portions is omitted.

The secondary battery control circuit 10B is a structure example in which a high voltage can be obtained by series connection of a plurality of secondary battery modules 40A.

Note that variation in the secondary battery capacity, variation in the secondary battery deterioration, variation in the secondary battery charge voltage, and the like are seen among the plurality of secondary battery modules 40A.

Thus, for series connection of the plurality of secondary battery modules 40A, a cell-balance control circuit is preferably provided for the plurality of secondary battery modules 40A. The cell-balance control circuit has a function of discharging an excess amount of charge from the secondary battery module 40A brought into a fully charged state first so that the secondary battery module 40A with a low remaining battery is brought into a fully charge state. The secondary battery control circuit of one embodiment of the present invention can control discharge from the plurality of secondary battery modules 40A in the case where the secondary batteries are left in a high-temperature environment.

In the case where the plurality of secondary battery modules 40A are connected in series, one resistor 43 functioning as a shunt resistor should be provided. A shunt resistor can be used for detection of overcurrent, for example.

Figure 6A:
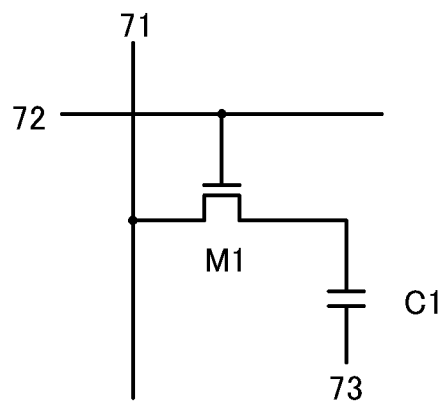
FIG. 6A and FIG. 6B are circuit diagrams each illustrating a memory.
Figure 6B:
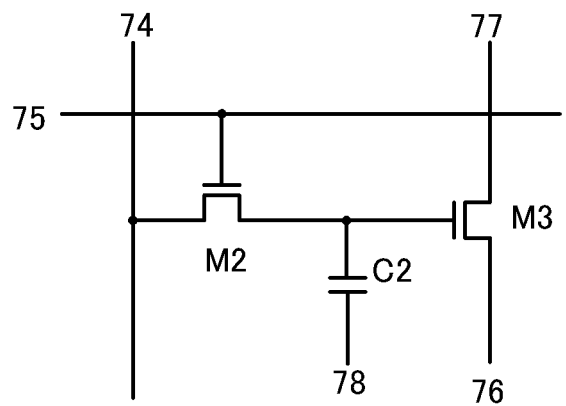

FIG. 6A and FIG. 6B are circuit diagrams each illustrating a memory included in the above-described lookup table.

In FIG. 6A, a transistor M1, a capacitor C1, and a wiring 71 to a wiring 73 are included. One electrode of the capacitor C1 is electrically connected to one of a source and a drain of the transistor M1. The other electrode of the capacitor C1 is electrically connected to the wiring 73. The other of the source and the drain of the transistor M1 is electrically connected to the wiring 71. A gate of the transistor M1 is electrically connected to the wiring 72.

The memory illustrated in FIG. 6A can be referred to as a DOSRAM (Dynamic Oxide Semiconductor Random Access Memory) using an OS transistor in a memory. The memory includes one transistor and one capacitor and thus achieves high density. With the use of an OS transistor, a data retention period can be extended.

In FIG. 6B, a transistor M2, a transistor M3, a capacitor C2, and wirings 74 to 78 are included. One electrode of the capacitor C2 is electrically connected to one of a source and a drain of the transistor M2 and a gate of the transistor M3. The other electrode of the capacitor C2 is electrically connected to the wiring 78. The other of the source and the drain of the transistor M2 is electrically connected to the wiring 74. A gate of the transistor M2 is electrically connected to the wiring 75. One of a source and a drain of the transistor M3 is electrically connected to the wiring 76. The other of the source and the drain of the transistor M3 is electrically connected to the wiring 77. Note that the transistor M2 is preferably an OS transistor.

The memory illustrated in FIG. 6B can be referred to as a NOSRAM (Non-volatile Oxide Semiconductor Random Access Memory) using an OS transistor in a memory. An OS transistor can be stacked over a Si transistor, so that a high density of a memory can be achieved. With the use of an OS transistor, a data retention period can be extended. In a NOSRAM, data is not corrupted even when data is read out. Thus, power required for data rewriting can be reduced.

Each of the memories illustrated in FIG. 6A and FIG. 6B can retain data for a long period of time; thus, an electronic device including a secondary battery control circuit including such a memory of one embodiment of the present invention can reduce the frequency of update of a lookup table. Therefore, the secondary battery control circuit is effective for reduction of power consumption.

In the secondary battery control circuit of one embodiment of the present invention, the secondary battery can be efficiently used for operating a variety of electronic devices to be described in Embodiment 3 or Embodiment 4. Note that in the case where a function of a processor included in an electronic device is utilized, the secondary battery control circuit can be referred to as a battery management system.

The semiconductor device of one embodiment of the present invention can work both in the case where the charge characteristics of a secondary battery change rapidly and in the case where the charge characteristics of a secondary battery change gradually. By monitoring the charge characteristics of a secondary battery, it is possible to inhibit deterioration of the secondary battery and improve the reliability thereof. Furthermore, power consumption of the secondary battery control circuit can be reduced with an OS transistor.

A secondary battery control circuit, a discharge control circuit, an anomaly detection circuit, and the like, each including an OS transistor, may be referred to as BTOS (Battery operating system or Battery oxide semiconductor).

Note that the semiconductor device of one embodiment of the present invention is not interpreted as being limited to the circuit diagrams described in this embodiment. The semiconductor device of one embodiment of the present invention also includes a semiconductor device having a circuit structure comparable to the circuit structure described in this embodiment.

This embodiment can be implemented in combination with any of the structures described in the other embodiments and the like, as appropriate.

Embodiment 2

In this embodiment, examples of a shape of the secondary battery used in the above embodiment are described. Note that discharge of the secondary battery in accordance with temperature is preferably controlled by the secondary battery control circuit.

[Coin-Type Secondary Battery]

Figure 7A:
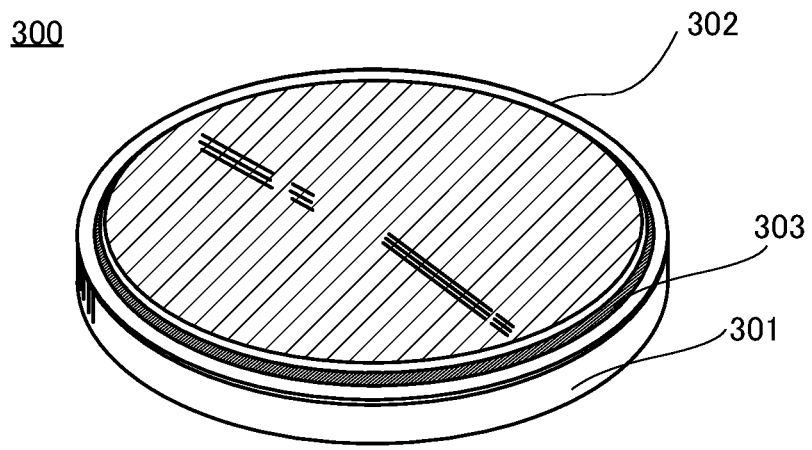
FIG. 7A is an external view of a coin-type secondary battery.
Figure 7B:
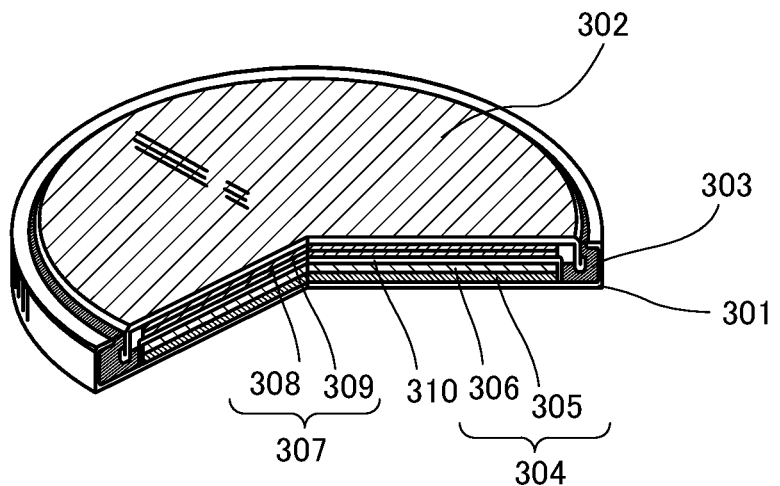
FIG. 7B is a cross-sectional view of the coin-type secondary battery.

First, an example of a coin-type secondary battery is described. FIG. 7A is an external view of a coin-type (single-layer flat type) secondary battery, and FIG. 7B is a cross-sectional view thereof.

In a coin-type secondary battery 300, a positive electrode can 301 doubling as a positive electrode terminal and a negative electrode can 302 doubling as a negative electrode terminal are insulated and sealed by a gasket 303 formed of polypropylene or the like. A positive electrode 304 is formed of a positive electrode current collector 305 and a positive electrode active material layer 306 provided to be in contact with the positive electrode current collector 305. In addition, a negative electrode 307 is formed of a negative electrode current collector 308 and a negative electrode active material layer 309 provided to be in contact with the negative electrode current collector 308.

Note that an active material layer may be formed over only one surface of each of the positive electrode 304 and the negative electrode 307 used for the coin-type secondary battery 300.

For the positive electrode can 301 and the negative electrode can 302, a metal having corrosion resistance to an electrolyte solution, such as nickel, aluminum, or titanium, an alloy of such a metal, or an alloy of such a metal and another metal (e.g., stainless steel) can be used. The positive electrode can 301 and the negative electrode can 302 are preferably covered with nickel, aluminum, or the like in order to prevent corrosion due to the electrolyte solution. The positive electrode can 301 and the negative electrode can 302 are electrically connected to the positive electrode 304 and the negative electrode 307, respectively.

The negative electrode 307, the positive electrode 304, and a separator 310 are immersed in the electrolyte; as illustrated in FIG. 7B, the positive electrode 304, the separator 310, the negative electrode 307, and the negative electrode can 302 are stacked in this order with the positive electrode can 301 positioned at the bottom; and the positive electrode can 301 and the negative electrode can 302 are subjected to pressure bonding with the gasket 303 located therebetween. In such a manner, the coin-type secondary battery 300 is manufactured.

Figure 7C:
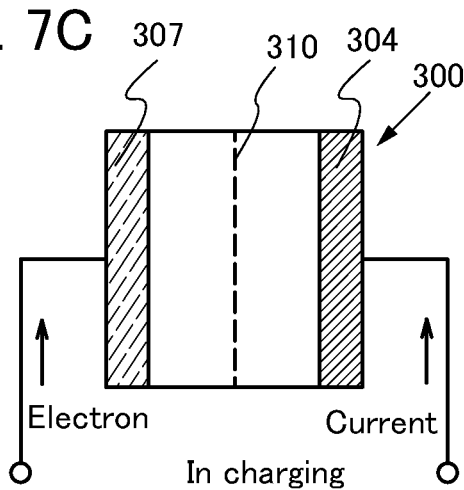
FIG. 7C is a diagram illustrating a current flow in a secondary battery.

Here, a current flow in charging a secondary battery is described using FIG. 7C. When a secondary battery using lithium is regarded as one closed circuit, movement of lithium ions and the current flow are in the same direction. Note that in the secondary battery using lithium, an anode and a cathode interchange in charge and discharge, and oxidation reaction and reduction reaction interchange; hence, an electrode with a high reaction voltage is called a positive electrode and an electrode with a low reaction voltage is called a negative electrode. For this reason, in this specification, the positive electrode is referred to as a "positive electrode" or a "+ electrode (plus electrode)" and the negative electrode is referred to as a "negative electrode" or a "− electrode (minus electrode)" in any of the case where charge is performed, the case where discharge is performed, the case where a reverse pulse current is made to flow, and the case where charge current is made to flow. The use of terms an anode and a cathode related to oxidation reaction and reduction reaction might cause confusion because the anode and the cathode interchange in charge and in discharge. Thus, the terms the anode and the cathode are not used in this specification. If the term the anode or the cathode is used, it should be clearly mentioned that the anode or the cathode is which of the one in charge or in discharge and corresponds to which of the positive electrode (plus electrode) or the negative electrode (minus electrode).

A charger is connected to two terminals shown in FIG. 7C to charge the secondary battery 300. As the charge of the secondary battery 300 proceeds, a voltage difference between the electrodes increases.

[Cylindrical Secondary Battery]

Figure 8A:
FIG. 8A is an external view of a cylindrical secondary battery.
Figure 8B:
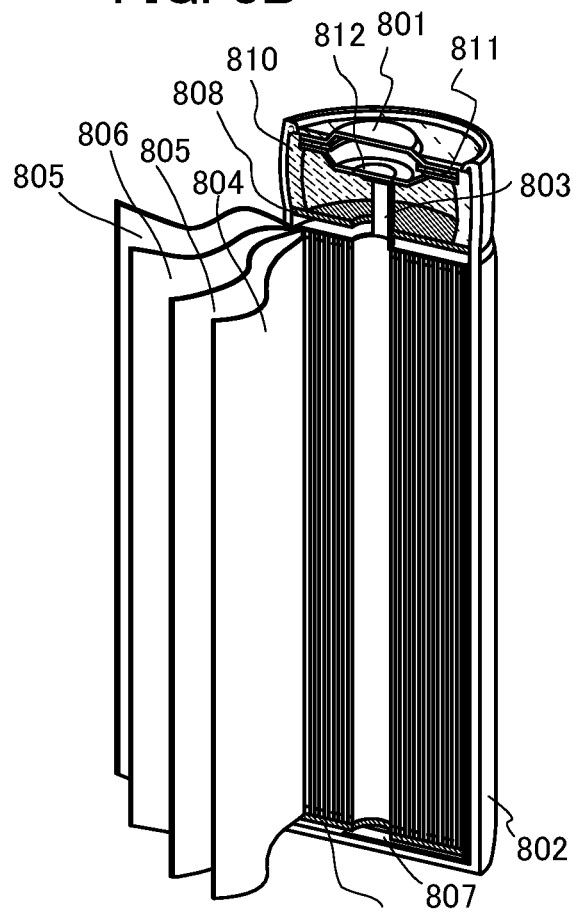
FIG. 8B is a cross-sectional view of the cylindrical secondary battery.

Next, an example of a cylindrical secondary battery is described with reference to FIG. 8A to FIG. 8D. FIG. 8A is an external view of a cylindrical secondary battery 800. FIG. 8B is a diagram schematically illustrating a cross section of the cylindrical secondary battery 800. As illustrated in FIG. 8B, the cylindrical secondary battery 800 includes a positive electrode cap (battery lid) 801 on a top surface and a battery can (outer can) 802 on a side surface and a bottom surface. The positive electrode cap and the battery can (outer can) 802 are insulated by a gasket (insulating gasket) 810.

Inside the battery can 802 having a hollow cylindrical shape, a battery element in which a belt-like positive electrode 804 and a belt-like negative electrode 806 are wound with a separator 805 located therebetween is provided. Although not illustrated, the battery element is wound centering around a center pin. One end of the battery can 802 is closed and the other end thereof is opened. For the battery can 802, a metal having corrosion resistance to an electrolyte solution, such as nickel, aluminum, or titanium, an alloy of such a metal, or an alloy of such a metal and another metal (e.g., stainless steel) can be used. The battery can 802 is preferably covered with nickel, aluminum, or the like in order to prevent corrosion due to the electrolyte solution. Inside the battery can 802, the battery element in which the positive electrode, the negative electrode, and the separator are wound is sandwiched between a pair of insulating plates 808 and 809 that face each other. Furthermore, a nonaqueous electrolyte solution (not illustrated) is injected inside the battery can 802 provided with the battery element. As the nonaqueous electrolyte solution, a nonaqueous electrolyte solution that is similar to that of the coin-type secondary battery can be used.

Since the positive electrode and the negative electrode that are used for a cylindrical storage battery are wound, active materials are preferably formed on both surfaces of the current collector. A positive electrode terminal (positive electrode current collector lead) 803 is connected to the positive electrode 804, and a negative electrode terminal (negative electrode current collector lead) 807 is connected to the negative electrode 806. For both the positive electrode terminal 803 and the negative electrode terminal 807, a metal material such as aluminum can be used. The positive electrode terminal 803 and the negative electrode terminal 807 are resistance-welded to a safety valve mechanism 812 and the bottom of the battery can 802, respectively. The safety valve mechanism 812 is electrically connected to the positive electrode cap 801 through a PTC element (Positive Temperature Coefficient) 611. The safety valve mechanism 812 cuts off electrical connection between the positive electrode cap 801 and the positive electrode 804 when the internal pressure of the battery exceeds a predetermined threshold value. In addition, the PTC element 811 is a thermally sensitive resistor whose resistance increases as temperature rises, and limits the amount of current by increasing the resistance to prevent abnormal heat generation. Barium titanate ($BaTiO_3$)-based semiconductor ceramic or the like can be used for the PTC element.

Figure 8C:
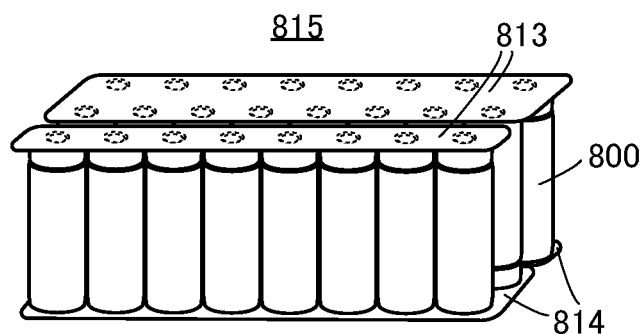
FIG. 8C is a diagram illustrating a secondary battery module.

Alternatively, as illustrated in FIG. 8C, a plurality of secondary batteries 800 may be sandwiched between a conductive plate 813 and a conductive plate 814 to construct a module 815. The plurality of secondary batteries 800 may be connected in parallel, connected in series, or further connected in series after being connected in parallel. By constructing the module 815 including the plurality of secondary batteries 800, large power can be extracted.

Figure 8D:
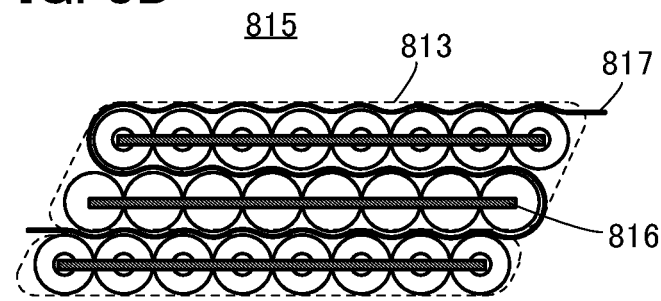
FIG. 8D is a top view of the secondary battery module.

FIG. 8D is a top view of the module 815. The conductive plate 813 is shown by a dotted line for clarity of the drawing. As illustrated in FIG. 8D, the module 815 may include a conducting wiring 816 that electrically connects the plurality of secondary batteries 800. It is possible to provide the conductive plate over the conducting wiring 816 to overlap. In addition, a temperature control device 817 may be included between the plurality of secondary batteries 800. The secondary batteries 800 can be cooled with the temperature control device 817 when overheated, whereas the secondary batteries 800 can be heated with the temperature control device 817 when cooled too much. Thus, the performance of the module 815 is less likely to be influenced by the outside temperature. A heating medium included in the temperature control device 817 preferably has an insulating property and incombustibility.

[Structure Examples of Secondary Battery]

Other structure examples of a secondary battery are described using FIG. 9 to FIG. 13.

Figure 9A:
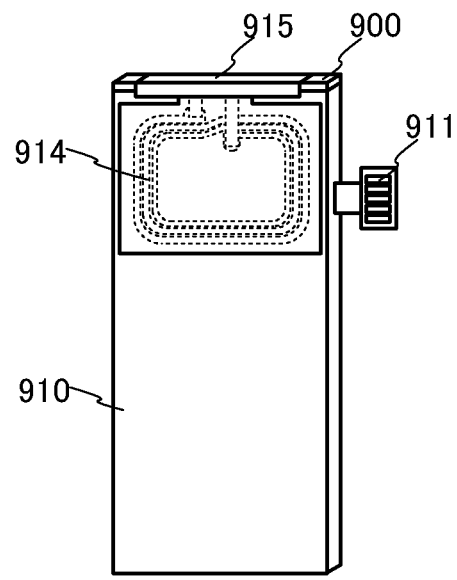
FIG. 9A and FIG. 9B are external views of a secondary battery.
Figure 9B:
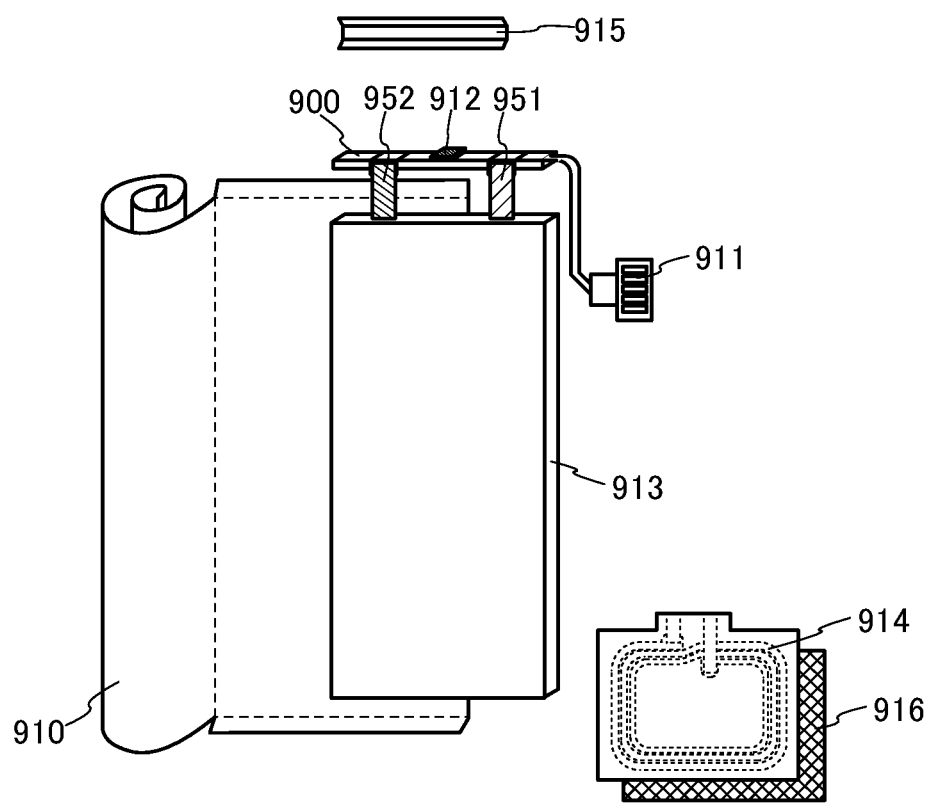

FIG. 9A and FIG. 9B are external views of a secondary battery. A secondary battery 913 is connected to an antenna 914 and an antenna 915 through a circuit board 900. A label 910 is attached to the secondary battery 913. Moreover, as illustrated in FIG. 9B, the secondary battery 913 is connected to a terminal 951 and a terminal 952.

The circuit board 900 includes a terminal 911 and a circuit 912. The terminal 911 is connected to the terminal 951, the terminal 952, the antenna 914, the antenna 915, and the circuit 912. Note that a plurality of terminals 911 serving as a control signal input terminal, a power supply terminal, and the like may be provided.

The circuit 912 may be provided on the rear surface of the circuit board 900. Note that the shapes of the antenna 914 and the antenna 915 are not limited to coil shapes, and may be linear shapes or plate shapes, for example. An antenna such as a planar antenna, an aperture antenna, a traveling-wave antenna, an EH antenna, a magnetic-field antenna, or a dielectric antenna may be used. Alternatively, the antenna 914 or the antenna 915 may be a flat-plate conductor. This flat-plate conductor can serve as one of conductors for electric field coupling. That is, the antenna 914 or the antenna 915 may serve as one of the two conductors included in a capacitor. Thus, electric power can be transmitted and received not only by an electromagnetic field or a magnetic field but also by an electric field.

The line width of the antenna 914 is preferably larger than the line width of the antenna 915. This makes it possible to increase the amount of power received by the antenna 914.

The secondary battery includes a layer 916 between the secondary battery 913 and the antenna 914 and the antenna 915. The layer 916 has a function of blocking an electromagnetic field from the secondary battery 913, for example. As the layer 916, for example, a magnetic body can be used.

Note that the structure of the secondary battery is not limited to that in FIG. 9.

Figure 10A:
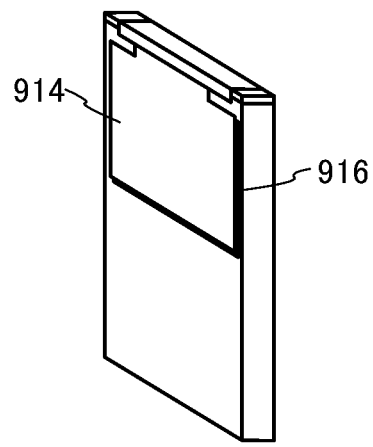
FIG. 10A, FIG. 10B, FIG. 10C, and FIG. 10D are diagrams illustrating examples of secondary batteries.
Figure 10B:
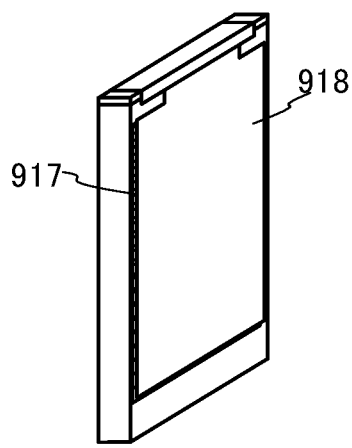

For example, as shown in FIG. 10A and FIG. 10B, an antenna may be provided for each of a pair of opposite surfaces of the secondary battery 913 shown in FIG. 9A and FIG. 9B. FIG. 10A is an external view illustrating one of the pair of surfaces, and FIG. 10B is an external view illustrating the other of the pair of surfaces. Note that, for the same portions as those in the secondary battery shown in FIG. 9A and FIG. 9B, it is possible to refer to the description of the secondary battery shown in FIG. 9A and FIG. 9B as appropriate.

As illustrated in FIG. 10A, the antenna 914 is provided on one of the pair of surfaces of the secondary battery 913 with the layer 916 located therebetween, and as illustrated in FIG. 10B, an antenna 918 is provided on the other of the pair of surfaces of the secondary battery 913 with a layer 917 located therebetween. The layer 917 has a function of blocking an electromagnetic field from the secondary battery 913, for example. As the layer 917, for example, a magnetic body can be used.

With the above structure, both of the antenna 914 and the antenna 918 can be increased in size. The antenna 918 has a function of communicating data with an external device, for example. An antenna with a shape that can be applied to the antenna 914, for example, can be applied to the antenna 918. As a system for communication using the antenna 918 between the secondary battery and another device, a response method that can be used between the secondary battery and another device, such as NFC (near field communication), can be employed.

Figure 10C:
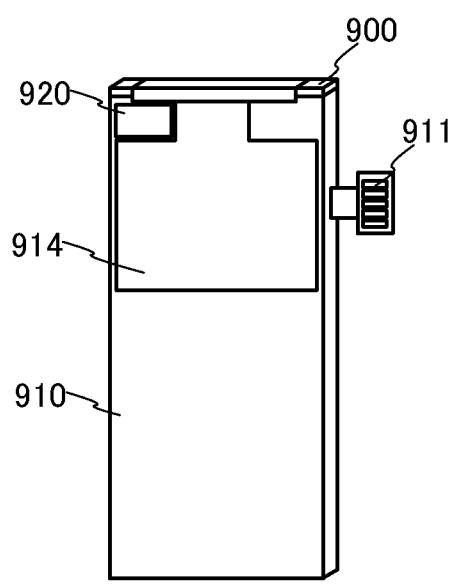

Alternatively, as illustrated in FIG. 10C, the secondary battery 913 shown in FIG. 9A and FIG. 9B may be provided with a display device 920. The display device 920 is electrically connected to the terminal 911. Note that the label 910 is not necessarily provided in a portion where the display device 920 is provided. Note that for the same portions as those in the secondary battery shown in FIG. 9A and FIG. 9B, it is possible to refer to the description of the secondary battery shown in FIG. 9A and FIG. 9B as appropriate.

The display device 920 may display, for example, an image showing whether or not charge is being carried out, an image showing the amount of stored power, or the like. As the display device 920, electronic paper, a liquid crystal display device, an electroluminescence (also referred to as EL) display device, or the like can be used, for example. For example, the use of electronic paper can reduce power consumption of the display device 920.

Figure 10D:
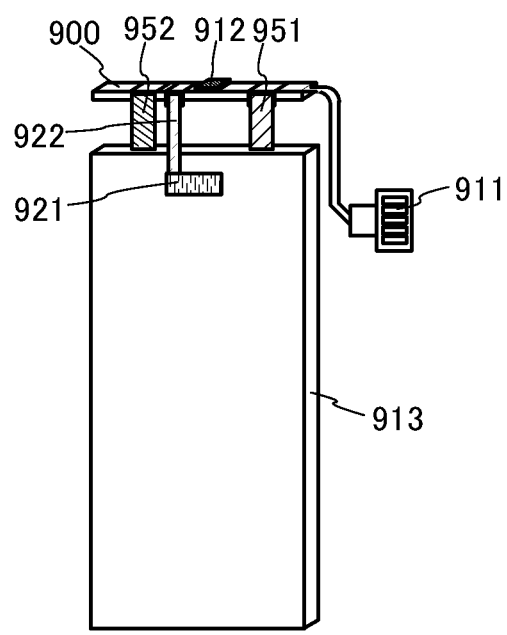

Alternatively, as illustrated in FIG. 10D, the secondary battery 913 shown in FIG. 9A and FIG. 9B may be provided with a sensor 921. The sensor 921 is electrically connected to the terminal 911 via a terminal 922. For the same portions as those in the secondary battery shown in FIG. 9A and FIG. 9B, it is possible to refer to the description of the secondary battery shown in FIG. 9A and FIG. 9B as appropriate.

The sensor 921 has a function of measuring, for example, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, vibration, odor, or infrared rays. With provision of the sensor 921, for example, data on an environment where the secondary battery is placed (e.g., temperature or the like) can be detected and stored in a memory inside the circuit 912.

Figure 11A:
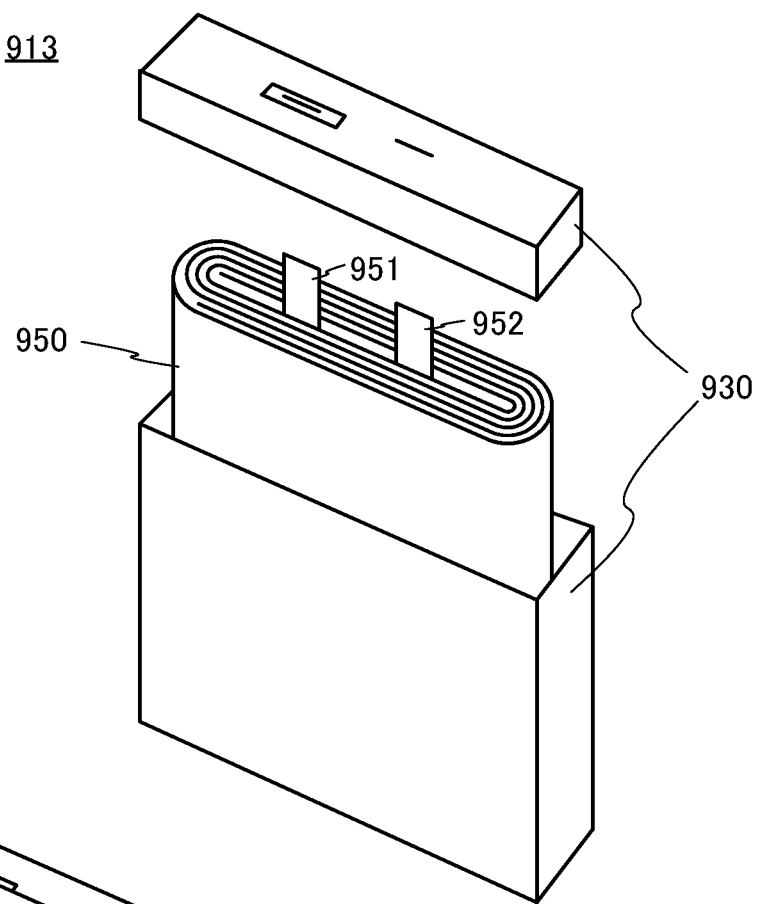
FIG. 11A and FIG. 11B are diagrams each illustrating a structure of a secondary battery.
Figure 11B:
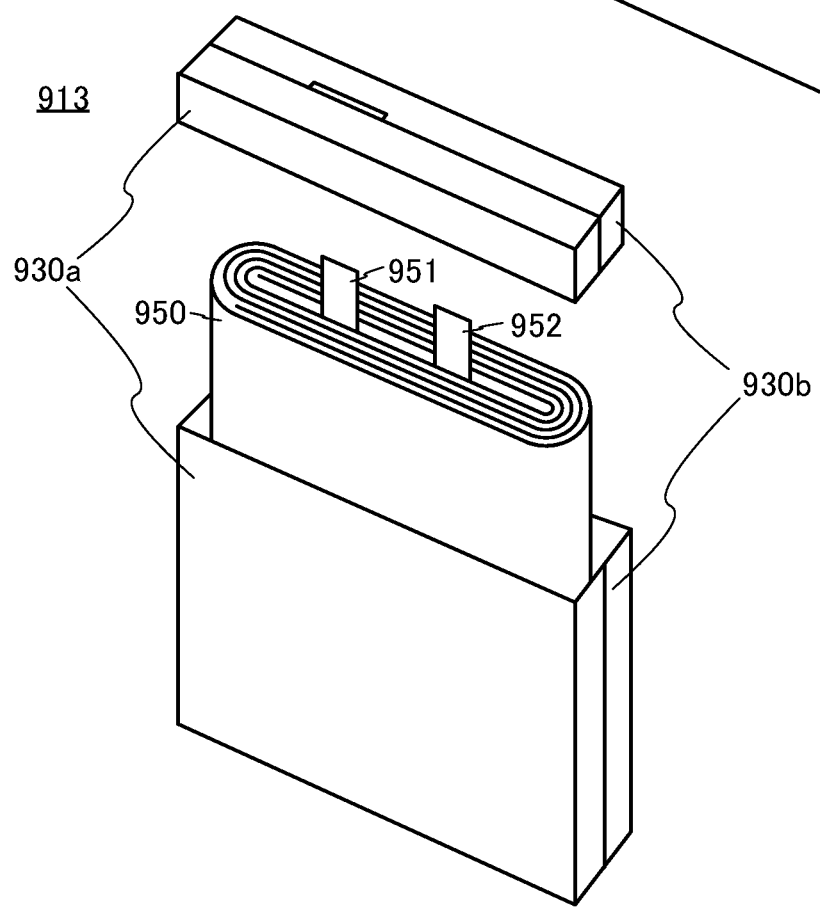
Figure 12:
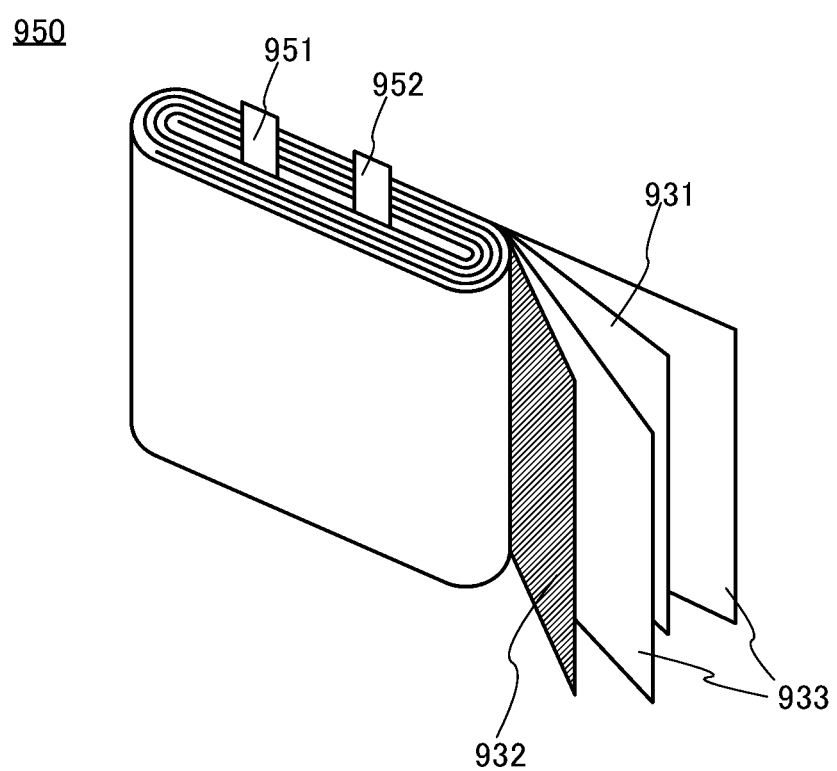
FIG. 12 is a diagram illustrating a structure (wound body) of a secondary battery.

Furthermore, structure examples of the secondary battery 913 are described using FIG. 11 and FIG. 12.

The secondary battery 913 illustrated in FIG. 11A includes a wound body 950 provided with the terminal 951 and the terminal 952 inside a housing 930. The wound body 950 is immersed in an electrolyte solution inside the housing 930. The terminal 952 is in contact with the housing 930. The use of an insulator or the like prevents contact between the terminal 951 and the housing 930. Note that in FIG. 11A, the housing 930 divided into pieces is illustrated for convenience; however, in reality, the wound body 950 is covered with the housing 930, and the terminal 951 and the terminal 952 extend to the outside of the housing 930. For the housing 930, a metal material (e.g., aluminum or the like) or a resin material can be used.

Note that as illustrated in FIG. 11B, the housing 930 illustrated in FIG. 11A may be formed using a plurality of materials. For example, in the secondary battery 913 illustrated in FIG. 11B, a housing 930a and a housing 930b are attached to each other, and the wound body 950 is provided in a region surrounded by the housing 930a and the housing 930b.

For the housing 930a, an insulating material such as an organic resin can be used. In particular, when a material such as an organic resin is used for the side on which an antenna is formed, blocking of an electric field by the secondary battery 913 can be inhibited. Note that in the case where blocking of an electric field by the housing 930a is small, an antenna such as the antenna 914 or the antenna 915 may be provided inside the housing 930a. For the housing 930b, a metal material can be used, for example.

In addition, FIG. 12 illustrates the structure of the wound body 950. The wound body 950 includes a negative electrode 931, a positive electrode 932, and separators 933. The wound body 950 is a wound body where the negative electrode 931 is stacked to overlap with the positive electrode 932 with the separator 933 sandwiched therebetween and the sheet of the stack is wound. Note that a plurality of stacks of the negative electrode 931, the positive electrode 932, and the separator 933 may be superimposed.

The negative electrode 931 is connected to the terminal 911 illustrated in FIG. 9 via one of the terminal 951 and the terminal 952. The positive electrode 932 is connected to the terminal 911 illustrated in FIG. 9 via the other of the terminal 951 and the terminal 952.

[Laminated Secondary Battery]

Next, examples of a laminated secondary battery are described with reference to FIG. 13 to FIG. 19. With a structure where the laminated secondary battery has flexibility and is incorporated in an electronic device at least part of which is flexible, the secondary battery can also be bent in accordance with the deformation of the electronic device.

Figure 13A:
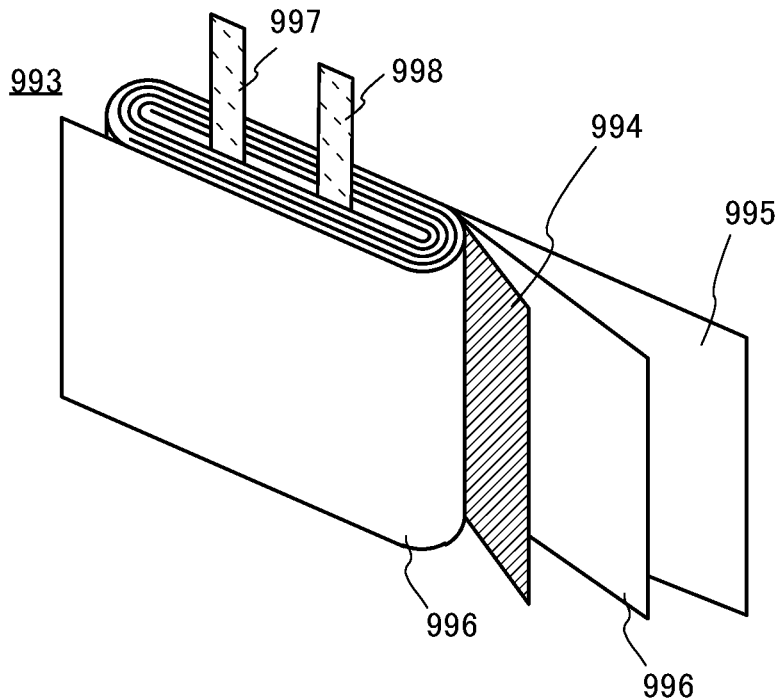
FIG. 13A, FIG. 13B, and FIG. 13C are diagrams illustrating a laminated secondary battery.

A laminated secondary battery 980 is described using FIG. 13. The laminated secondary battery 980 includes a wound body 993 illustrated in FIG. 13A. The wound body 993 includes a negative electrode 994, a positive electrode 995, and separators 996. Like the wound body 950 illustrated in FIG. 12, the wound body 993 is a wound body where the negative electrode 994 is stacked to overlap with the positive electrode 995 with the separator 996 sandwiched therebetween and the sheet of the stack is wound.

Note that the number of stacked layers including the negative electrode 994, the positive electrode 995, and the separator 996 may be designed as appropriate depending on required capacity and element volume. The negative electrode 994 is connected to a negative electrode current collector (not illustrated) via one of a lead electrode 997 and a lead electrode 998. The positive electrode 995 is connected to a positive electrode current collector (not illustrated) via the other of the lead electrode 997 and the lead electrode 998.

Figure 13B:
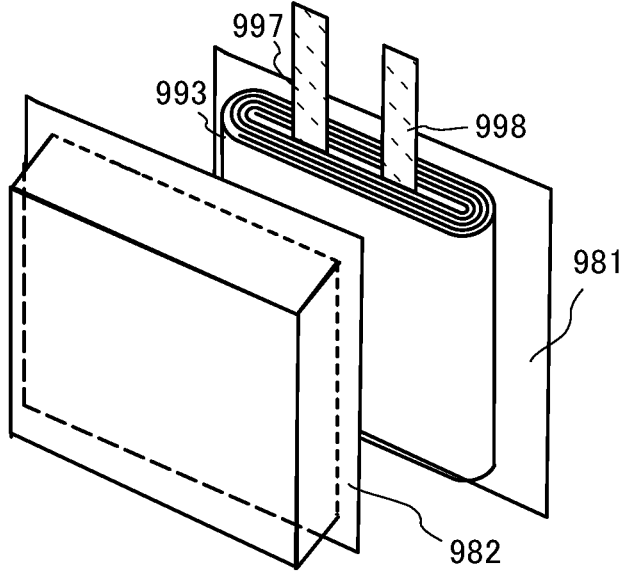
Figure 13C:
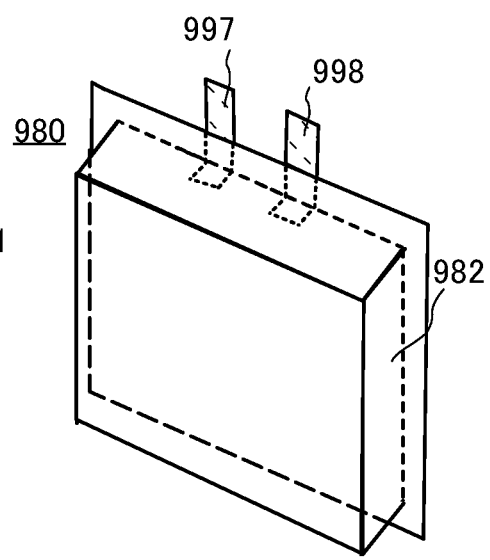

As illustrated in FIG. 13B, the wound body 993 is packed in a space formed through attachment of a film 981 serving as an exterior body and a film 982 having a depressed portion by thermocompression bonding or the like, whereby the secondary battery 980 illustrated in FIG. 13C can be formed. The wound body 993 includes the lead electrode 997 and the lead electrode 998, and is immersed in an electrolyte solution inside a space surrounded by the film 981 and the film 982 having a depressed portion.

For the film 981 and the film 982 having a depressed portion, a metal material such as aluminum or a resin material can be used, for example. With the use of a resin material as the material of the film 981 and the film 982 having a depressed portion, the film 981 and the film 982 having a depressed portion can be deformed when external force is applied; thus, a flexible storage battery can be manufactured.

In addition, although FIG. 13B and FIG. 13C illustrate an example of using two films, a space may be formed by bending one film and the wound body 993 may be packed in the space.

In addition, FIG. 13 illustrates an example in which the secondary battery 980 includes a wound body in a space formed by films serving as an exterior body; however, as illustrated in FIG. 14, for example, a secondary battery may include a plurality of strip-shaped positive electrodes, separators, and negative electrodes in a space formed by films serving as an exterior body.

Figure 14A:
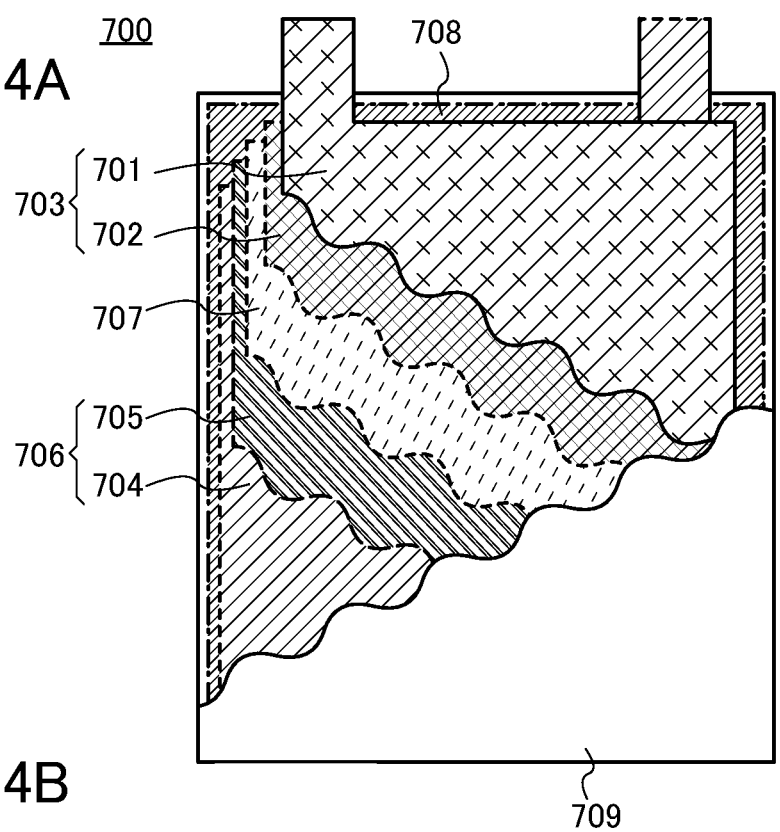
FIG. 14A and FIG. 14B are diagrams illustrating a laminated secondary battery.

A laminated secondary battery 700 illustrated in FIG. 14A includes a positive electrode 703 including a positive electrode current collector 701 and a positive electrode active material layer 702; a negative electrode 706 including a negative electrode current collector 704 and a negative electrode active material layer 705; a separator 707; an electrolyte solution 708; and an exterior body 709. The separator 707 is placed between the positive electrode 703 and the negative electrode 706 provided in the exterior body 709. In addition, the exterior body 709 is filled with the electrolyte solution 708. The electrolyte solution described in Embodiment 2 can be used as the electrolyte solution 708.

In the laminated secondary battery 700 illustrated in FIG. 14A, the positive electrode current collector 701 and the negative electrode current collector 704 also serve as terminals that make electrical contact with the outside. For this reason, parts of the positive electrode current collector 701 and the negative electrode current collector 704 may be arranged to be exposed from the exterior body 709 to the outside. Alternatively, a lead electrode and the positive electrode current collector 701 or the negative electrode current collector 704 may be bonded to each other by ultrasonic welding, and instead of the positive electrode current collector 701 and the negative electrode current collector 704, the lead electrode may be exposed to the outside of the exterior body 709.

In the laminated secondary battery 700, for the exterior body 709, for example, a laminate film having a three-layer structure where a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is further provided as the outer surface of the exterior body over the metal thin film can be used.

Figure 14B:
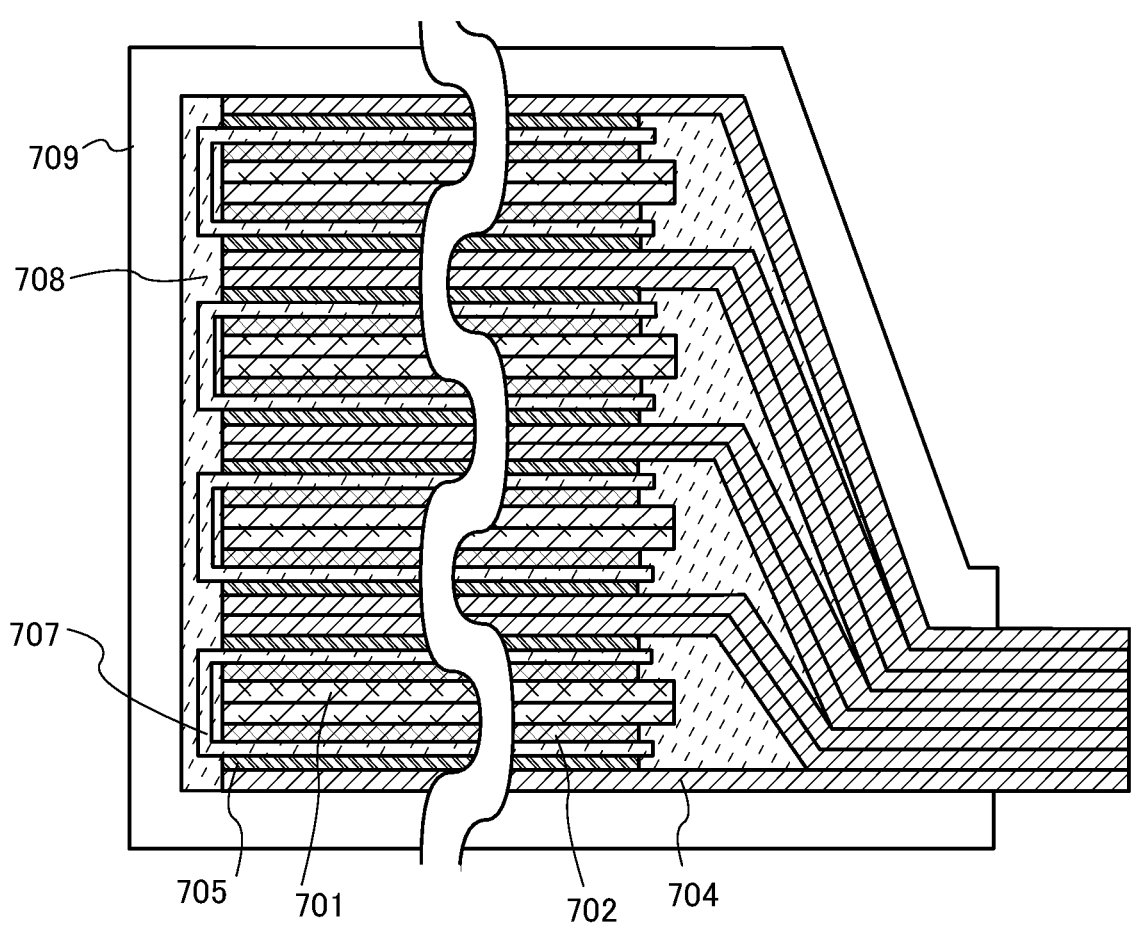

Furthermore, FIG. 14B illustrates an example of a cross-sectional structure of the laminated secondary battery 700. Although FIG. 14A illustrates an example in which the laminated secondary battery 700 is composed of two current collectors for simplicity, the laminated secondary battery 700 is actually composed of a plurality of electrode layers, as illustrated in FIG. 14B.

In FIG. 14B, the number of electrode layers is set to 16, for example. Note that the secondary battery 700 has flexibility even though the number of electrode layers is set to 16. FIG. 14B illustrates a structure including total 16 layers of eight layers of negative electrode current collectors 704 and eight layers of positive electrode current collectors 701. Note that FIG. 14B illustrates a cross section of the extraction portion of the negative electrode, and the eight layers of the negative electrode current collectors 704 are bonded by ultrasonic welding. It is needless to say that the number of electrode layers is not limited to 16, and may be either more than 16 or less than 16. In the case where the number of electrode layers is large, the secondary battery can have higher capacity. Moreover, in the case where the number of electrode layers is small, the secondary battery can have smaller thickness and high flexibility.

Figure 15:
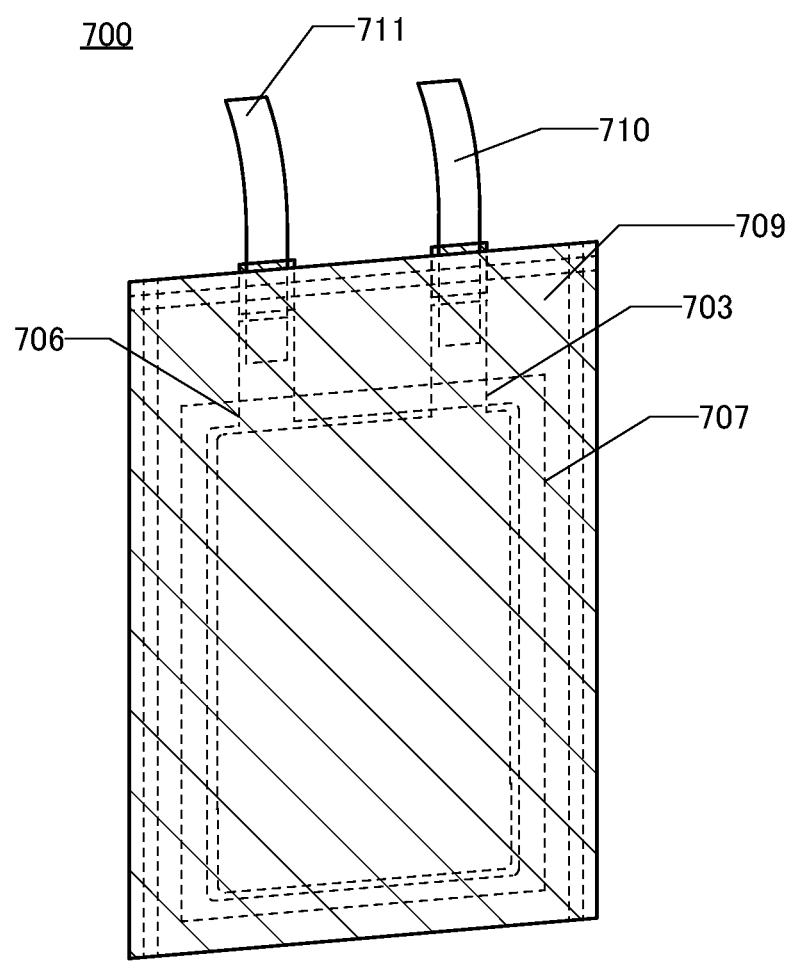
FIG. 15 is a diagram illustrating external appearance of a secondary battery.
Figure 16:
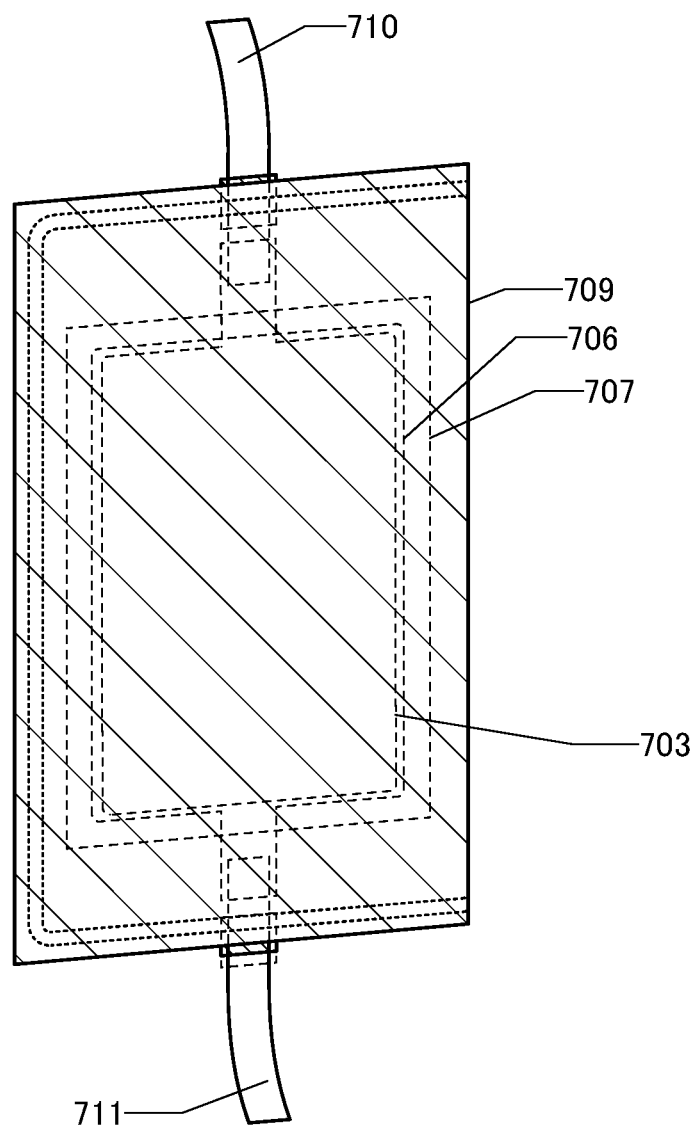
FIG. 16 is a diagram illustrating external appearance of a secondary battery.

Here, FIG. 15 and FIG. 16 illustrate examples of the external view of the laminated secondary battery 700. In FIG. 15 and FIG. 16, the positive electrode 703, the negative electrode 706, the separator 707, the exterior body 709, a positive electrode lead electrode 710, and a negative electrode lead electrode 711 are included.

Figure 17A:
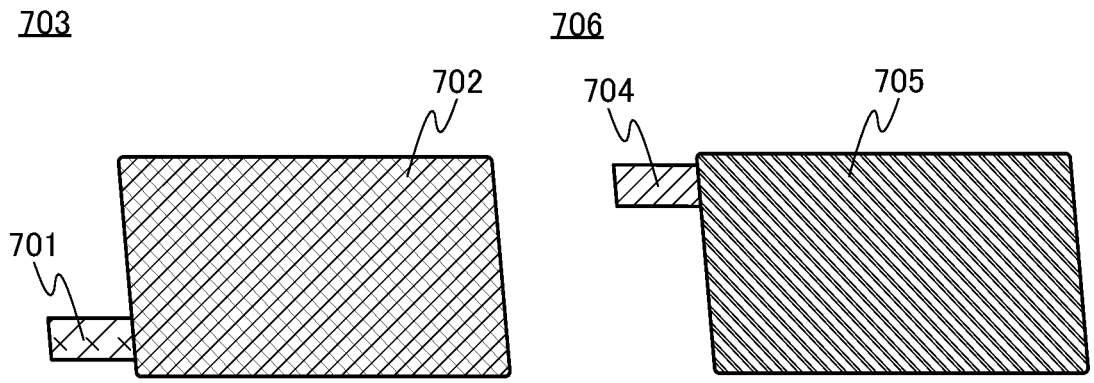
FIG. 17A, FIG. 17B, and FIG. 17C are diagrams illustrating a manufacturing method of a secondary battery.

FIG. 17A illustrates external views of the positive electrode 703 and the negative electrode 706. The positive electrode 703 includes the positive electrode current collector 701, and the positive electrode active material layer 702 is formed on a surface of the positive electrode current collector 701. The positive electrode 703 also includes a region where the positive electrode current collector 701 is partly exposed (hereinafter, such a region is referred to as a tab region). The negative electrode 706 includes the negative electrode current collector 704, and the negative electrode active material layer 705 is formed on a surface of the negative electrode current collector 704. The negative electrode 706 also includes a region where the negative electrode current collector 704 is partly exposed, that is, a tab region. The areas and shapes of the tab regions included in the positive electrode and the negative electrode are not limited to the examples illustrated in FIG. 17A.

[Manufacturing Method of Laminated Secondary Battery]

Figure 17B:
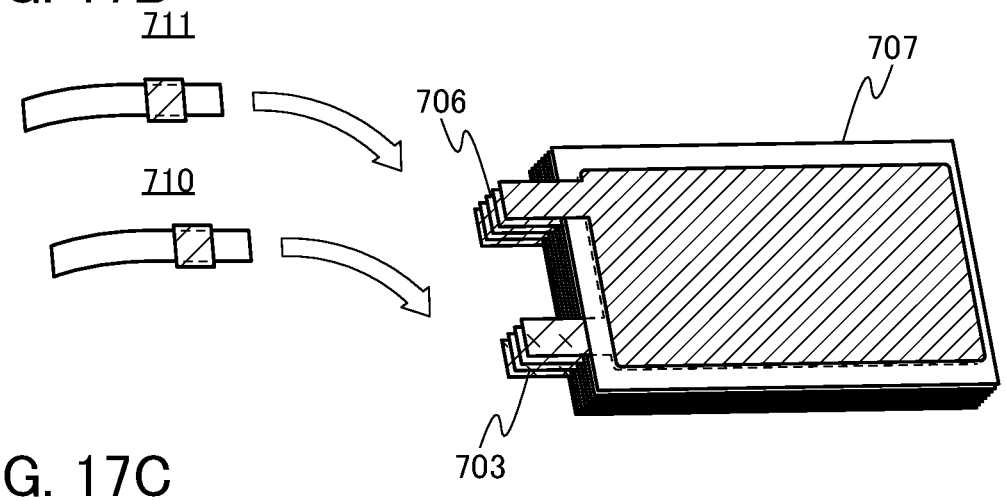
Figure 17C:
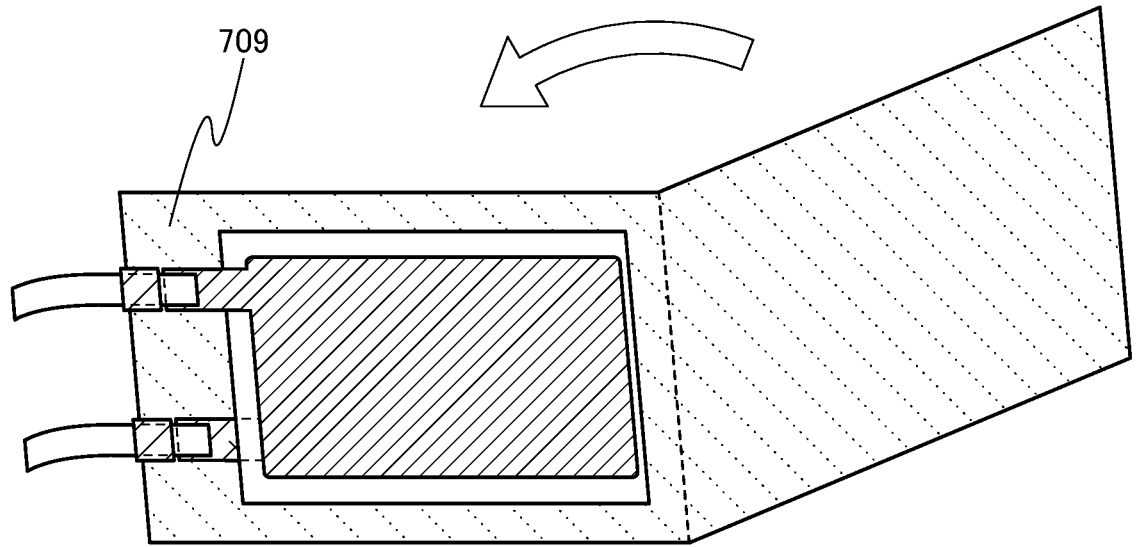

Here, an example of a manufacturing method of the laminated secondary battery whose external view is illustrated in FIG. 15 is described using FIG. 17B and FIG. 17C.

First, the negative electrode 706, the separator 707, and the positive electrode 703 are stacked. FIG. 17B illustrates the negative electrode 706, the separator 707, and the positive electrode 703 that are stacked. An example of using five sets of negative electrodes and four sets of positive electrodes is described here. Next, the tab regions of the positive electrodes 703 are bonded to each other, and the positive electrode lead electrode 710 is bonded to the tab region of the positive electrode on the outermost surface. Ultrasonic welding or the like may be used for the bonding, for example. In a similar manner, the tab regions of the negative electrodes 706 are bonded to each other, and the negative electrode lead electrode 711 is bonded to the tab region of the negative electrode on the outermost surface.

Next, the negative electrode 706, the separator 707, and the positive electrode 703 are placed over the exterior body 709.

Next, the exterior body 709 is bent along a portion shown by a dashed line, as illustrated in FIG. 17C. Then, the outer portions of the exterior body 709 are bonded. Thermocompression or the like may be used for the bonding, for example. At this time, an unbonded region (hereinafter referred to as an inlet) is provided for part (or one side) of the exterior body 709 so that the electrolyte solution 708 can be introduced later.

Next, the electrolyte solution 708 (not illustrated) is introduced into the inside of the exterior body 709 from the inlet provided for the exterior body 709. The electrolyte solution 708 is preferably introduced in a reduced pressure atmosphere or in an inert atmosphere. Lastly, the inlet is bonded. In this manner, the laminated secondary battery 700 can be manufactured.

[Bendable Secondary Battery]

Next, an example of a bendable secondary battery is described with reference to FIG. 18A to FIG. 18E and FIG. 19A and FIG. 19B.

Figure 18A:
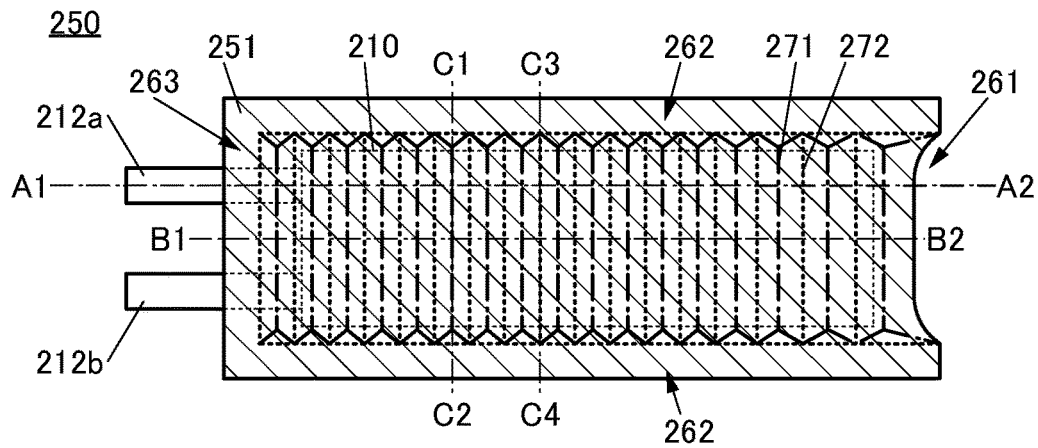
FIG. 18A is a top view of a bendable secondary battery.
Figure 18B:
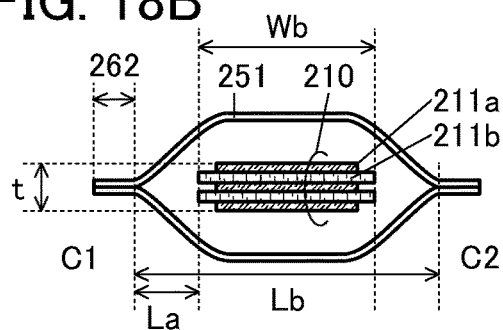
FIG. 18B, FIG. 18C, and FIG. 18D are cross-sectional views of the bendable secondary battery.
Figure 18C:
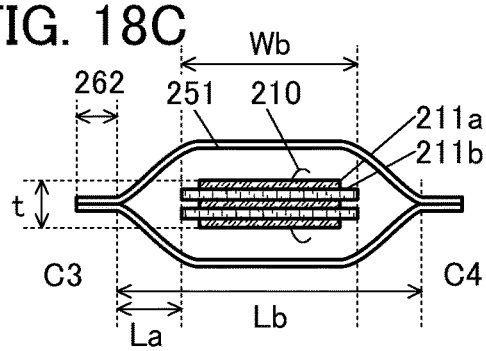
Figure 18D:
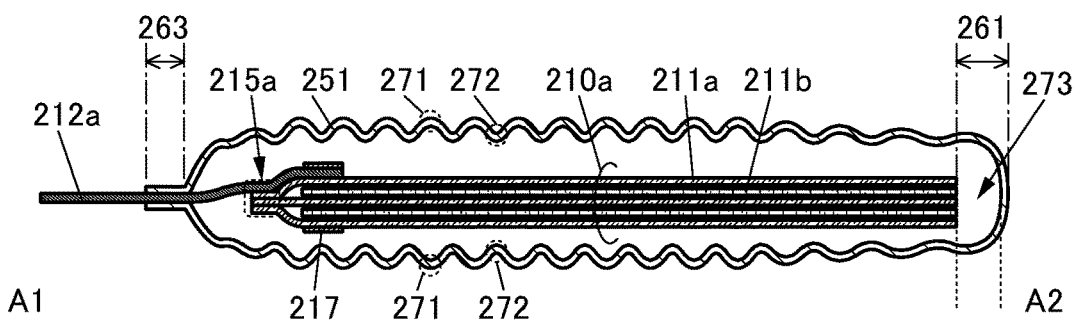

FIG. 18A shows a schematic top view of a bendable secondary battery 250. FIG. 18B, FIG. 18C, and FIG. 18D are schematic cross-sectional views along cutting line C1-C2, cutting line C3-C4, and cutting line A1-A2, respectively, in FIG. 18A. The secondary battery 250 includes an exterior body 251, and a positive electrode 211a and a negative electrode 211b that are held in the inside of the exterior body 251. A lead 212a electrically connected to the positive electrode 211a and a lead 212b electrically connected to the negative electrode 211b are extended to the outside of the exterior body 251. In addition to the positive electrode 211a and the negative electrode 211b, an electrolyte solution (not illustrated) is enclosed in a region surrounded by the exterior body 251.

Figure 19A:
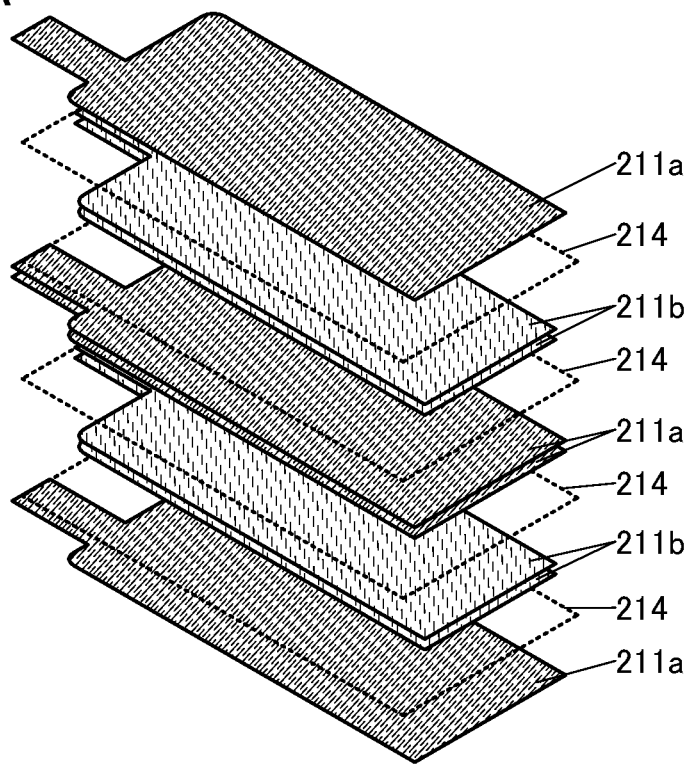
FIG. 19A and FIG. 19B are diagrams illustrating a bendable secondary battery.
Figure 19B:
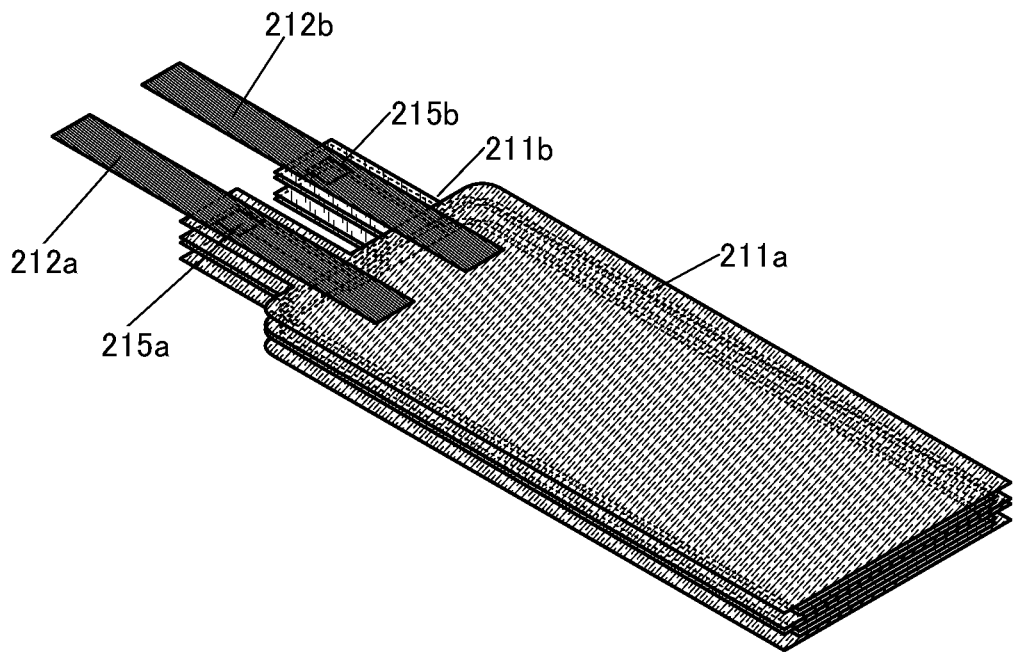

The positive electrode 211a and the negative electrode 211b that are included in the secondary battery 250 are described using FIG. 19. FIG. 19A is a perspective view illustrating the stacking order of the positive electrode 211a, the negative electrode 211b, and a separator 214. FIG. 19B is a perspective view illustrating the lead 212a and the lead 212b in addition to the positive electrode 211a and the negative electrode 211b.

As illustrated in FIG. 19A, the secondary battery 250 includes a plurality of strip-shaped positive electrodes 211a, a plurality of strip-shaped negative electrodes 211b, and a plurality of separators 214. The positive electrode 211a and the negative electrode 211b each include a projected tab portion and a portion other than the tab portion. A positive electrode active material layer is formed on a portion of one surface of the positive electrode 211a other than the tab portion, and a negative electrode active material layer is formed on a portion of one surface of the negative electrode 211b other than the tab portion.

The positive electrodes 211a and the negative electrodes 211b are stacked so that surfaces of the positive electrodes 211a where the positive electrode active material layers are not formed are in contact with each other and that surfaces of the negative electrodes 211b where the negative electrode active material are not formed are in contact with each other.

Furthermore, the separator 214 is provided between the surface of the positive electrode 211a on which the positive electrode active material is formed and the surface of the negative electrode 211b on which the negative electrode active material is formed. In FIG. 19, the separator 214 is shown by a dotted line for clarity.

In addition, as illustrated in FIG. 19B, the plurality of positive electrodes 211a are electrically connected to the lead 212a in a bonding portion 215a. Furthermore, the plurality of negative electrodes 211b are electrically connected to the lead 212b in a bonding portion 215b.

Next, the exterior body 251 is described using FIG. 18B, FIG. 18C, FIG. 18D, and FIG. 18E.

The exterior body 251 has a film-like shape and is folded in half with the positive electrodes 211a and the negative electrodes 211b between facing portions of the exterior body 251. The exterior body 251 includes a bent portion 261, a pair of seal portions 262, and a seal portion 263. The pair of seal portions 262 is provided with the positive electrodes 211a and the negative electrodes 211b positioned therebetween and thus can also be referred to as side seals. In addition, the seal portion 263 includes portions overlapping with the lead 212a and the lead 212b and can also be referred to as a top seal.

Portions of the exterior body 251 that overlap with the positive electrodes 211a and the negative electrodes 211b preferably have a wave shape in which crest lines 271 and trough lines 272 are alternately arranged. In addition, the seal portions 262 and the seal portion 263 of the exterior body 251 are preferably flat.

FIG. 18B is a cross section cut along a portion overlapping with the crest line 271. FIG. 18C is a cross section cut along a portion overlapping with the trough line 272. FIG. 18B and FIG. 18C both correspond to cross sections of the secondary battery 250, the positive electrodes 211a, and the negative electrodes 211b in the width direction.

Here, the distance between end portions of the positive electrode 211a and the negative electrode 211b in the width direction, that is, the end portions of the positive electrode 211a and the negative electrode 211b, and the seal portion 262, is referred to as a distance La. When the secondary battery 250 changes in shape, for example, is bent, the positive electrode 211a and the negative electrode 211b change in shape such that positions thereof are shifted from each other in the length direction as described later. At the time, if the distance La is too short, the exterior body 251, the positive electrode 211a, and the negative electrode 211b are rubbed hard, so that the exterior body 251 is damaged in some cases. In particular, when a metal film of the exterior body 251 is exposed, the metal film might be corroded by the electrolyte solution. Therefore, the distance La is preferably set as long as possible. On the other hand, if the distance La is too long, the volume of the secondary battery 250 is increased.

In addition, the distance La between the positive electrode 211a and the negative electrode 211b, and the seal portion 262 is preferably increased as the total thickness of the positive electrode 211a and the negative electrode 211b that are stacked is increased.

More specifically, when the total thickness of the positive electrode 211a and the negative electrode 211b that are stacked, and the separator 214 that is not illustrated is set to t, the distance La is 0.8 times or more and 3.0 times or less, preferably 0.9 times or more and 2.5 times or less, further preferably 1.0 time or more and 2.0 times or less as large as the thickness t. When the distance La is in this range, a compact battery that is highly reliable for bending can be achieved.

Furthermore, when the distance between the pair of seal portions 262 is set to a distance Lb, it is preferable that the distance Lb be sufficiently longer than the widths of the positive electrode 211a and the negative electrode 211b (here, a width Wb of the negative electrode 211b). Thus, even if the positive electrode 211a and the negative electrode 211b come into contact with the exterior body 251 when deformation such as repeated bending of the secondary battery 250 is conducted, parts of the positive electrode 211a and the negative electrode 211b can be shifted in the width direction; thus, the positive electrode 211a and the negative electrode 211b can be effectively prevented from being rubbed against the exterior body 251.

For example, the difference between the distance Lb between the pair of seal portions 262 and the width Wb of the negative electrode 211b is 1.6 times or more and 6.0 times or less, preferably 1.8 times or more and 5.0 times or less, further preferably 2.0 times or more and 4.0 times or less as large as the thickness t of the positive electrode 211a and the negative electrode 211b.

In other words, the distance Lb, the width Wb, and the thickness t preferably satisfy the relationship of the following formula 1.

[Formula 1]

$$\frac{Lb - Wb}{2t} \geq a \tag{1}$$

Here, a satisfies 0.8 or more and 3.0 or less, preferably 0.9 or more and 2.5 or less, further preferably 1.0 or more and 2.0 or less.

FIG. 18D is a cross section including the lead 212a and corresponds to a cross section of the secondary battery 250, the positive electrode 211a, and the negative electrode 211b in the length direction. As illustrated in FIG. 18D, in the bent portion 261, a space 273 is preferably included between the end portions of the positive electrode 211a and the negative electrode 211b in the length direction and the exterior body 251.

Figure 18E:
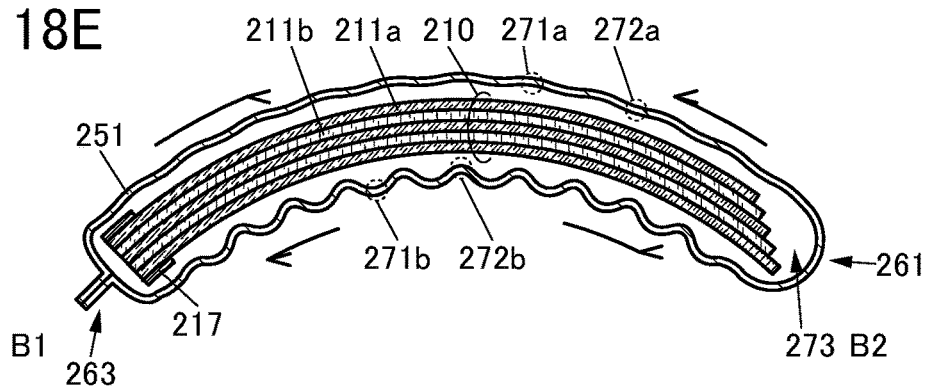
FIG. 18E is a cross-sectional view of the secondary battery which is bent.

FIG. 18E is a schematic cross-sectional view when the secondary battery 250 is bent. FIG. 18E corresponds to a cross section along cutting line B1-B2 in FIG. 18A.

When the secondary battery 250 is bent, part of the exterior body 251 positioned on the outer side in bending is stretched and the other part positioned on the inner side in bending is deformed as it shrinks. More specifically, a portion of the exterior body 251 that is positioned on the outer side is deformed such that the wave amplitude becomes smaller and the wave period becomes longer. By contrast, a portion of the exterior body 251 that is positioned on the inner side is deformed such that the wave amplitude becomes larger and the wave period becomes shorter. When the exterior body 251 is deformed in this manner, stress applied to the exterior body 251 in accordance with bending is relieved, so that a material itself of the exterior body 251 does not need to expand and contract. As a result, the secondary battery 250 can be bent with weak force without damage to the exterior body 251.

Furthermore, as illustrated in FIG. 18E, when the secondary battery 250 is bent, the positive electrode 211a and the negative electrode 211b are shifted relatively to each other. At this time, ends of the stacked positive electrodes 211a and negative electrodes 211b on the seal portion 263 side are fixed by a fixing member 217. Thus, the positive electrodes 211a and the negative electrodes 211b are shifted so that the shift amount becomes larger at a position closer to the bent portion 261. Therefore, stress applied to the positive electrodes 211a and the negative electrodes 211b is relieved, and the positive electrodes 211a and the negative electrodes 211b themselves do not need to expand and contract. Consequently, the secondary battery 250 can be bent without damage to the positive electrodes 211a and the negative electrodes 211b.

Furthermore, the space 273 is included between the positive electrode 211a and the negative electrode 211b, and the exterior body 251, whereby the positive electrode 211a and the negative electrode 211b can be shifted relatively while the positive electrode 211a and the negative electrode 211b located on an inner side in bending do not come into contact with the exterior body 251.

In the secondary battery 250 illustrated in FIG. 18 and FIG. 19, damage to the exterior body, damage to the positive electrode 211a and the negative electrode 211b, and the like are less likely to occur and battery characteristics are less likely to deteriorate even when the secondary battery 250 is repeatedly bent and stretched.

Embodiment 3

In this embodiment, examples of electronic devices each including the secondary battery of one embodiment of the present invention are described. Note that discharge of the secondary battery in accordance with temperature is preferably controlled by the secondary battery control circuit.

First, FIG. 20A to FIG. 20G show examples of electronic devices each including the bendable secondary battery described in part of Embodiment 3. Examples of electronic devices each including the bendable secondary battery include television devices (also referred to as televisions or television receivers), monitors for computers and the like, digital cameras, digital video cameras, digital photo frames, mobile phones (also referred to as cellular phones or mobile phone devices), portable game machines, portable information terminals, audio reproducing devices, large game machines such as pachinko machines, and the like.

In addition, a secondary battery with a flexible shape can also be incorporated along a curved surface of an inside wall or an outside wall of a house or a building or an interior or an exterior of an automobile.

Figure 20A:
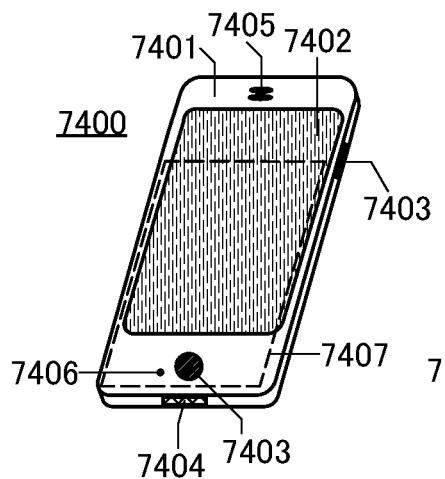
FIG. 20A to FIG. 20H are diagrams illustrating examples of electronic devices.

FIG. 20A illustrates an example of a mobile phone. A mobile phone 7400 includes operation buttons 7403, an external connection port 7404, a speaker 7405, a microphone 7406, and the like in addition to a display portion 7402 incorporated in a housing 7401. Note that the mobile phone 7400 includes a secondary battery 7407. With the use of the secondary battery of one embodiment of the present invention as the secondary battery 7407, a lightweight mobile phone with a long lifetime can be provided.

Figure 20B:
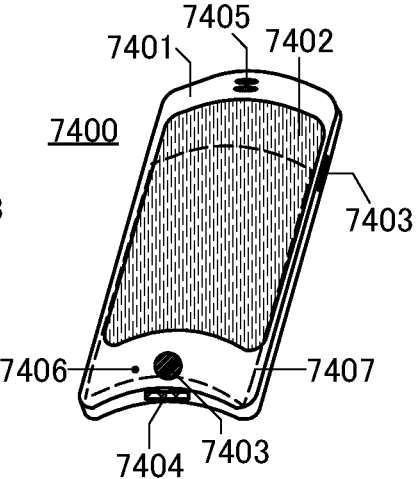
Figure 20C:
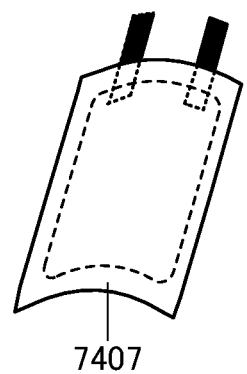

FIG. 20B illustrates the mobile phone 7400 that is curved. When the whole mobile phone 7400 is curved through deformation by external force, the secondary battery 7407 provided therein is also curved. In addition, FIG. 20C illustrates the state of the curved secondary battery 7407 at this time. The secondary battery 7407 is a thin storage battery. The secondary battery 7407 is fixed in a state of being bent. Note that the secondary battery 7407 includes a lead electrode electrically connected to a current collector. A structure is employed in which the current collector is, for example, copper foil, and is partly alloyed with gallium to improve adhesion between the current collector and an active material layer in contact with the current collector, and the secondary battery 7407 has high reliability in a state of being bent.

Figure 20D:
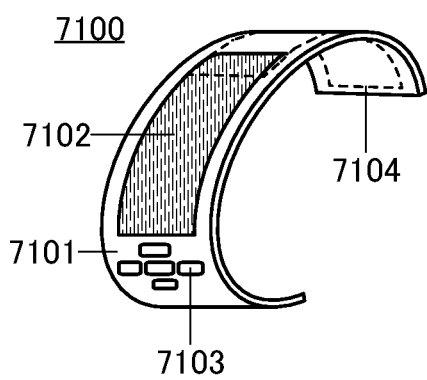
Figure 20E:

FIG. 20D illustrates an example of a bangle-type display device. A portable display device 7100 includes a housing 7101, a display portion 7102, operation buttons 7103, and a secondary battery 7104. In addition, FIG. 20E illustrates the state of the bent secondary battery 7104. When the display device is worn on a user's arm while the secondary battery 7104 is bent, the housing changes in shape and the curvature of part or the whole of the secondary battery 7104 is changed. Note that a value represented by the radius of a circle that corresponds to the bending condition of a curve at a given point is referred to as the radius of curvature, and the reciprocal of the radius of curvature is referred to as curvature. Specifically, the radius of curvature at part or the whole of the housing or the main surface of the secondary battery 7104 is changed in the range of 40 mm to 150 mm. When the radius of curvature at the main surface of the secondary battery 7104 is within the range of 40 mm to 150 mm, reliability can be kept high. With the use of the secondary battery of one embodiment of the present invention as the secondary battery 7104, a lightweight portable display device with a long lifetime can be provided.

Figure 20F:
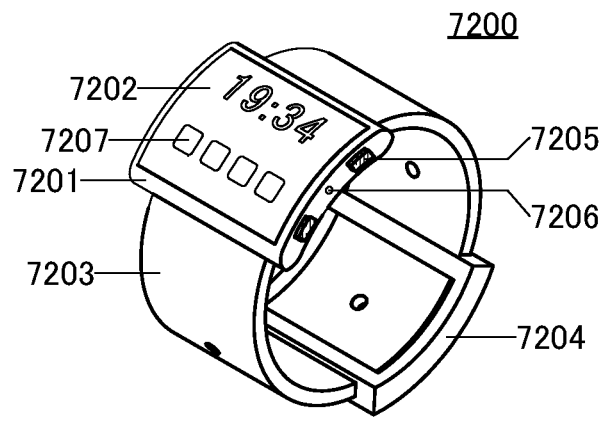

FIG. 20F illustrates an example of a watch-type portable information terminal. A portable information terminal 7200 includes a housing 7201, a display portion 7202, a band 7203, a buckle 7204, an operation button 7205, an input/output terminal 7206, and the like.

The portable information terminal 7200 is capable of executing a variety of applications such as mobile phone calls, e-mailing, viewing and editing texts, music reproduction, Internet communication, and computer games.

The display portion 7202 with a curved display surface is provided, and display can be performed along the curved display surface. In addition, the display portion 7202 includes a touch sensor, and operation can be performed by touching the screen with a finger, a stylus, or the like. For example, by touching an icon 7207 displayed on the display portion 7202, an application can be started.

With the operation button 7205, a variety of functions such as time setting, power on/off operation, wireless communication on/off operation, execution and cancellation of a silent mode, and execution and cancellation of a power saving mode can be performed. For example, the functions of the operation button 7205 can also be set freely by an operating system incorporated in the portable information terminal 7200.

In addition, the portable information terminal 7200 can execute near field communication that is standardized communication. For example, hands-free calling is possible by mutual communication between the portable information terminal 7200 and a headset capable of wireless communication.

Moreover, the portable information terminal 7200 includes the input/output terminal 7206, and data can be directly transmitted to and received from another information terminal via a connector. In addition, charging via the input/output terminal 7206 is also possible. Note that charging operation may be performed by wireless power feeding without using the input/output terminal 7206.

The display portion 7202 of the portable information terminal 7200 includes the secondary battery of one embodiment of the present invention. With the use of the secondary battery of one embodiment of the present invention, a lightweight portable information terminal with a long lifetime can be provided. For example, the secondary battery 7104 illustrated in FIG. 20E that is in the state of being curved can be embedded inside the housing 7201. Alternatively, the secondary battery 7104 illustrated in FIG. 20E can be embedded inside the band 7203 such that it can be curved.

The portable information terminal 7200 preferably includes a sensor. As the sensor, for example, a human body sensor such as a fingerprint sensor, a pulse sensor, or a temperature sensor, a touch sensor, a pressure sensor, an acceleration sensor, or the like is preferably mounted.

Figure 20G:
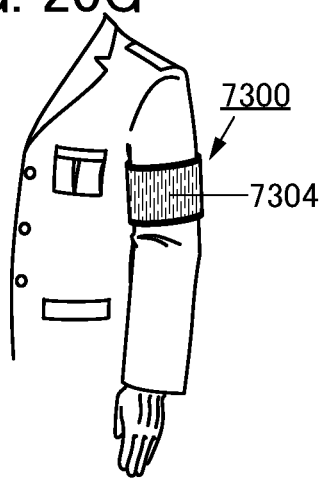

FIG. 20G illustrates an example of an armband display device. A display device 7300 includes a display portion 7304 and the secondary battery of one embodiment of the present invention. In addition, the display device 7300 can further include a touch sensor in the display portion 7304 and can also serve as a portable information terminal.

The display surface of the display portion 7304 is curved, and display can be performed on the curved display surface. In addition, the display state of the display device 7300 can be changed by, for example, near field communication that is standardized communication, or the like.

In addition, the display device 7300 includes an input/output terminal, and data can be directly transmitted to and received from another information terminal via a connector. In addition, charging via the input/output terminal is also possible. Note that charging operation may be performed by wireless power feeding without using the input/output terminal.

With the use of the secondary battery of one embodiment of the present invention as the secondary battery included in the display device 7300, a lightweight display device with a long lifetime can be provided.

Figure 20H:
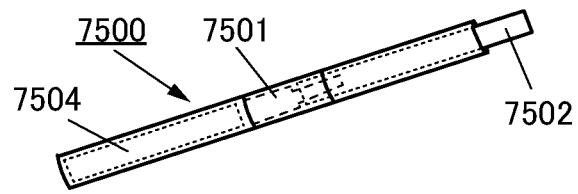
Figure 22:
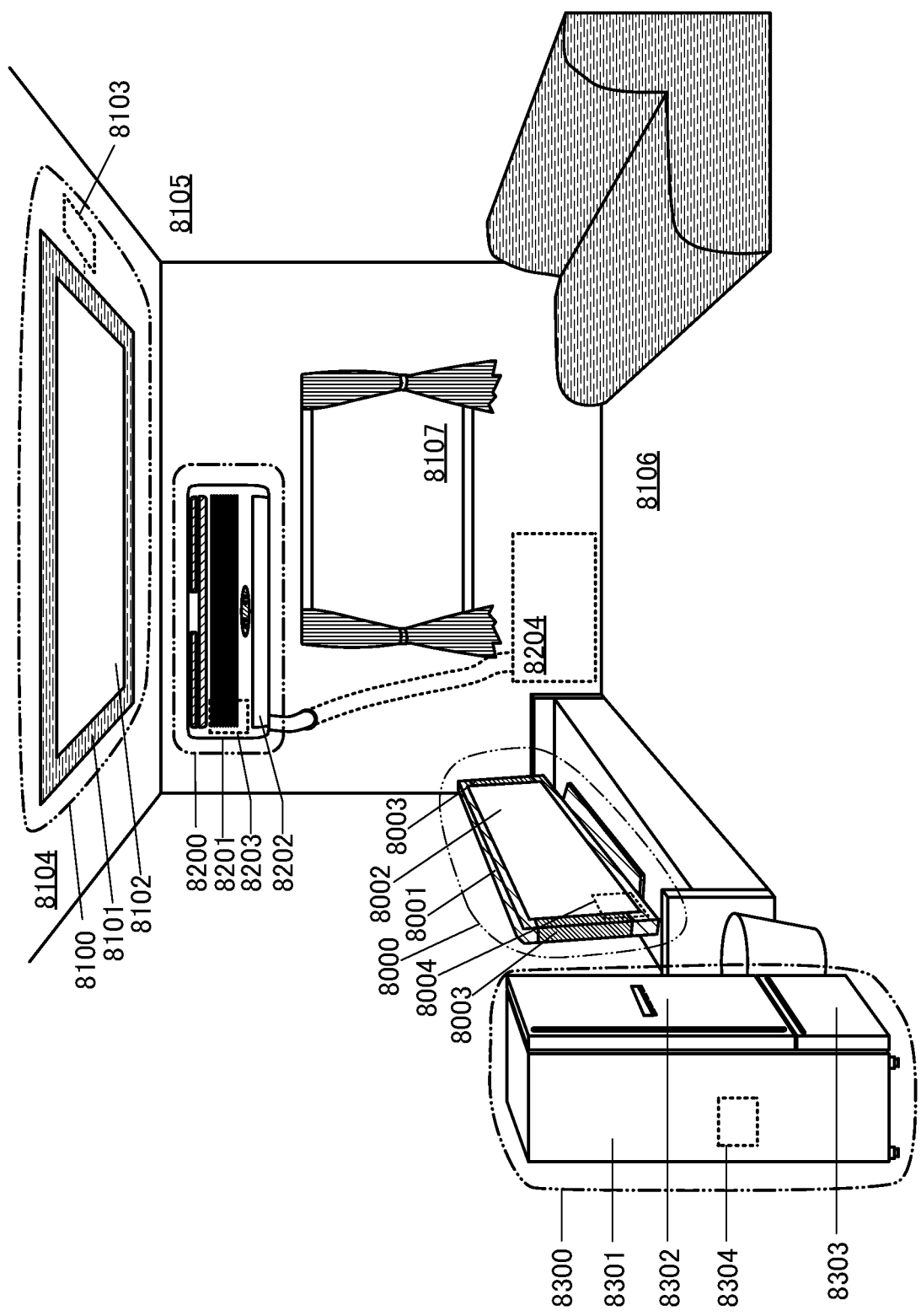
FIG. 22 is a diagram illustrating examples of electronic devices.

In addition, examples of electronic devices each including the secondary battery are described using FIG. 20H, FIG. 21, and FIG. 22.

With the use of the secondary battery of one embodiment of the present invention as a secondary battery of a daily electronic device, a lightweight product with a long lifetime can be provided. Examples of the daily electronic device include an electric toothbrush, an electric shaver, electric beauty equipment, and the like. As secondary batteries of these products, small and lightweight secondary batteries with stick-like shapes and high capacity are desired in consideration of handling ease for users.

FIG. 20H is a perspective view of a device also called a cigarette smoking device (electronic cigarette). In FIG. 20H, an electronic cigarette 7500 is composed of an atomizer 7501 including a heating element, a secondary battery 7504 that supplies electric power to the atomizer, and a cartridge 7502 including a liquid supply bottle, a sensor, and the like. To increase safety, a protection circuit that prevents overcharge and overdischarge of the secondary battery 7504 may be electrically connected to the secondary battery 7504. The secondary battery 7504 illustrated in FIG. 20H includes an external terminal for connection to a charger. When the electronic cigarette 7500 is held, the secondary battery 7504 is a tip portion; thus, it is desirable that the secondary battery 7504 have a short total length and be lightweight. Since the secondary battery of one embodiment of the present invention has high capacity and excellent cycle performance, the small and lightweight electronic cigarette 7500 that can be used for a long time over a long period can be provided.

FIG. 21A and FIG. 21B show an example of a double-foldable tablet terminal. A tablet terminal 9600 illustrated in FIG. 21A and FIG. 21B includes a housing 9630a, a housing 9630b, a movable portion 9640 that connects the housing 9630a to the housing 9630b, a display portion 9631 that includes a display portion 9631a and a display portion 9631b, a switch 9625 to a switch 9627, a fastener 9629, and an operation switch 9628. When a flexible panel is used for the display portion 9631, a tablet terminal with a larger display portion can be provided. FIG. 21A shows the tablet terminal 9600 that is opened, and FIG. 21B shows the tablet terminal 9600 that is closed.

The tablet terminal 9600 includes a power storage unit 9635 inside the housing 9630a and the housing 9630b. The power storage unit 9635 is provided across the housing 9630a and the housing 9630b, passing through the movable portion 9640.

The entire region or part of the region of the display portion 9631 can be a touch panel region, and data can be input by touching an image including an icon, text, an input form, or the like displayed on the region. For example, keyboard buttons may be displayed on the entire surface of the display portion 9631a on the housing 9630a side, and data such as text or an image may be displayed on the display portion 9631b on the housing 9630b side.

Alternatively, a keyboard may be displayed on the display portion 9631b on the housing 9630b side, and data such as text or an image may be displayed on the display portion 9631a on the housing 9630a side. Alternatively, a button for switching keyboard display on a touch panel may be displayed on the display portion 9631, and the button may be touched with a finger, a stylus, or the like to display a keyboard on the display portion 9631.

In addition, touch input can also be performed concurrently in a touch panel region in the display portion 9631a on the housing 9630a side and a touch panel region in the display portion 9631b on the housing 9630b side.

In addition, the switch 9625 to the switch 9627 may function not only as interfaces for operating the tablet terminal 9600 but also as interfaces that can switch various functions. For example, at least one of the switch 9625 to the switch 9627 may function as a switch for switching power on/off of the tablet terminal 9600. For another example, at least one of the switch 9625 to the switch 9627 may have a function of switching display between a portrait mode and a landscape mode or a function of switching display between monochrome display and color display. For another example, at least one of the switch 9625 to the switch 9627 may have a function of adjusting the luminance of the display portion 9631. Alternatively, the luminance of the display portion 9631 can be optimized in accordance with the amount of external light in use of the tablet terminal 9600, which is detected by an optical sensor incorporated in the tablet terminal 9600. Note that another sensing device including a sensor for measuring inclination, such as a gyroscope sensor or an acceleration sensor, may be incorporated in the tablet terminal, in addition to the optical sensor.

In addition, FIG. 21A illustrates the example where the display portion 9631a on the housing 9630a side and the display portion 9631b on the housing 9630b side have substantially the same display area; however, there is no particular limitation on the display area of each of the display portion 9631a and the display portion 9631b, and one of the display portions may have a size different from that of the other of the display portions, and one of the display portions may have display quality different from that of the other of the display portions. For example, one may be a display panel that can display higher-definition images than the other.

The tablet terminal 9600 is folded in half in FIG. 21B. The tablet terminal 9600 includes a housing 9630, a solar cell 9633, and a charge and discharge control circuit 9634 including a DCDC converter 9636. In addition, a power storage unit of one embodiment of the present invention is used as the power storage unit 9635.

Note that as described above, the tablet terminal 9600 can be folded in half; thus, the tablet terminal 9600 can be folded such that the housing 9630a and the housing 9630b overlap with each other when not in use. The display portion 9631 can be protected owing to the folding, which increases the durability of the tablet terminal 9600. Since the power storage unit 9635 including the secondary battery of one embodiment of the present invention has high capacity and excellent cycle performance, the tablet terminal 9600 that can be used for a long time over a long period can be provided.

In addition, the tablet terminal 9600 illustrated in FIG. 21A and FIG. 21B can also have a function of displaying various kinds of data (a still image, a moving image, a text image, and the like), a function of displaying a calendar, a date, or time on the display portion, a touch-input function of operating or editing data displayed on the display portion by touch input, a function of controlling processing by a variety of software (programs), and the like.

With the solar cell 9633 that is attached onto the surface of the tablet terminal 9600, electric power can be supplied to a touch panel, a display portion, a video signal processing portion, and the like. Note that it is possible to obtain a structure where the solar cell 9633 can be provided on one surface or both surfaces of the housing 9630 and the power storage unit 9635 is charged efficiently. Note that the use of a lithium-ion battery as the power storage unit 9635 brings an advantage such as a reduction in size.

In addition, the structure and operation of the charge and discharge control circuit 9634 illustrated in FIG. 21B is described using a block diagram in FIG. 21C. The solar cell 9633, the power storage unit 9635, the DCDC converter 9636, a converter 9637, switches SW1 to SW3, and the display portion 9631 are illustrated in FIG. 21C. The power storage unit 9635, the DCDC converter 9636, the converter 9637, and the switches SW1 to SW3 are portions that correspond to the charge and discharge control circuit 9634 illustrated in FIG. 21B.

First, an operation example when electric power is generated by the solar cell 9633 using external light is described. The voltage of electric power generated by the solar cell is raised or lowered by the DCDC converter 9636 to be a voltage for charging the power storage unit 9635. Then, when the electric power from the solar cell 9633 is used for the operation of the display portion 9631, the switch SW1 is turned on and the voltage of the electric power is raised or lowered by the converter 9637 to be a voltage needed for the display portion 9631. In addition, when display on the display portion 9631 is not performed, a structure where SW1 is turned off and SW2 is turned on to charge the power storage unit 9635 may be used.

Note that the solar cell 9633 is described as an example of a power generation means; however, one embodiment of the present invention is not limited to this example. A structure where the power storage unit 9635 is charged using another power generation means such as a piezoelectric element or a thermoelectric conversion element (Peltier element) may be used. For example, a structure where the power storage unit 9635 is charged with a non-contact power transmission module that transmits and receives electric power wirelessly (without contact) for charging, or with a combination of other charging means may be used.

FIG. 22 illustrates other examples of electronic devices. In FIG. 22, a display device 8000 is an example of an electronic device using a secondary battery 8004 of one embodiment of the present invention. Specifically, the display device 8000 corresponds to a display device for TV broadcast reception and includes a housing 8001, a display portion 8002, speaker portions 8003, the secondary battery 8004, and the like. The secondary battery 8004 of one embodiment of the present invention is provided inside the housing 8001. The display device 8000 can be supplied with electric power from a commercial power supply, or the display device 8000 can use electric power stored in the secondary battery 8004. Thus, the display device 8000 can be utilized with the use of the secondary battery 8004 of one embodiment of the present invention as an uninterruptible power supply even when electric power cannot be supplied from a commercial power supply due to a power failure or the like.

A semiconductor display device such as a liquid crystal display device, a light-emitting device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that the display device includes all of information display devices for personal computers, advertisement display, and the like besides information display devices for TV broadcast reception.

In FIG. 22, an installation lighting device 8100 is an example of an electronic device using a secondary battery 8103 of one embodiment of the present invention. Specifically, the lighting device 8100 includes a housing 8101, a light source 8102, the secondary battery 8103, and the like. Although FIG. 22 illustrates the case where the secondary battery 8103 is provided inside a ceiling 8104 on which the housing 8101 and the light source 8102 are installed, the secondary battery 8103 may be provided inside the housing 8101. The lighting device 8100 can be supplied with electric power from a commercial power supply, or the lighting device 8100 can use electric power stored in the secondary battery 8103. Thus, the lighting device 8100 can be utilized with the use of the secondary battery 8103 of one embodiment of the present invention as an uninterruptible power supply even when electric power cannot be supplied from a commercial power supply due to a power failure or the like.

Note that although the installation lighting device 8100 provided in the ceiling 8104 is illustrated in FIG. 22, the secondary battery of one embodiment of the present invention can be used for an installation lighting device provided in, for example, a wall 8105, a floor 8106, a window 8107, or the like other than the ceiling 8104, or can be used in a tabletop lighting device or the like.

In addition, an artificial light source that obtains light artificially by using electric power can be used as the light source 8102. Specifically, an incandescent lamp, a discharge lamp such as a fluorescent lamp, and light-emitting elements such as an LED and an organic EL element are given as examples of the artificial light source.

In FIG. 22, an air conditioner including an indoor unit 8200 and an outdoor unit 8204 is an example of an electronic device using a secondary battery 8203 of one embodiment of the present invention. Specifically, the indoor unit 8200 includes a housing 8201, an air outlet 8202, the secondary battery 8203, and the like. Although FIG. 22 illustrates the case where the secondary battery 8203 is provided in the indoor unit 8200, the secondary battery 8203 may be provided in the outdoor unit 8204. Alternatively, the secondary batteries 8203 may be provided in both the indoor unit 8200 and the outdoor unit 8204. The air conditioner can be supplied with electric power from a commercial power supply, or the air conditioner can use electric power stored in the secondary battery 8203. Particularly in the case where the secondary batteries 8203 are provided in both the indoor unit 8200 and the outdoor unit 8204, the air conditioner can be utilized with the use of the secondary batteries 8203 of one embodiment of the present invention as uninterruptible power supplies even when electric power cannot be supplied from a commercial power supply due to a power failure or the like.

Note that although the split-type air conditioner composed of the indoor unit and the outdoor unit is illustrated in FIG. 22, the secondary battery of one embodiment of the present invention can also be used in an integrated air conditioner in which one housing has the function of an indoor unit and the function of an outdoor unit.

In FIG. 22, an electric refrigerator-freezer 8300 is an example of an electronic device using a secondary battery 8304 of one embodiment of the present invention. Specifically, the electric refrigerator-freezer 8300 includes a housing 8301, a refrigerator door 8302, a freezer door 8303, the secondary battery 8304, and the like. The secondary battery 8304 is provided inside the housing 8301 in FIG. 22. The electric refrigerator-freezer 8300 can be supplied with electric power from a commercial power supply, or the electric refrigerator-freezer 8300 can use electric power stored in the secondary battery 8304. Thus, the electric refrigerator-freezer 8300 can be utilized with the use of the secondary battery 8304 of one embodiment of the present invention as an uninterruptible power supply even when electric power cannot be supplied from a commercial power supply due to a power failure or the like.

Note that among the electronic devices described above, a high-frequency heating device such as a microwave oven and an electronic device such as an electric rice cooker require high electric power in a short time. Therefore, the tripping of a breaker of a commercial power supply in use of an electronic device can be prevented by using the secondary battery of one embodiment of the present invention as an auxiliary power supply for supplying electric power which cannot be supplied enough by the commercial power supply.

In addition, in a time period when electronic devices are not used, particularly in a time period when the proportion of the amount of electric power that is actually used to the total amount of electric power that can be supplied from a commercial power supply (such a proportion is referred to as a usage rate of electric power) is low, electric power is stored in the secondary battery, whereby the increase in the usage rate of electric power can be inhibited in a time period other than the above time period. For example, in the case of the electric refrigerator-freezer 8300, electric power is stored in the secondary battery 8304 in night time when the temperature is low and the refrigerator door 8302 and the freezer door 8303 are not opened and closed. Moreover, in daytime when the temperature is high and the refrigerator door 8302 and the freezer door 8303 are opened and closed, the usage rate of electric power in daytime can be kept low by using the secondary battery 8304 as an auxiliary power supply.

According to one embodiment of the present invention, the cycle performance of the secondary battery can be made better and reliability can be improved. Furthermore, according to one embodiment of the present invention, a secondary battery with high capacity can be obtained; thus, the secondary battery itself can be made more compact and lightweight owing to the improvement in the characteristics of the secondary battery. Thus, the secondary battery of one embodiment of the present invention is incorporated in the electronic device described in this embodiment, whereby a more lightweight electronic device with a longer lifetime can be obtained. This embodiment can be implemented in appropriate combination with the other embodiments.

Embodiment 4

In this embodiment, examples of vehicles each including the secondary battery of one embodiment of the present invention are described. Note that discharge of the secondary battery in accordance with temperature is preferably controlled by the secondary battery control circuit.

By incorporating secondary batteries in vehicles, next-generation clean energy automobiles such as hybrid electric vehicles (HEVs), electric vehicles (EVs), and plug-in hybrid electric vehicles (PHEVs) can be achieved.

Figure 23A:
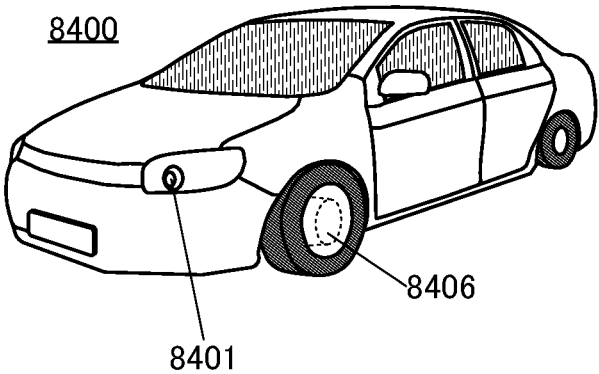
FIG. 23A to FIG. 23C are diagrams illustrating examples of vehicles.

FIG. 23 illustrates examples of vehicles each using the secondary battery of one embodiment of the present invention. An automobile 8400 illustrated in FIG. 23A is an electric vehicle that runs on the power of an electric motor. Alternatively, the automobile 8400 is a hybrid electric vehicle capable of running on the power of either an electric motor or an engine as appropriate. The use of one embodiment of the present invention can achieve a vehicle with a wide cruising range. In addition, the automobile 8400 includes a secondary battery. As the secondary battery, the secondary battery modules illustrated in FIG. 8C and FIG. 8D may be arranged to be used in a floor portion in the automobile. Alternatively, a battery pack in which a plurality of secondary batteries illustrated in FIG. 11 are combined may be placed in the floor portion in the automobile. The secondary battery not only drives an electric motor 8406 but also can supply electric power to a light-emitting device such as a headlight 8401 or a room light (not illustrated).

In addition, the secondary battery can supply electric power to a display device included in the automobile 8400, such as a speedometer or a tachometer. Furthermore, the secondary battery can supply electric power to a semiconductor device included in the automobile 8400, such as a navigation system.

Figure 23B:
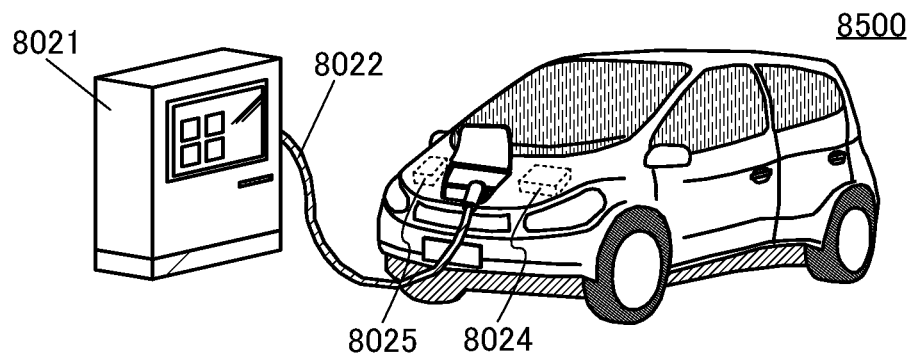

An automobile 8500 illustrated in FIG. 23B can be charged when a secondary battery included in the automobile 8500 is supplied with electric power from external charging equipment by a plug-in system, a contactless power feeding system, or the like. FIG. 23B illustrates a state where a secondary battery 8024 incorporated in the automobile 8500 is charged from a ground installation type charging device 8021 through a cable 8022. Charging may be performed as appropriate by a given method such as CHAdeMO (registered trademark) or Combined Charging System as a charging method, the standard of a connector, or the like. The charging device 8021 may be a charging station provided in a commerce facility or a power source in a house. For example, with a plug-in technique, the secondary battery 8024 incorporated in the automobile 8500 can be charged by power supply from the outside. Charging can be performed by converting AC power into DC power through a converter such as an ACDC converter.

Furthermore, although not illustrated, a power receiving device can be incorporated in a vehicle, and the vehicle can be charged by being supplied with electric power from an above-ground power transmitting device in a contactless manner. In the case of this contactless power feeding system, by incorporating a power transmitting device in a road or an exterior wall, charging can also be performed while the vehicle is driven without limitation on the period while the vehicle is stopped. In addition, this contactless power feeding system may be utilized to transmit and receive electric power between vehicles. Furthermore, a solar cell may be provided in the exterior of the vehicle to charge the secondary battery while the vehicle is stopped or while the vehicle is driven. For supply of electric power in such a contactless manner, an electromagnetic induction method or a magnetic resonance method can be used.

Figure 23C:
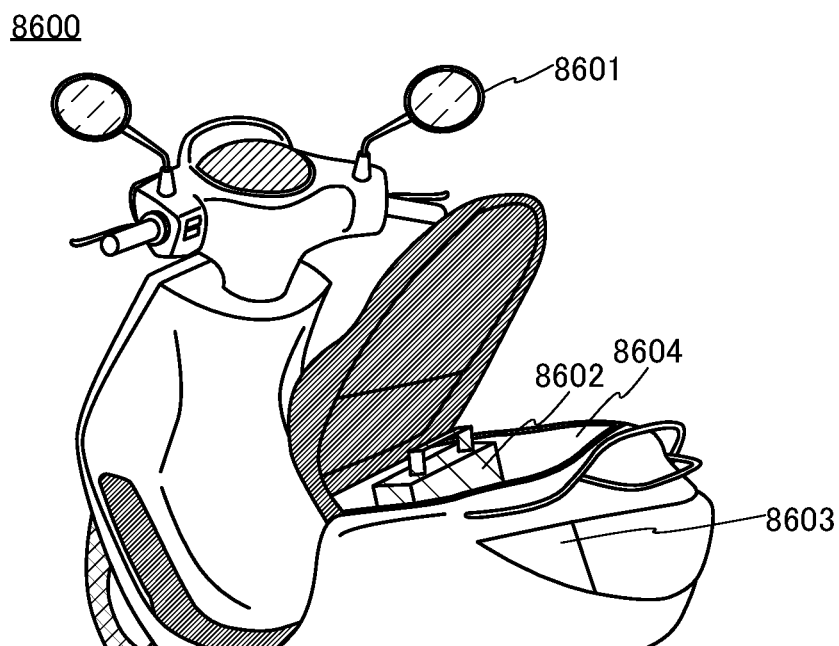

In addition, FIG. 23C is an example of a motorcycle using the secondary battery of one embodiment of the present invention. A motor scooter 8600 illustrated in FIG. 23C includes a secondary battery 8602, side mirrors 8601, and direction indicators 8603. The secondary battery 8602 can supply electricity to the direction indicators 8603.

Furthermore, in the motor scooter 8600 illustrated in FIG. 23C, the secondary battery 8602 can be stored in an under-seat storage 8604. The secondary battery 8602 can be stored in the under-seat storage 8604 even when the under-seat storage 8604 is small. The secondary battery 8602 is detachable; thus, the secondary battery 8602 may be carried indoors when charged, and may be stored before the motor scooter is driven.

According to one embodiment of the present invention, the cycle performance of the secondary battery can be made better, and the capacity of the secondary battery can be increased. Thus, the secondary battery itself can be made more compact and lightweight. When the secondary battery itself can be made more compact and lightweight, it contributes to a reduction in the weight of a vehicle, and thus can improve the cruising range. Furthermore, the secondary battery incorporated in the vehicle can also be used as a power supply source for devices other than the vehicle. In that case, the use of a commercial power supply can be avoided at peak time of power demand, for example. Avoiding the use of a commercial power supply at peak time of power demand can contribute to energy saving and a reduction in carbon dioxide discharge. Moreover, with excellent cycle performance, the secondary battery can be used over a long period; thus, the use amount of rare metal including cobalt can be reduced.

This embodiment can be implemented in appropriate combination with any of the other embodiments.

Embodiment 5

In this embodiment, structures of a transistor that can be used in the semiconductor device described in the above embodiments are described. Specifically, a structure in which transistors having different electrical characteristics are stacked is described. With the structure, the degree of freedom in design of the semiconductor device can be increased. Stacking transistors having different electrical characteristics can increase the integration degree of the semiconductor device.

Figure 24:
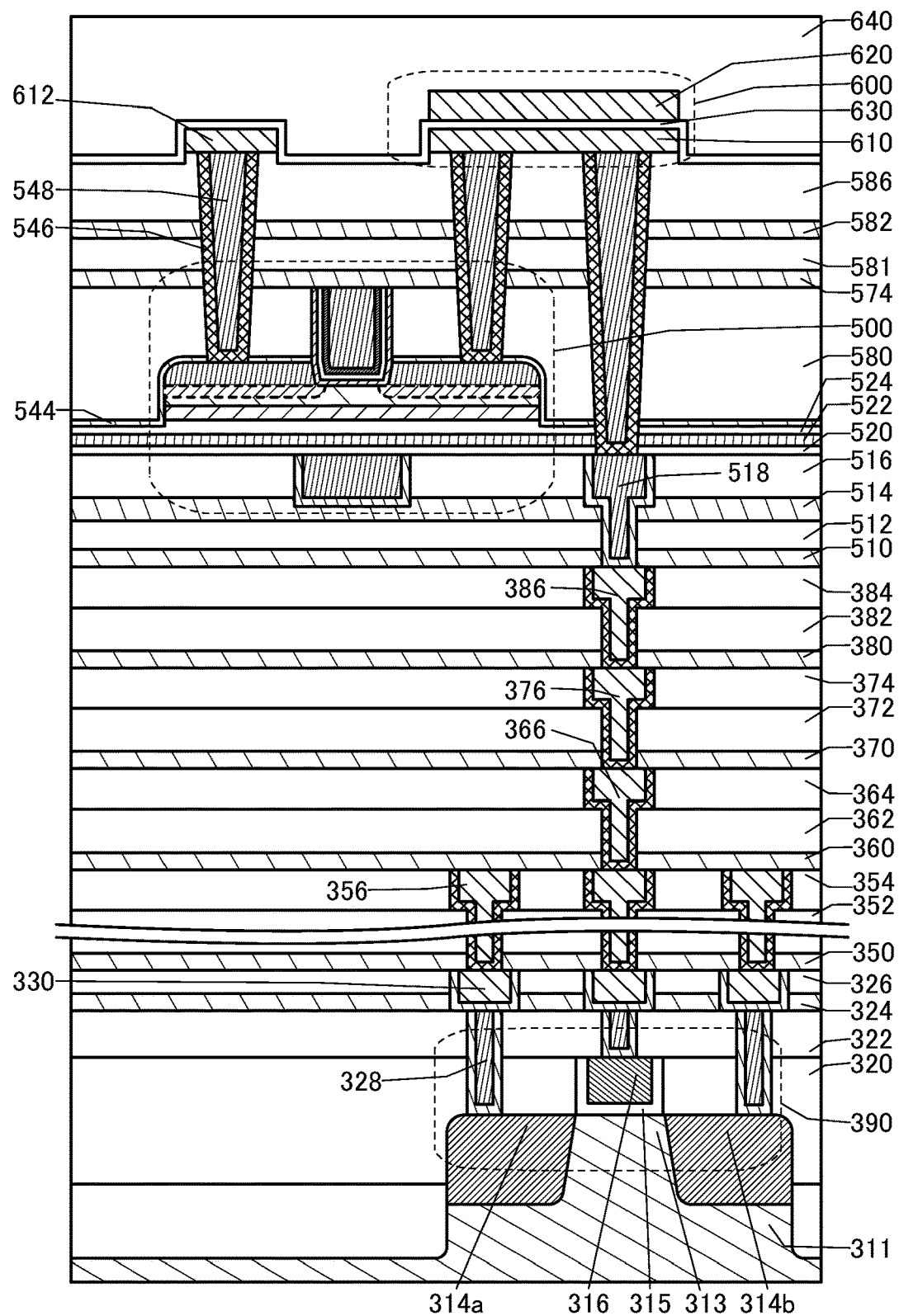
FIG. 24 is a diagram illustrating a structure example of a semiconductor device.
Figure 26A:
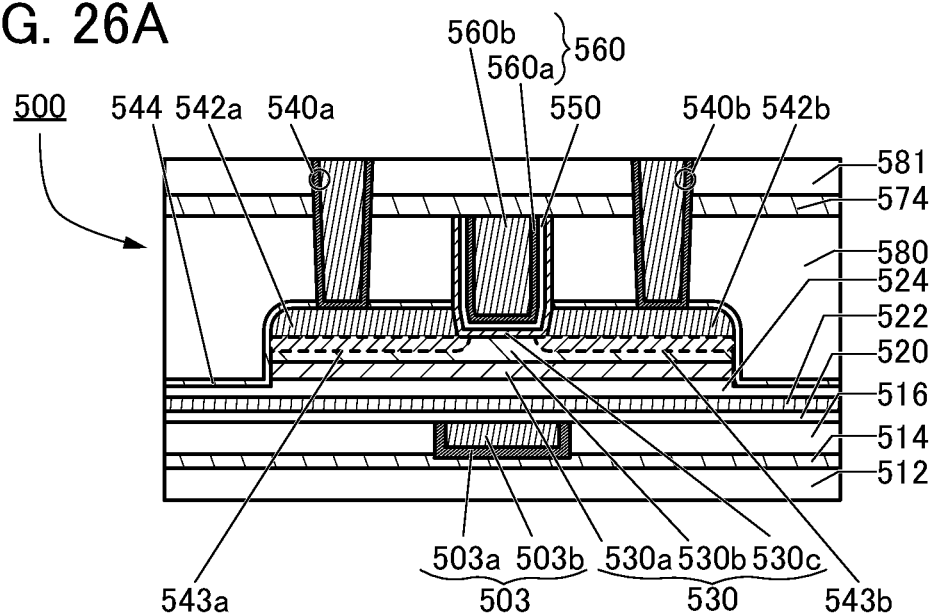
FIG. 26A to FIG. 26C are diagrams illustrating a structure example of a transistor.
Figure 26B:
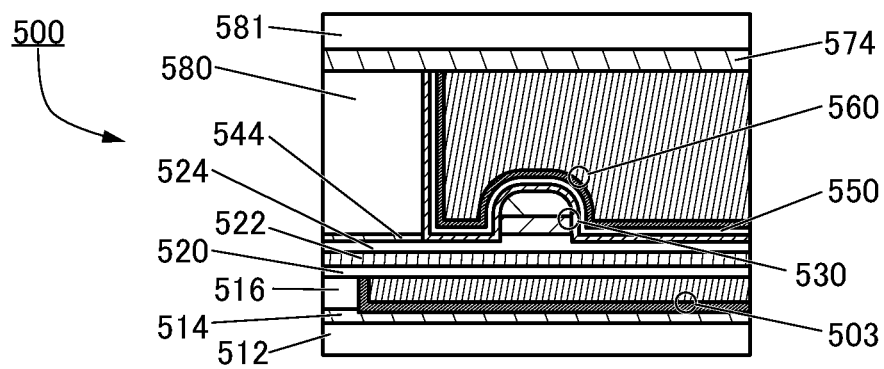
Figure 26C:
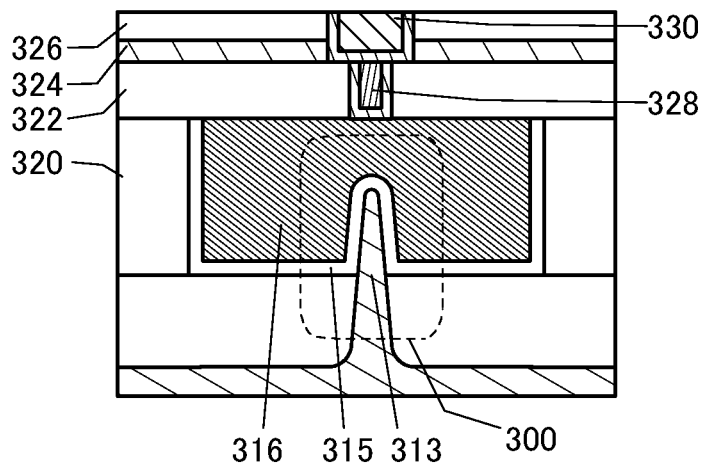

A semiconductor device shown in FIG. 24 includes a transistor 390, a transistor 500, and a capacitor 600. FIG. 26A is a cross-sectional view of the transistor 500 in the channel length direction, FIG. 26B is a cross-sectional view of the transistor 500 in the channel width direction, and FIG. 26C is a cross-sectional view of the transistor 390 in the channel width direction.

The transistor 500 is an OS transistor. The off-state current of the transistor 500 is low. Therefore, when the OS transistor described in the above embodiment has a structure similar to that of the transistor 500, for example, a voltage can be retained for a long time.

The semiconductor device described in this embodiment includes the transistor 390, the transistor 500, and the capacitor 600 as shown in FIG. 24. The transistor 500 is provided above the transistor 390, and the capacitor 600 is provided above the transistor 390 and the transistor 500. For example, the transistor described in the above embodiment can have a structure similar to that of the transistor 390, and the capacitor can have a structure similar to that of the capacitor 600.

The transistor 390 is provided on a substrate 311 and includes a conductor 316, an insulator 315, a semiconductor region 313 that is part of the substrate 311, and a low-resistance region 314a and a low-resistance region 314b functioning as a source region and a drain region.

As shown in FIG. 26C, in the transistor 390, the top surface and side surfaces in the channel width direction of the semiconductor region 313 are covered with the conductor 316 with the insulator 315 therebetween. In this manner, the effective channel width is increased when the transistor 390 is a Fin type. Thus, the on-state characteristics of the transistor 390 can be improved. In addition, since contribution of an electric field of a gate electrode can be increased, the off-state characteristics of the transistor 390 can be improved.

Note that the transistor 390 can be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, and preferably contain single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 390 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 25:
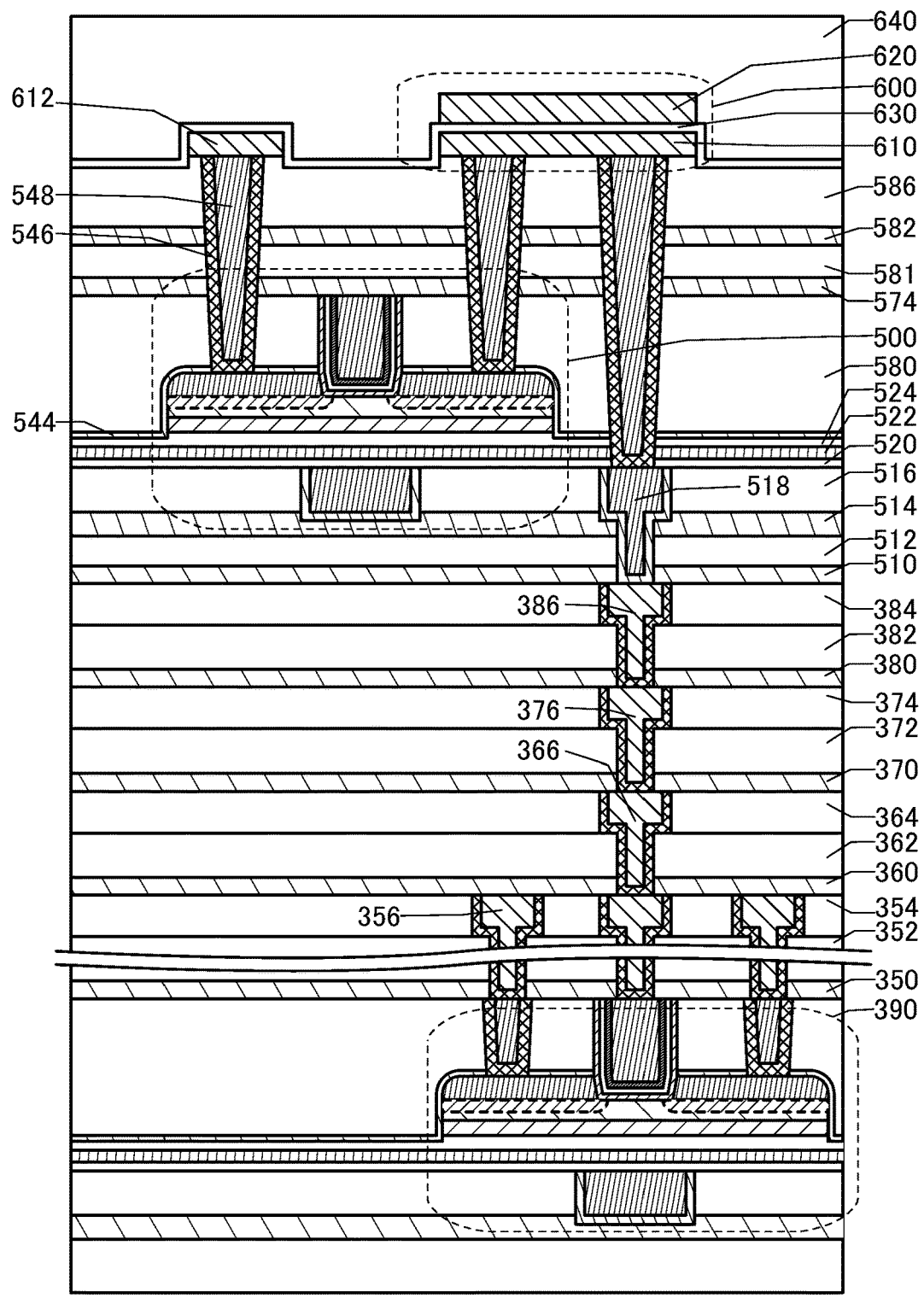
FIG. 25 is a diagram illustrating a structure example of a semiconductor device.

Note that the transistor 390 shown in FIG. 24 is an example and the structure is not limited thereto; an appropriate transistor is used in accordance with a circuit configuration or a driving method. For example, when a semiconductor device is a single-polarity circuit using only OS transistors, the transistor 390 has a structure similar to the structure of the transistor 500 that is an OS transistor, as shown in FIG. 25. Note that the details of the transistor 500 are described later. The transistor 390 shown in FIG. 25 can be employed for an n-channel transistor shown in FIG. 25, for example.

In this specification and the like, a single-polarity circuit refers to a circuit in which all transistors have the same polarity, for example. For example, a circuit in which all transistors are n-channel transistors can be referred to as a single-polarity circuit.

An insulator 320, an insulator 322, an insulator 324, and an insulator 326 are stacked in this order to cover the transistor 390.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

Note that in this specification and the like, silicon oxynitride refers to a material that contains oxygen at a higher proportion than nitrogen, and silicon nitride oxide refers to a material that contains nitrogen at a higher proportion than oxygen. Furthermore, in this specification and the like, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 390 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 390, or the like into the region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 390. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low dielectric constant is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and another part of the conductor functions as a plug.

As a material for each of the plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 24, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 390. Note that the conductor 356 can be provided using a material similar to that for the conductor 328 or the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 390 and the transistor 500 can be separated by the barrier layer, so that diffusion of hydrogen from the transistor 390 into the transistor 500 can be inhibited.

Note that as the conductor having a barrier property against hydrogen, tantalum nitride is preferably used, for example. In addition, the use of a stack including tantalum nitride and tungsten, which has high conductivity, can inhibit diffusion of hydrogen from the transistor 390 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 24, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to that for the conductor 328 or the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 390 and the transistor 500 can be separated by the barrier layer, so that diffusion of hydrogen from the transistor 390 into the transistor 500 can be inhibited.

A wiring layer may be provided over the insulator 364 and the conductor 366. For example, in FIG. 24, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to that for the conductor 328 or the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 390 and the transistor 500 can be separated by the barrier layer, so that diffusion of hydrogen from the transistor 390 into the transistor 500 can be inhibited.

A wiring layer may be provided over the insulator 374 and the conductor 376. For example, in FIG. 24, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to that for the conductor 328 or the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 390 and the transistor 500 can be separated by the barrier layer, so that diffusion of hydrogen from the transistor 390 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 390 is provided, or the like into the region where the transistor 500 is provided. Thus, a material similar to that for the insulator 324 is preferably used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 390. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has an excellent blocking effect that prevents passage of both oxygen and impurities such as hydrogen and moisture which are factors in a change in electrical characteristics of the transistor. Thus, aluminum oxide can prevent entry of impurities such as hydrogen and moisture into the transistor 500 in the fabrication process and after the fabrication of the transistor. In addition, release of oxygen from the metal oxide included in the transistor 500 can be inhibited. Therefore, aluminum oxide is suitably used for a protective film of the transistor 500.

The insulator 512 and the insulator 516 can be formed using a material similar to that for the insulator 320, for example. Furthermore, when a material with a comparatively low dielectric constant is used for these insulators, parasitic capacitance generated between wirings can be reduced. A silicon oxide film, a silicon oxynitride film, or the like can be used as the insulator 512 and the insulator 516, for example.

Furthermore, a conductor 518, a conductor included in the transistor 500 (a conductor 503, for example), and the like are embedded in the insulator 510, the insulator 512, the insulator 514, and the insulator 516. Note that the conductor 518 has a function of a plug or a wiring that is connected to the capacitor 600 or the transistor 390. The conductor 518 can be provided using a material similar to that for the conductor 328 or the conductor 330.

In particular, the conductor 518 in a region in contact with the insulator 510 and the insulator 514 is preferably a conductor having a barrier property against oxygen, hydrogen, and water. With this structure, the transistor 390 and the transistor 500 can be separated by the layer having a barrier property against oxygen, hydrogen, and water; thus, the diffusion of hydrogen from the transistor 390 into the transistor 500 can be inhibited.

The transistor 500 is provided above the insulator 516.

As shown in FIG. 26A and FIG. 26B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an oxide 530c positioned on a bottom and a side surface of the opening; an insulator 550 positioned on a formation surface of the oxide 530c; and a conductor 560 positioned on a formation surface of the insulator 550.

As shown in FIG. 26A and FIG. 26B, an insulator 544 is preferably positioned between the insulator 580 and the oxide 530a, the oxide 530b, the conductor 542a, and the conductor 542b. In addition, as shown in FIG. 26A and FIG. 26B, the conductor 560 preferably includes a conductor 560a provided inside the insulator 550 and a conductor 560b embedded inside the conductor 560a. Moreover, as shown in FIG. 26A and FIG. 26B, an insulator 574 is preferably positioned over the insulator 580, the conductor 560, and the insulator 550.

Hereinafter, the oxide 530a, the oxide 530b, and the oxide 530c may be collectively referred to as an oxide 530.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 shown in FIG. 24, FIG. 25, FIG. 26A, and FIG. 26B is an example, and the structure is not limited thereto; an appropriate transistor can be used in accordance with a circuit configuration or a driving method.

Here, the conductor 560 functions as a gate electrode of the transistor 500, and the conductor 542a and the conductor 542b function as its source electrode and its drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a voltage applied to the conductor 503 independently of a voltage applied to the conductor 560. In particular, the threshold voltage of the transistor 500 can be higher than 0 V and the off-state current can be reduced by applying a negative voltage to the conductor 503. Thus, a drain current at the time when a voltage applied to the conductor 560 is 0 V can be lower in the case where a negative voltage is applied to the conductor 503 than in the case where a negative voltage is not applied to the conductor 503.

The conductor 503 is positioned to have a region overlapping with the oxide 530 and the conductor 560. Thus, when voltages are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (s-channel) structure.

The conductor 503 has a structure similar to that of the conductor 518; a conductor 503*a* is formed in contact with an inner wall of an opening in the insulator 514 and the insulator 516, and a conductor 503*b* is formed on the inner side. Note that although the transistor 500 having a structure in which the conductor 503*a* and the conductor 503*b* are stacked is shown, the present invention is not limited thereto. For example, the conductor 503 may be provided as a single layer or to have a stacked-layer structure of three or more layers.

Here, for the conductor 503*a*, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which the above oxygen is unlikely to pass). Note that in this specification and the like, a function of inhibiting diffusion of impurities or oxygen means a function of inhibiting diffusion of any one or all of the above impurities and oxygen.

For example, when the conductor 503*a* has a function of inhibiting diffusion of oxygen, a reduction in conductivity of the conductor 503*b* due to oxidation can be inhibited.

In addition, in the case where the conductor 503 also functions as a wiring, a conductive material with high conductivity that contains tungsten, copper, or aluminum as its main component is preferably used for the conductor 503*b*. In that case, the conductor 503*a* is not necessarily provided. Note that the conductor 503*b* is shown as a single layer but may have a stacked-layer structure, for example, a stack of the above conductive material and titanium or titanium nitride.

The insulator 520, the insulator 522, and the insulator 524 have a function of a second gate insulating film.

Here, for the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O + H$" occurs. Part of hydrogen generated at this time is bonded to oxygen to be $H_2O$, and removed from the oxide 530 or an insulator near the oxide 530 in some cases. Part of hydrogen is diffused into or gettered (also referred to as gettering) by the conductor 542 (the conductor 542*a* and the conductor 542*b*) in some cases.

For the microwave treatment, for example, an apparatus including a power supply that generates high-density plasma or an apparatus including a power supply that applies RF to the substrate side is suitably used. High-density oxygen radicals can be generated with the use of a gas containing oxygen and high-density plasma, for example. By applying RF to the substrate side, the oxygen radicals generated by high-density plasma can be introduced into the oxide 530 or the insulator near the oxide 530 efficiently. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under a reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O+O \rightarrow null$". Furthermore, hydrogen remaining in the oxide 530 reacts with oxygen supplied to the oxide 530, so that the hydrogen can be removed as $H_2O$ (dehydration). This can inhibit recombination of hydrogen remaining in the oxide 530 with oxygen vacancies and formation of $V_OH$.

When the insulator 524 includes an excess-oxygen region, it is preferable that the insulator 522 have a function of inhibiting diffusion of oxygen (e.g., oxygen atoms and oxygen molecules) (or that the insulator 522 be less likely to transmit the above oxygen).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

As the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. With miniaturization and high integration of transistors, a problem such as leakage current may arise because of a thinner gate insulating film. When a high-k material is used as the insulator functioning as the gate insulating film, a gate voltage at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high relative permittivity can be obtained.

Note that in the transistor 500 in FIG. 26A and FIG. 26B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used for the oxide 530 including the channel formation region. For example, for the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide which can be used for the oxide 530 is preferably a CAAC-OS (C-Axls Aligned Crystal Oxide Semiconductor) or a CAC-OS (Cloud-Aligned Composite Oxide Semiconductor). Furthermore, for the oxide 530, an In—Ga oxide or an In—Zn oxide may be used. The CAAC-OS and the CAC-OS are described later.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of the impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_OH$ in some cases. The $V_OH$ serves as a donor and an electron serving as a carrier is generated in some cases. In other cases, bonding of part of hydrogen to oxygen bonded to a metal atom generates electrons serving as carriers. Thus, a transistor using a metal oxide containing much hydrogen is likely to have normally-on characteristics. Moreover, hydrogen in a metal oxide is easily transferred by a stress such as heat or an electric field; thus, a large amount of hydrogen in a metal oxide might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) in order to obtain a metal oxide whose $V_OH$ is sufficiently reduced. When a metal oxide in which impurities such as $V_OH$ are sufficiently reduced is used for a channel formation region of a transistor, the transistor can have stable electrical characteristics.

A defect in which hydrogen has entered an oxygen vacancy can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which impurities such as hydrogen are sufficiently reduced is used for a channel formation region of a transistor, the transistor can have stable electrical characteristics.

When a metal oxide is used for the oxide 530, the carrier concentration of the metal oxide in the channel formation region is preferably lower than or equal to $1 \times 10^{18}$ cm$^{-3}$, further preferably lower than $1 \times 10^{17}$ cm$^3$, still further preferably lower than $1 \times 10^{16}$ cm$^{-3}$, still further preferably lower than $1 \times 10^{13}$ cm$^{-3}$, still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

Note that the layer is not limited to be formed between the conductor 542 and the oxide 530b. For example, the layer is formed between the conductor 542 and the oxide 530c in some cases. Alternatively, the layer is formed between the conductor 542 and the oxide 530b and between the conductor 542 and the oxide 530c in some cases.

Furthermore, the metal oxide functioning as the channel formation region in the oxide 530 has a band gap of more than or equal to 2 eV, preferably more than or equal to 2.5 eV. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxide layers that differ in the atomic ratio of metal atoms. Specifically, the atomic ratio of the element M to the constituent elements in the metal oxide used for the oxide 530a is preferably greater than the atomic ratio of the element M to the constituent elements in the metal oxide used for the oxide 530b. In addition, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

Specifically, for the oxide 530a, a metal oxide having In:Ga:Zn=1:3:4 [atomic ratio] or 1:1:0.5 [atomic ratio] is used. For the oxide 530b, a metal oxide having In:Ga:Zn=4:2:3 [atomic ratio] or 1:1:1 [atomic ratio] is used. For the oxide 530c, a metal oxide having In:Ga:Zn=1:3:4 [atomic ratio], Ga:Zn=2:1 [atomic ratio], or Ga:Zn=2:5 [atomic ratio] is used. Specific examples of the oxide 530c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio], and a stacked-layer structure of gallium oxide and In:Ga:Zn=4:2:3 [atomic ratio].

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

Note that semiconductor materials that can be used for the oxide 530 are not limited to the above metal oxides. A semiconductor material which has a band gap (a semiconductor material that is not a zero-gap semiconductor) can be used for the oxide 530. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 26, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as shown in FIG. 26A, a region 543a and a region 543b are sometimes formed as low-resistance regions at the interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as the first gate insulating film. The insulator 550 is preferably positioned in contact with the inner side (the top surface and the side surface) of the metal oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water and hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably has a function of inhibiting oxygen diffusion from the insulator 550 into the conductor 560. Providing the metal oxide that has a function of inhibiting diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. As the metal oxide, a material that can be used for the insulator 544 is used.

Note that the insulator 550 may have a stacked-layer structure like the second gate insulating film. With miniaturization and high integration of transistors, a problem such as leakage current may arise because of a thinner gate insulating film. When the insulator functioning as the gate insulating film has a stacked-layer structure of a high-k material and a thermally stable material, a gate voltage at the time when the transistor operates can be reduced while the physical thickness is maintained. Furthermore, the stacked-layer structure can be thermally stable and have a high relative permittivity.

Although the conductor 560 functioning as the first gate electrode has a two-layer structure in FIG. 26A and FIG. 26B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used for the oxide 530 can be used. In that case, when the conductor 560b is deposited by a sputtering method, the conductor 560a can have a reduced electrical resistance value to be a conductor. This can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus is preferably formed using a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided to have a region which is in contact with the oxide 530c, oxygen in the insulator 580 can be efficiently supplied to the oxide 530a and the oxide 530b through the oxide 530c. Note that the concentration of impurities such as water and hydrogen in the insulator 580 is preferably lowered.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water and hydrogen in the insulator 581 is preferably lowered.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that are described later.

An insulator 582 is provided over the insulator 581. A substance having a barrier property against oxygen or hydrogen is preferably used as the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits passage of both oxygen and impurities such as hydrogen and moisture which are factors of a change in electrical characteristics of the transistor. Thus, aluminum oxide can prevent entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. Furthermore, when a material with a comparatively low dielectric constant is used for these insulators, parasitic capacitance generated between wirings can be reduced. A silicon oxide film, a silicon oxynitride film, or the like can be used as the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 390. The conductor 546 and the conductor 548 can be provided using a material similar to that for the conductor 328 or the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as part of the manufacturing steps of the transistor 500. The insulator having a high barrier property against hydrogen or water is formed using a material similar to that for the insulator 522, for example.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 24, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Figure 27A:
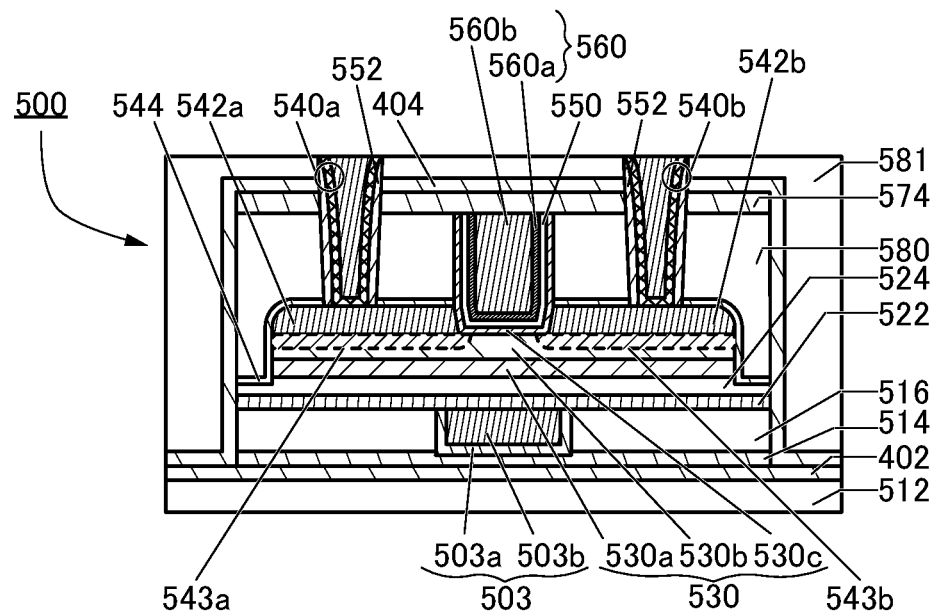
FIG. 27A and FIG. 27B are diagrams illustrating a structure example of a transistor.
Figure 27B:
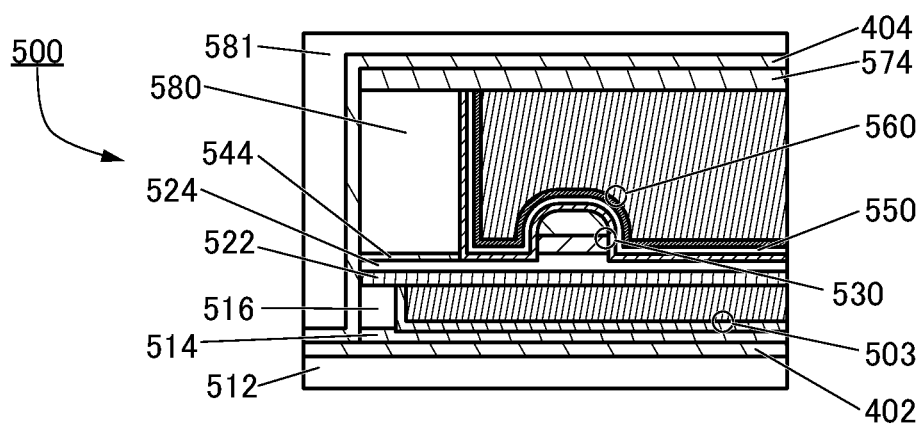

FIG. 27A and FIG. 27B are modified examples of the transistor 500 shown in FIG. 26A and FIG. 26B. FIG. 26A is a cross-sectional view of the transistor 500 in the channel length direction and FIG. 26B is a cross-sectional view of the transistor 500 in the channel width direction. Note that the structure shown in FIG. 27A and FIG. 27B can also be employed for other transistors, such as the transistor 390, included in the semiconductor device of one embodiment of the present invention.

FIG. 27A is a cross-sectional view of the transistor 500 in the channel length direction, and FIG. 27B is a cross-sectional view of the transistor 500 in the channel width direction. The transistor 500 shown in FIG. 27A and FIG. 27B includes the insulator 402 and the insulator 404, which is different from the transistor 500 shown in FIG. 26A and FIG. 26B. In addition, insulators 552 are provided in contact with the side surface of the conductor 540*a* and the side surface of the conductor 540*b*, which are also different from the transistor 500 shown in FIG. 26A and FIG. 26B. Furthermore, the insulator 520 is not included, which is different from the transistor 500 shown in FIG. 26A and FIG. 26B.

In the transistor 500 shown in FIG. 27A and FIG. 27B, the insulator 402 is provided over the insulator 512. The insulator 404 is provided over the insulator 574 and the insulator 402.

In the transistor 500 shown in FIG. 27A and FIG. 27B, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 524, the side surface of the insulator 522, the side surface of the insulator 516, the side surface of the insulator 514, and the top surface of the insulator 402. Thus, the oxide 530 and the like are isolated from the outside by the insulator 404 and the insulator 402.

The insulator 402 and the insulator 404 preferably have high capability of inhibiting diffusion of hydrogen (e.g., at least one of a hydrogen atom, a hydrogen molecule, and the like) or a water molecule. For example, for the insulator 402 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540*a* and the conductor 540*b*. Furthermore, oxygen contained in the insulator 580 can be inhibited from being absorbed by the conductor 540*a* and the conductor 540*b*. As described above, the reliability of the semiconductor device of one embodiment of the present invention can be increased.

Figure 28:
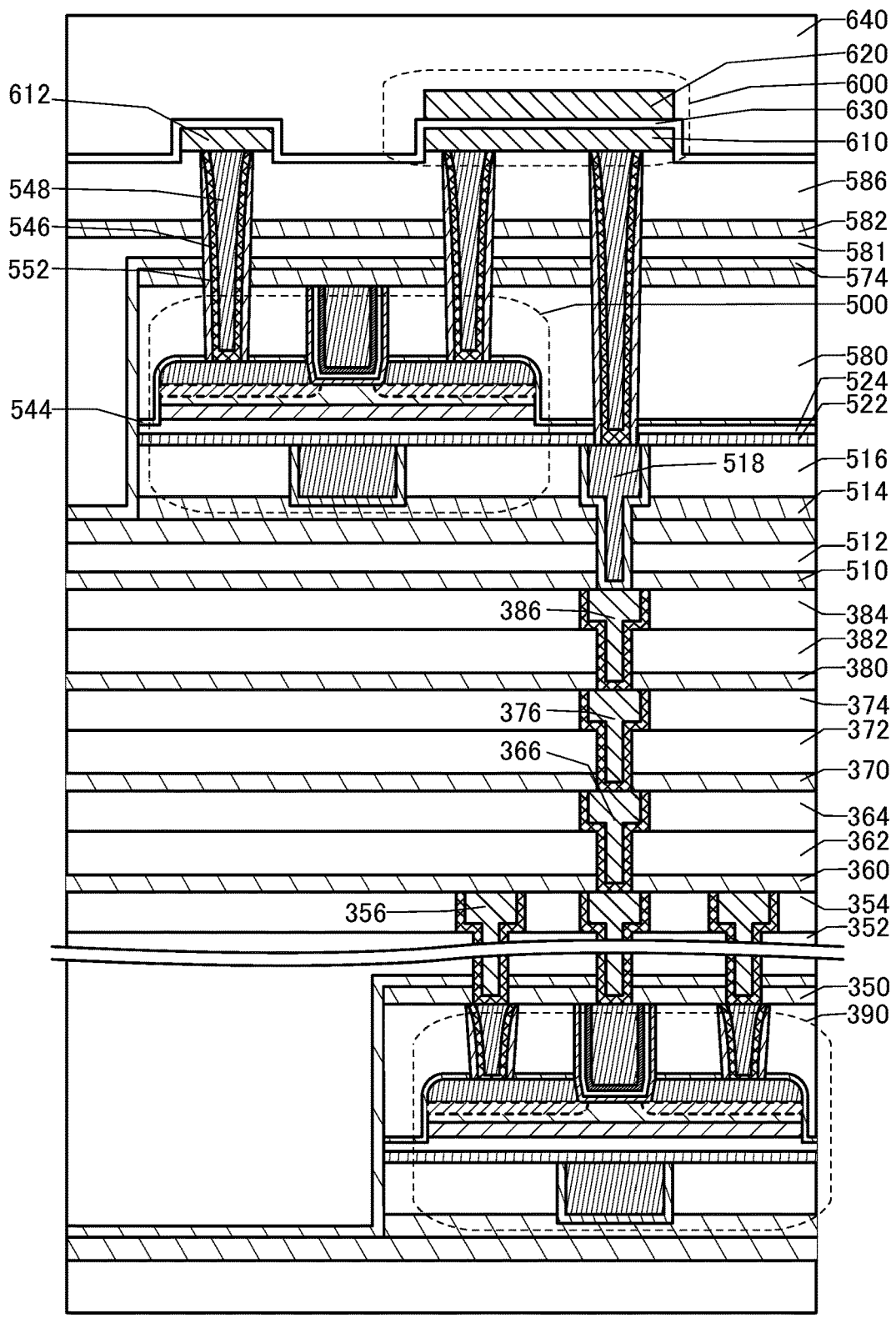
FIG. 28 is a diagram illustrating a structure example of a semiconductor device.

FIG. 28 is a cross-sectional view showing a structure example of a semiconductor device in the case where the transistor 500 and the transistor 390 have the structure shown in FIG. 27A and FIG. 27B. The insulator 552 is provided on the side surface of the conductor 546.

Figure 29A:
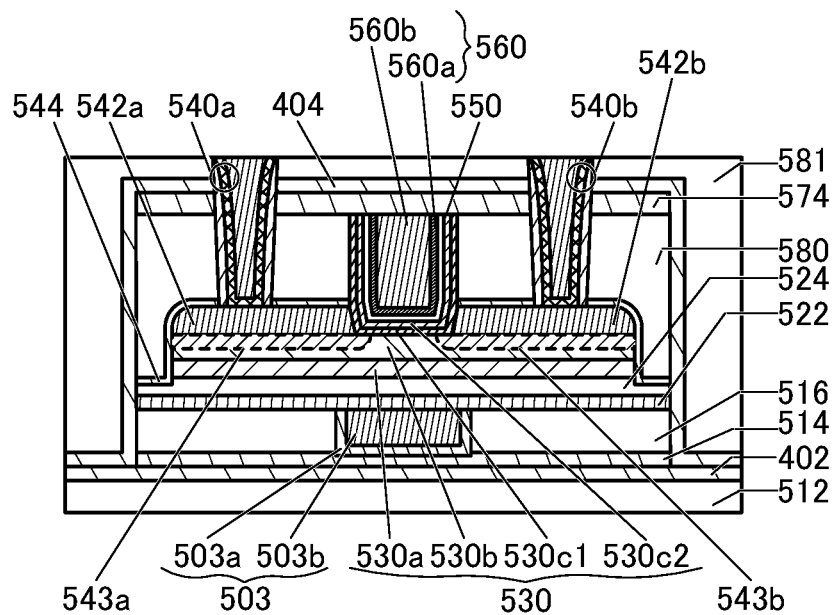
FIG. 29A and FIG. 29B are diagrams illustrating a structure example of a transistor.
Figure 29B:
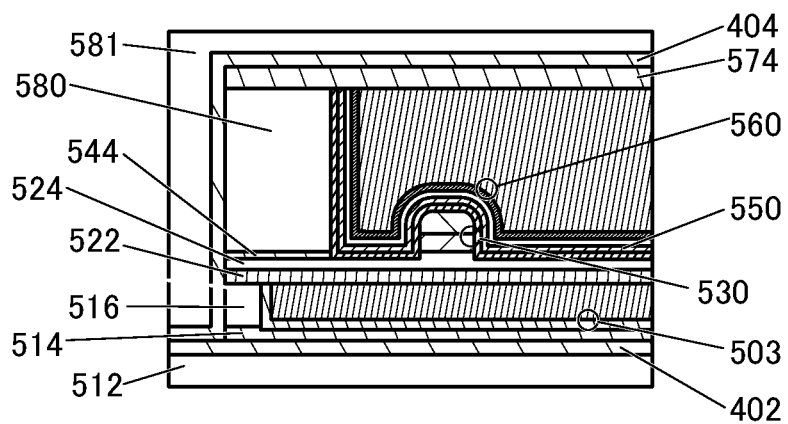

FIG. 29A and FIG. 29B are modified examples of the transistor shown in FIG. 27A and FIG. 27B. FIG. 29A is a cross-sectional view of the transistor in the channel length direction and FIG. 29B is a cross-sectional view of the transistor in the channel width direction. The transistor shown in FIG. 29A and FIG. 29B is different from the transistor shown in FIG. 27A and FIG. 27B in that the oxide 530*c* has a two-layer structure of an oxide 530*c*1 and an oxide 530*c*2.

The oxide 530*c*1 is in contact with the top surface of the insulator 524, the side surface of the oxide 530*a*, the top surface and the side surface of the oxide 530*b*, the side surfaces of the conductor 542*a* and the conductor 542*b*, the side surface of the insulator 544, and the side surface of the insulator 580. The oxide 530*c*2 is in contact with the insulator 550.

An In—Zn oxide can be used for the oxide 530*c*1, for example. For the oxide 530*c*2, it is possible to use a material similar to a material used for the oxide 530*c* when the oxide 530*c* has a single-layer structure. For the oxide 530*c*2, a metal oxide with n:Ga:Zn=1:3:4 [atomic ratio], Ga:Zn=2:1 [atomic ratio], or Ga:Zn=2:5 [atomic ratio] can be used, for example.

When the oxide 530*c* has a two-layer structure of the oxide 530*c*1 and the oxide 530*c*2, the on-state current of the transistor can be increased as compared with the case where the oxide 530*c* has a single-layer structure. Thus, a transistor can be a power MOS transistor, for example. Note that the oxide 530*c* included in the transistor shown in FIG. 26A and FIG. 26B can also have a two-layer structure of the oxide 530*c*1 and the oxide 530*c*2.

The transistor shown in FIG. 29A and FIG. 29B can be used as the transistor 390, for example. As described above, the transistor 390 can be used as the OS transistor shown in FIG. 25 in the above embodiment. When the transistor has a function of an output transistor, the on-state current of the OS transistor can be increased, which can increase the accuracy of the output voltage from the semiconductor device of one embodiment of the present invention. Note that the structure shown in FIG. 29A and FIG. 29B can also be employed for transistors other than the transistor 390, such as the transistor 500, included in the semiconductor device of one embodiment of the present invention.

Figure 30:
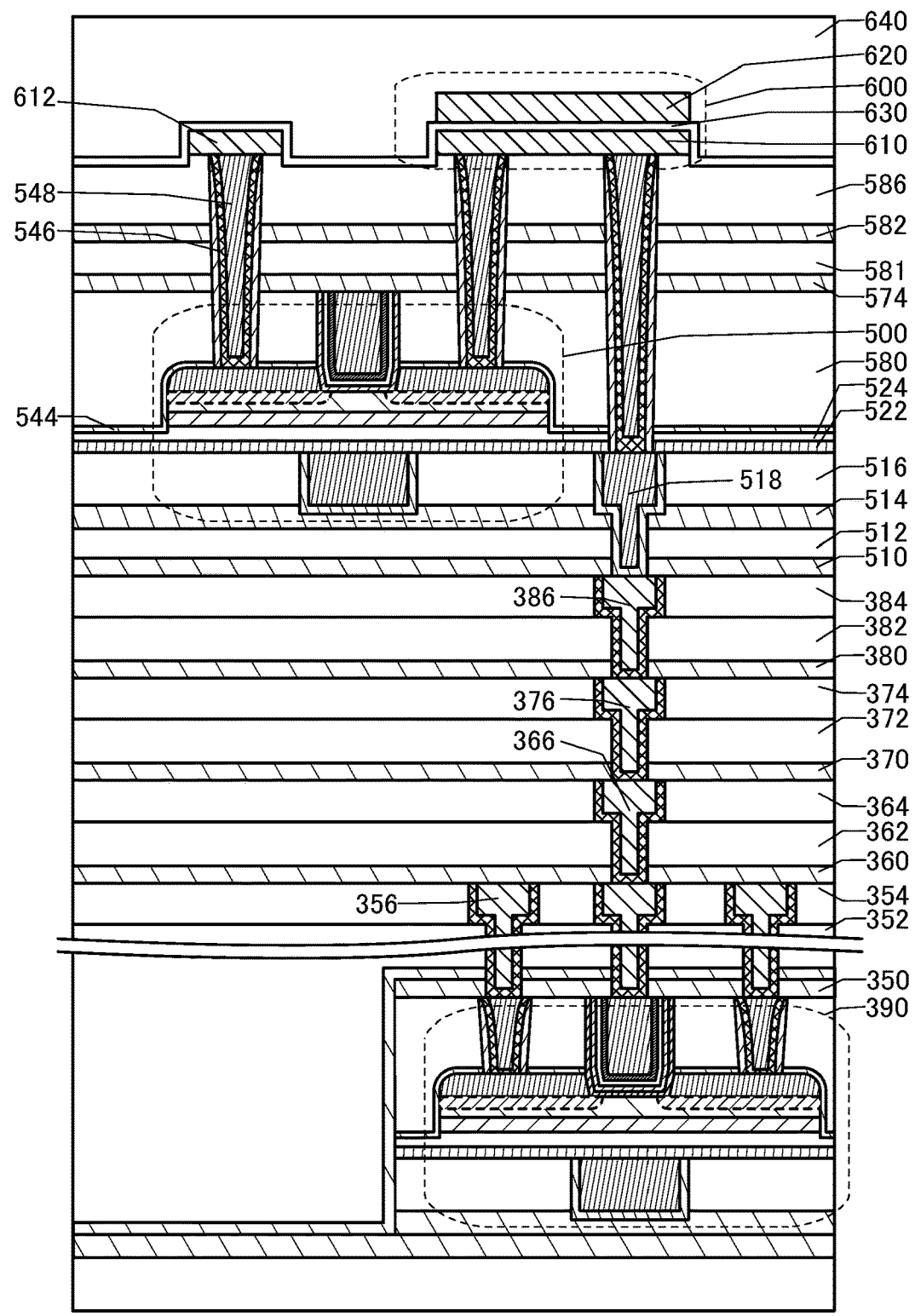
FIG. 30 is a diagram illustrating a structure example of a semiconductor device.

FIG. 30 is a cross-sectional view of a structure example of the semiconductor device in the case where the transistor 500 has the structure shown in FIG. 26A and FIG. 26B and the transistor 390 has the structure shown in FIG. 29A and FIG. 29B. Note that as in FIG. 28, the insulator 552 is provided on the side surface of the conductor 546. As shown in FIG. 30, in the semiconductor device of one embodiment of the present invention, the transistor 390 and the transistor 500 can have different structures while both the transistor 390 and the transistor 500 can be OS transistors.

This embodiment can be implemented in appropriate combination with the structures described in the other embodiments and the like.

REFERENCE NUMERALS

C1: capacitor, C2: capacitor, M1: transistor, M2: transistor, M3: transistor, R1: resistor, R2: resistor, R3: resistor, RS1: resistor, RS2: resistor, SW1: switch, SW3: switch, 10: circuit, 10A: circuit, 20: circuit, 21: circuit, 21A: circuit, 22: circuit, 22A: circuit, 30: circuit, 31: circuit, 31*a*: circuit, 31A: circuit, 31*b*: circuit, 31*c*: circuit, 32: circuit, 32*a*: switch, 32A: circuit, 32*b*: switch, 33: switch, 40: secondary battery module, 40A: secondary battery module, 41: secondary battery, 42: sensor, 43: resistor, 50*a*: comparison circuit, 50*b*: memory, 51: comparison circuit, 51*a*: comparison circuit, 51*b*: memory, 52*a*: comparison circuit, 52*b*: memory, 53*a*: comparison circuit, 53*b*: memory, 60*a*: comparison circuit, 60*b*: memory, 61: comparison circuit, 61a: comparison circuit, 61b: memory, 62a: comparison circuit, 62b: memory, 63a: comparison circuit, 63b: memory, 71: wiring, 72: wiring, 73: wiring, 74: wiring, 75: wiring, 76: wiring, 77: wiring, 78: wiring, 211a: positive electrode, 211b: negative electrode, 212a: lead, 212b: lead, 214: separator, 215a: bonding portion, 215b: bonding portion, 217: fixing member, 250: secondary battery, 251: exterior body, 262: seal portion, 263: seal portion, 300: secondary battery, 301: positive electrode can, 302: negative electrode can, 303: gasket, 304: positive electrode, 305: positive electrode current collector, 306: positive electrode active material layer, 307: negative electrode, 308: negative electrode current collector, 309: negative electrode active material layer, 310: separator, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 390: transistor, 402: insulator, 404: insulator, 500: transistor, 503: conductor, 503a: conductor, 503b: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 530c1: oxide, 530c2: oxide, 540a: conductor, 540b: conductor, 542: conductor, 542a: conductor, 542b: conductor, 543a: region, 543b: region, 544: insulator, 546: conductor, 548: conductor, 550: insulator, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 700: secondary battery, 701: positive electrode current collector, 702: positive electrode active material layer, 703: positive electrode, 704: negative electrode current collector, 705: negative electrode active material layer, 706: negative electrode, 707: separator, 708: electrolyte solution, 709: exterior body, 710: positive electrode lead electrode, 711: negative electrode lead electrode, 800: secondary battery, 801: positive electrode cap, 802: battery can, 803: positive electrode terminal, 804: positive electrode, 805: separator, 806: negative electrode, 807: negative electrode terminal, 808: insulating plate, 809: insulating plate, 811: PTC element, 812: safety valve mechanism, 813: conductive plate, 814: conductive plate, 815: module, 816: conducting wiring, 817: temperature control device, 900: circuit board, 910: label, 911: terminal, 912: circuit, 913: secondary battery, 914: antenna, 915: antenna, 916: layer, 917: layer, 918: antenna, 920: display device, 921: sensor, 922: terminal, 930: housing, 930a: housing, 930b: housing, 931: negative electrode, 932: positive electrode, 933: separator, 950: wound body, 951: terminal, 952: terminal, 980: secondary battery, 981: film, 982: film, 993: wound body, 994: negative electrode, 995: positive electrode, 996: separator, 997: lead electrode, 998: lead electrode, 7100: portable display device, 7101: housing, 7102: display portion, 7103: operation button, 7104: secondary battery, 7200: portable information terminal, 7201: housing, 7202: display portion, 7203: band, 7204: buckle, 7205: operation button, 7206: input/output terminal, 7207: icon, 7300: display device, 7304: display portion, 7400: mobile phone, 7401: housing, 7402: display portion, 7403: operation button, 7404: external connection port, 7405: speaker, 7406: microphone, 7407: secondary battery, 7500: electronic cigarette, 7501: atomizer, 7502: cartridge, 7504: secondary battery, 8000: display device, 8001: housing, 8002: display portion, 8003: speaker portion, 8004: secondary battery, 8021: charging device, 8022: cable, 8024: secondary battery, 8100: lighting device, 8101: housing, 8102: light source, 8103: secondary battery, 8200: indoor unit, 8201: housing, 8202: air outlet, 8203: secondary battery, 8204: outdoor unit, 8300: electric refrigerator-freezer, 8301: housing, 8302: refrigerator door, 8303: freezer door, 8304: secondary battery, 8400: automobile, 8401: headlight, 8406: electric motor, 8500: automobile, 8600: motor scooter, 8601: side mirror, 8602: secondary battery, 8603: direction indicator, 8604: under-seat storage, 9600: tablet terminal, 9625: switch, 9627: switch, 9628: operation switch, 9630: housing, 9630a: housing, 9630b: housing, 9631: display portion, 9631a: display portion, 9631b: display portion, 9633: solar cell, 9634: charge and discharge control circuit, 9635: power storage unit, 9636: DCDC converter, 9637: converter, 9640: movable portion.

The invention claimed is:

1. A semiconductor device comprising:
a secondary battery module; and
a first circuit,
wherein the secondary battery module comprises a secondary battery and a sensor,
wherein the first circuit comprises a variable resistor,
wherein the sensor is configured to measure a temperature of the secondary battery,
wherein the first circuit is configured to judge a charge voltage of the secondary battery and to output a first result,
wherein the first circuit is configured to judge the temperature of the secondary battery measured by the sensor and to output a second result,
wherein the first circuit is configured to determine a magnitude of the variable resistor on the basis of the first result and the second result,
wherein the first circuit is configured to discharge the charge voltage through the variable resistor and to stop discharging when the charge voltage reaches a specified voltage,
wherein a temperature range for the temperature of the secondary battery comprises a first temperature range and a second temperature range higher than the first temperature range,
wherein the first circuit is configured to control an amount of discharge from the secondary battery in the second temperature range,
wherein the amount of discharge from the secondary battery in the second temperature range is larger than an amount of discharge from the secondary battery in the first temperature range,
wherein the first circuit comprises a first memory and a second memory,
wherein the first memory is configured to retain a judgment condition of the temperature of the secondary battery, and
wherein the second memory is configured to retain a judgment condition of the charge voltage of the secondary battery.

2. The semiconductor device according to claim 1,
wherein the first memory and the second memory each comprise a transistor and a capacitor, and
wherein the transistor comprises a metal oxide in a semiconductor layer.

3. A semiconductor device comprising:
a secondary battery module; and
a first circuit,
wherein the secondary battery module comprises a secondary battery and a sensor,
wherein the sensor is configured to measure a temperature of the secondary battery,
wherein the first circuit comprises a second circuit and a third circuit,
wherein the second circuit comprises a lookup table, a first comparison circuit, and a second comparison circuit,
wherein the third circuit comprises a discharge control circuit and a variable resistor,
wherein the lookup table comprises a first classification condition for classifying a charge voltage of the secondary battery into a voltage range and a second classification condition for classifying the temperature of the secondary battery into a temperature range,
wherein the first comparison circuit is configured to classify the charge voltage of the secondary battery in accordance with the first classification condition and to output a first result,
wherein the second comparison circuit is configured to classify the temperature of the secondary battery in accordance with the second classification condition and to output a second result,
wherein the discharge control circuit is configured to judge necessity of discharge from the secondary battery on the basis of the first result and the second result and to determine a magnitude of the variable resistor, and
wherein the discharge control circuit is configured to discharge the charge voltage through the variable resistor and to stop discharging when the charge voltage reaches a specified voltage.

4. The semiconductor device according to claim 3,
wherein the temperature range is outside an allowable temperature range in charging the secondary battery.

5. The semiconductor device according to claim 3,
wherein the temperature range comprises a first temperature range and a second temperature range higher than the first temperature range,
wherein the first circuit is configured to control an amount of discharge from the secondary battery in the second temperature range, and
wherein the amount of discharge from the secondary battery in the second temperature range is larger than an amount of discharge from the secondary battery in the first temperature range.

6. The semiconductor device according to claim 5,
wherein the first circuit comprises a first memory and a second memory,
wherein the first memory is configured to retain a judgment condition of the temperature of the secondary battery, and
wherein the second memory is configured to retain a judgment condition of the charge voltage of the secondary battery.

7. The semiconductor device according to claim 6,
wherein the first memory and the second memory each comprise a transistor and a capacitor, and
wherein the transistor comprises a metal oxide in a semiconductor layer.

* * * * *